(12) United States Patent
Yamazaki et al.

(10) Patent No.: US 7,135,389 B2
(45) Date of Patent: Nov. 14, 2006

(54) IRRADIATION METHOD OF LASER BEAM

(75) Inventors: Shunpei Yamazaki, Tokyo (JP); Chiho Kokubo, Tochigi (JP); Aiko Shiga, Kanagawa (JP); Koichiro Tanaka, Kanagawa (JP); Hidekazu Miyairi, Kanagawa (JP); Koji Dairiki, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/318,290

(22) Filed: Dec. 13, 2002

(65) Prior Publication Data

US 2003/0211714 A1    Nov. 13, 2003

(30) Foreign Application Priority Data

Dec. 20, 2001  (JP)  ............................. 2001-388325
Dec. 21, 2001  (JP)  ............................. 2001-389620

(51) Int. Cl.
*H01L 21/36*   (2006.01)
*H01L 21/84*   (2006.01)
*H01L 21/20*   (2006.01)

(52) U.S. Cl. ...................... 438/487; 438/166; 438/150; 257/E21.101; 257/E21.134

(58) Field of Classification Search ................ 438/487, 438/166, 795, 149, 151, 486, 162, 479, 152, 438/798, 694, 154, 158, 150; 257/E21.101, 257/E21.134
See application file for complete search history.

(56) References Cited

U.S. PATENT DOCUMENTS

| | | | |
|---|---|---|---|
| 4,330,363 A | | 5/1982 | Biegesen et al. |
| 4,388,145 A | * | 6/1983 | Hawkins et al. ............... 117/58 |
| 4,658,135 A | * | 4/1987 | Allman et al. ............... 250/283 |
| 4,780,590 A | * | 10/1988 | Griner et al. .......... 219/121.65 |
| 5,225,886 A | * | 7/1993 | Koizumi et al. ......... 356/237.4 |
| 5,304,357 A | * | 4/1994 | Sato et al. ................. 118/50.1 |
| 5,632,915 A | * | 5/1997 | Schnetzer et al. ..... 219/121.82 |
| 5,643,826 A | | 7/1997 | Ohtani et al. |

(Continued)

FOREIGN PATENT DOCUMENTS

EP           88004 A2 *    9/1983

(Continued)

OTHER PUBLICATIONS

Akito Hara et al., "High Performance Poly-Si TFTs on a Glass by a Stable Scanning CW Laser Lateral Crystallization" 2001 IEDM 01, pp. 747-750.

(Continued)

*Primary Examiner*—B. William Baumeister
*Assistant Examiner*—Igwe U. Anya
(74) *Attorney, Agent, or Firm*—Nixon Peabody LLP; Jeffrey L. Costellia

(57) ABSTRACT

A laser irradiation method using a laser crystallization method which can heighten an efficiency of substrate processing as compared to a conventional one and also heighten mobility of a semiconductor film is provided. It is an irradiation method of a laser beam in which, pattern information of a sub-island formed on a substrate is stored, and a beam spot of a laser beam is condensed so as to become linear, and by use of the stored pattern information, a scanning path of the beam spot is determined so as to include the sub-island, and by moving the beam spot along the scanning path, the laser beam is irradiated to the sub-island, characterized in that on the occasion of scanning the beam spot, when the beam spot has reached to the sub-island, the beam spot and the sub-island are contacted at a plurality of points.

32 Claims, 46 Drawing Sheets

U.S. PATENT DOCUMENTS

| | | | |
|---|---|---|---|
| 5,708,252 A * | 1/1998 | Shinohara et al. | 219/121.73 |
| 5,824,574 A * | 10/1998 | Yamazaki et al. | 438/150 |
| 6,365,933 B1 | 4/2002 | Yamazaki et al. | |
| 6,449,123 B1 * | 9/2002 | Tsujimoto et al. | 360/126 |
| 6,469,729 B1 * | 10/2002 | Ryan | 347/248 |
| 6,563,077 B1 * | 5/2003 | Im | 219/121.65 |
| 6,657,154 B1 * | 12/2003 | Tanabe et al. | 219/121.6 |
| 6,677,222 B1 * | 1/2004 | Mishima et al. | 438/488 |
| 6,700,096 B1 | 3/2004 | Yamazaki et al. | |
| 6,861,614 B1 * | 3/2005 | Tanabe et al. | 219/121.66 |
| 2001/0038127 A1 * | 11/2001 | Yamazaki et al. | 257/359 |
| 2002/0058399 A1 * | 5/2002 | Sato et al. | 438/486 |
| 2003/0148565 A1 * | 8/2003 | Yamanaka | 438/200 |
| 2003/0148594 A1 | 8/2003 | Yamazaki et al. | |
| 2003/0153182 A1 | 8/2003 | Yamazaki et al. | |
| 2003/0153999 A1 | 8/2003 | Miyanaga et al. | |
| 2003/0171837 A1 | 9/2003 | Yamazaki et al. | |
| 2003/0215973 A1 | 11/2003 | Yamazaki et al. | |
| 2003/0228723 A1 * | 12/2003 | Yamazaki et al. | 438/164 |
| 2003/0234395 A1 | 12/2003 | Kokubo et al. | |
| 2003/0235971 A1 | 12/2003 | Yamazaki et al. | |
| 2004/0132266 A1 | 7/2004 | Yamazaki et al. | |

FOREIGN PATENT DOCUMENTS

| | | | |
|---|---|---|---|
| JP | 60161396 A * | 8/1985 | |
| JP | 07-130652 | 5/1995 | |
| JP | 08-078329 | 3/1996 | |
| JP | 09-270393 | 10/1997 | |
| JP | 10-135468 | 5/1998 | |
| JP | 10-135469 | 5/1998 | |
| JP | 11-354463 | 12/1999 | |

OTHER PUBLICATIONS

U.S. Appl. No. 10/289,219, filed Nov. 7, 2002, ("Laser Apparatus, Laser Irradiation Method, Manufacturing Method for Semiconductor Device, Semiconductor Device, Production System for Semiconductor Device Using the Laser Apparatus and Electronic Equipment") (740756-2547) (Full Translation).

U.S. Appl. No. 10/279,960, filed Oct. 25, 2002 ("Laser Apparatus, Laser Irradiation Method, Manufacturing Method for Semiconductor Device, Semiconductor Device, Production System for Semiconductor Device Using the Laser Apparatus and Electronic Equipment") (Specification, Claims and Drawings).

U.S. Appl. No. 10/289,219, filed Nov. 7, 2002, ("Laser Apparatus, Laser Irradiation Method, Manufacturing Method for Semiconductor Device, Semiconductor Device, Production System for Semiconductor Device Using the Laser Apparatus and Electronic Equipment") (English Translation Not Available).

U.S. Appl. No. 10/300,927, filed Nov. 21, 2002 ("A Semiconductor Fabricating Apparatus") (Specification, Claims and Drawings).

U.S. Appl. No. 10/305,367, filed Nov. 27, 2002 ("Laser Irradiation Apparatus") (Specification, Claims and Drawings).

U.S. Appl. No. 10/321,841, filed Dec. 19, 2002 ("Semiconductor Device and Method of Manufacturing the Same") (Specification, Claims and Drawings).

* cited by examiner

FIG. 6A
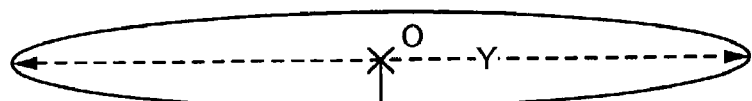
FIG. 6B
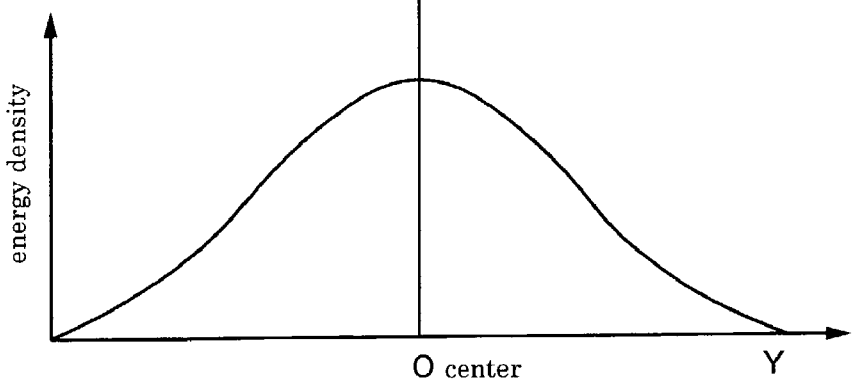
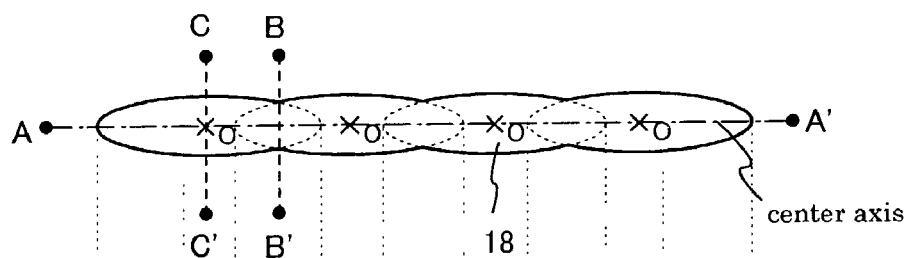
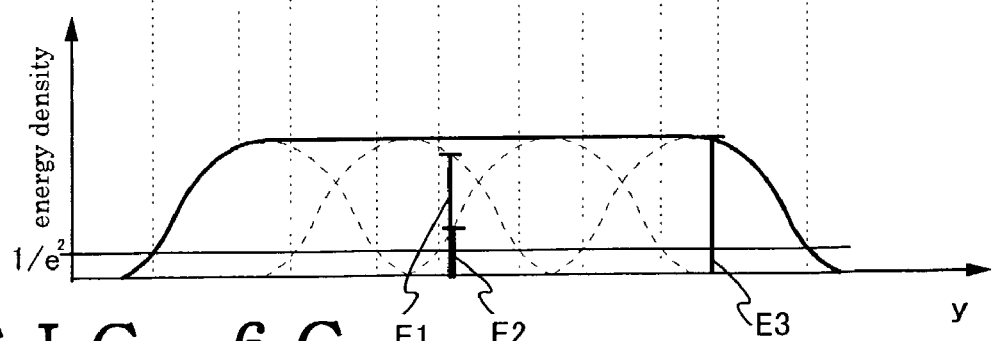
FIG. 6C

PRIOR ART

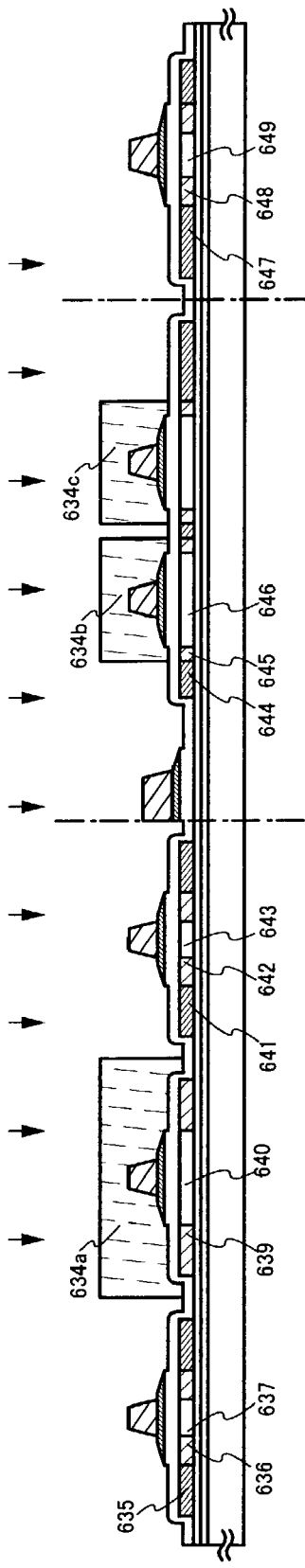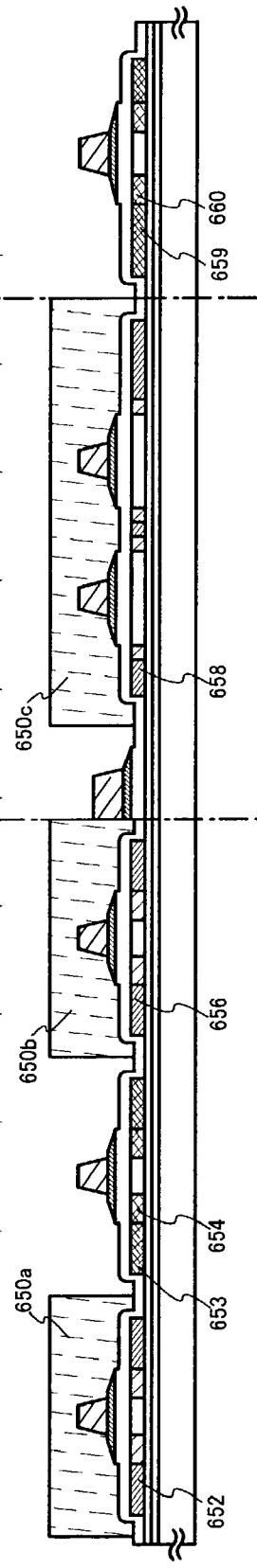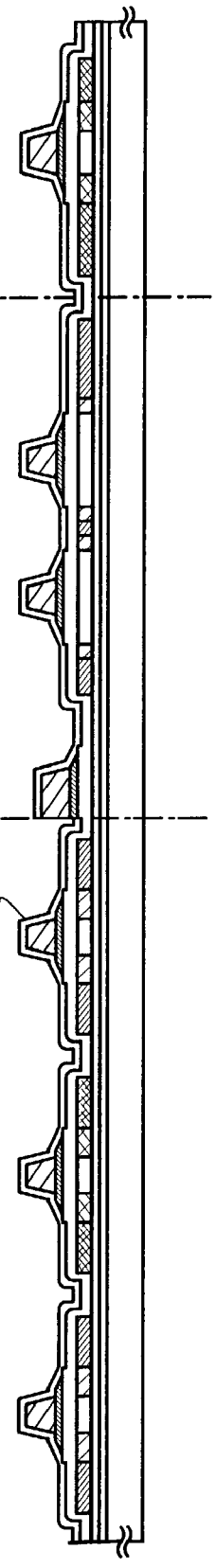

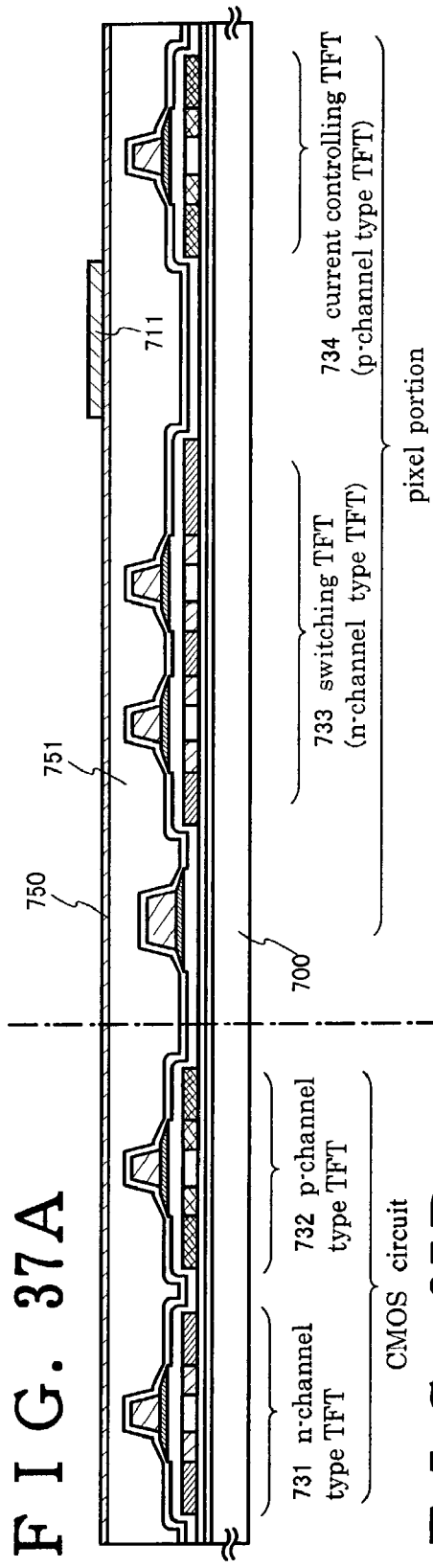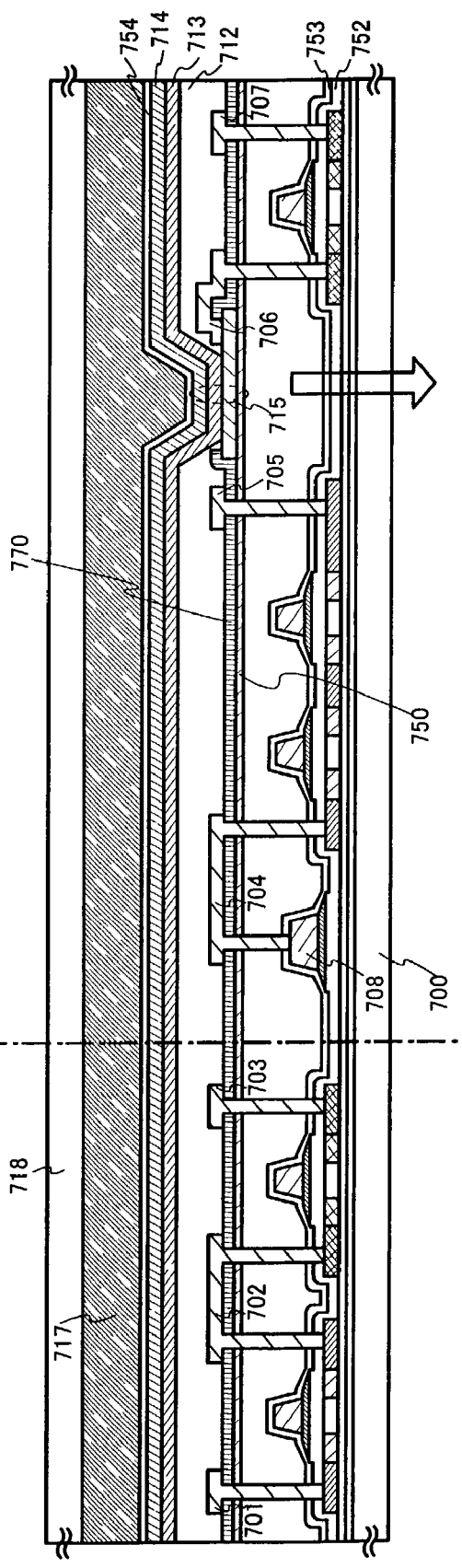
FIG. 37A
FIG. 37B

IRRADIATION METHOD OF LASER BEAM

BACKGROUND OF THE INVENTION

1. Field of the Invention

The present invention relates to a laser irradiation method for crystallizing a semiconductor film using a laser light or for performing activation after ion implantation.

2. Description of the Related Art

In recent years, a technique of forming a TFT on a substrate has greatly progressed, and its application and development for active matrix semiconductor display devices have been advanced. In particular, since a TFT using a polycrystalline semiconductor film has higher field-effect mobility (also referred to as mobility) than a TFT using a conventional amorphous semiconductor film, it enables high-speed operation. Although the pixel is conventionally controlled by a driving circuit provided outside the substrate, it is therefore possible to control the pixel by the driving circuit formed on the same substrate where the pixel is formed.

Incidentally, as for the substrate used in the semiconductor device, a glass substrate is regarded as promising in comparison with a single crystal silicon substrate in terms of the cost. A glass substrate is inferior in heat resistance and is easily subjected to thermal deformation. Therefore, in the case where a polysilicon TFT is formed on the glass substrate, in order to avoid thermal deformation of the glass substrate, the use of laser annealing for crystallization of the semiconductor film is extremely effective.

Characteristics of laser annealing are as follows: it can greatly reduce a processing time in comparison with an annealing method using radiation heating or conductive heating; and it hardly causes thermal damage to the substrate by selectively and locally heating a semiconductor or the semiconductor film, for example.

Note that the laser annealing method here indicates a technique of re-crystallizing the damaged layer formed on the semiconductor substrate or the semiconductor film, and a technique of crystallizing the semiconductor film formed on the substrate. Also, the laser annealing method here includes a technique applied to leveling or surface reforming of the semiconductor substrate or the semiconductor film. A laser oscillation apparatus applied thereto is a gas laser oscillation apparatus represented by an excimer laser or a solid laser oscillation apparatus represented by a YAG laser. It is known that the apparatus performs crystallization by heating a surface layer of the semiconductor by irradiation of the laser light in an extremely short period of time of about several tens of nanoseconds to several tens of microseconds.

Lasers are roughly divided into two types: pulse oscillation and continuous oscillation, according to an oscillation method. In the pulse oscillation laser, an output energy is relatively high, so that mass productivity can be increased by setting the size of a beam spot to several cm$^2$ or more. In particular, when the shape of the beam spot is processed using an optical system and made to be a linear shape of 10 cm or more in length, it is possible to efficiently perform irradiation of the laser light to the substrate and further enhance the mass productivity. Thus, for crystallization of the semiconductor film, the use of a pulse oscillation laser is becoming mainstream.

However, in recent years, in crystallization of the semiconductor film, it is found that grain size of the crystal formed in the semiconductor film is larger in the case where the continuous wave laser is used than the case where the pulse oscillation laser is used. When the crystal grain size in the semiconductor film becomes large, the mobility of the TFT formed using the semiconductor film becomes high. For this reason, a continuous wave laser has been attracting attention recently.

However, since the maximum output energy of the continuous wave laser is generally small in comparison with that of the pulse oscillation laser, the size of the beam spot is as small as about 10$^{-3}$ mm$^2$. Accordingly, in order to perform processing on one large substrate, it is necessary to move a beam irradiation position on the substrate upward and downward, and right and left, and the processing time per substrate is prolonged. As a result, the efficiency of substrate processing is poor and there is an important problem of how to improve the processing speed of the substrate.

Note that beam spot length adjustment technologies using a slit have conventionally been used (refer to, for example, Patent Document 1 and Patent Document 2 below).

Further, technologies using a laser light of continuous oscillation for crystallization after forming the semiconductor film into an island shape have conventionally been used (refer to, for example Non-Patent Document 1 below).

(Patent Document 1)
JP 11-354463 A (page 3, FIG. 3)

(Patent Document 2)
JP 09-270393 A (pages 3 to 4, FIG. 2)

(Non-Patent Document 1)
Akito Hara, Yasuyoshi Mishima, Tatsuya Kakehi, Fumiyo Takeuchi, Michiko Takei, Kenichi Yoshino, Katsuyuki Suga, Mitsuru Chida, and Nobuo Sasaki, Fujitsu Laboratories Ltd., "High Performance Poly-Si TFTs on a Glass by a Stable Scanning CW Laser Lateral Crystallization", IEDM2001.

SUMMARY OF THE INVENTION

The present invention has been made in view of the above problem, and an object of the present invention is therefore to provide a laser irradiation method using a laser crystallization method that can raise the substrate processing efficiency and mobility of a semiconductor film from those of prior art.

In this invention, on the basis of data (pattern information) of shapes of masks of semiconductor films, a portion which becomes an island shaped semiconductor film (island) is grasped. Then, the island shaped semiconductor film (sub-island) including a single or plural of the island(s) is formed by patterning. Then, crystallinity of the sub-island is heightened by irradiating a laser beam, and thereafter, the island is formed by patterning the sub-island.

Further, in the invention, a scanning path of the laser beam on a substrate is determined so that the laser beam is irradiated at least to the sub-island from the pattern information of the sub-island. That is, the laser beam is not irradiated to entirety of the substrate but the laser beam is scanned so that at least a necessary and indispensable portion can be crystallized at the very least. By the above-described structure, it is possible to omit time for irradiating the laser beam to a portion other than the sub-island, and thereby, it is possible to shorten time necessary for the laser beam irradiation, and further, it is possible to improve processing speed for the substrate. Also, by irradiating the laser beam to an unnecessary portion, it is possible to prevent damages from being applied to the substrate.

In addition, in the invention, it may be fine to form a marker in advance on the substrate etc. by the laser beam etc. and it may be fine to form the sub-island and the marker from the same semiconductor film. By forming the sub-island and the marker at the same time, it is possible to reduce one from the number of mask for the marker, and further, it is possible to form the marker at a more precise position than in forming by the laser beam, and it is possible to improve accuracy of alignment. Then, in the invention, on the basis of the marker as a reference, a position for scanning the laser beam is determined based upon the pattern information of the sub-island.

Also, in the invention, a scanning direction of the laser beam is intentionally determined so that the laser beam is being scanned and when a beam spot has reached to the sub-island, the beam spot and the sub-island are contacted at a plurality of points. To be more precise, in case that the sub-island has a polygon in viewing from a point on the substrate, the laser beam is scanned so that a plurality of angles that the sub-island has and the beam spot are contacted at the same time or with time difference.

In addition, also in case that a part or a whole of the sub-island is drawing a curb in viewing from a point on the substrate, it may be fine to determine the scanning direction so that the beam spot and the sub-island are contacted at a plurality of contact points. When irradiation of the laser beam is initiated from one contact point, a crystal having an orientation of (100) surface is initiated to grow from the vicinity including the contact point preferentially. Then, the laser beam is scanned, and when the irradiation of the laser beam to the sub-island is finished, it is possible to heighten an orientation rate of the (100) surface of the entire sub-island.

Then, since a crystal grows from respective plural points along the scanning path of the laser beam, upon viewing the entire sub-island, the closer to an extension of the scanning path of the laser beam coming from the respective plural points, the higher the orientation rate of the (100) surface becomes, and further, the larger a crystal grain becomes. Then, by patterning the sub-island, a portion where crystallinity on the extension of the scanning path from the respective plural points is excellent is arranged to be used as the island. That is, in the above-described patterning, it is desirable to remove a portion where the crystallinity on the extension of the scanning path from a midpoint of the respective plural points.

When the island having high orientation rate of the (100) surface is used as an active layer of a TFT, mobility of the TFT can be heightened. Also when the orientation rate of the (100) surface of the active layer is high, it is possible to lessen variation of a film quality of a gate insulation film which is formed thereon, and therefore, it is possible to lessen variation of a threshold voltage of the TFT.

In addition, when the laser beam is irradiated to the sub-island, in the vicinity of an edge of the sub-island viewed from a point on the substrate, a micro-crystal is formed. It is contemplated that this may be because ways of diffusion of heat applied by the laser beam to the substrate differ in the vicinity of the edge and at a central part.

In the invention, since, after the crystallization by the laser beam, a portion where crystallinity in the vicinity of the edge is poor is removed by the patterning, the island can be formed by use of the center part of the sub-island, whose crystallinity is relatively good. In addition, an engineer can determine at pleasure which portion of the sub-island is removed by patterning to form the island.

As just described, it is not a case that the island is crystallized directly by the laser beam but the island is formed after the sub-island has been crystallized by the laser beam, and thereby, it is possible to more heighten the crystallinity of the island.

In addition, energy density in a beam spot of the laser beam is not in general uniform completely, and its height varies according to a position inside the beam spot. In the invention, it is desirable that a laser beam with constant energy density is irradiated to the whole island at the very least, more preferably to the whole sub-island. Thus, in the invention, it is necessary to use a beam spot having distribution of the energy density which is suited for size and shape of the island or the sub-island, so that an area having uniform energy density overlaps with the island, more preferably with the sub-island completely. In order to meet conditions of the above-described energy density, it is contemplated to be desirable that a shape of the beam spot is made to be of a rectangular or a linear etc. but, if the conditions of the energy density are satisfied, a shape of the beam spot is not limited to this.

Further, by shielding a portion where the energy density is low in the beam spot by use of a slot, it is possible to irradiate the laser beam with relatively uniform energy density to the sub-island, and the crystallization can be carried out uniformly. Also, by disposing the slot, it is possible to partially change width of the beam spot by the pattern information of the sub-island, and further, it is possible to lessen a restriction on a layout of the island which is used as the active layer of the TFT. In addition, the width of the beam spot means length of the beam spot in a perpendicular direction to the scanning direction.

Also, it may be fine to use one beam spot which was obtained by synthesizing the laser beams oscillated by a plurality of laser oscillation apparatuses for the laser crystallization. By the above-described structure, it is possible to compensate a portion where the energy density of each laser beam is weak, and to obtain a beam spot whose shape is close to a linear shape.

Also, after a semiconductor film was formed, or after the sub-island was formed, so as not to be exposed to the atmosphere (for example, a special gas atmosphere such as a noble gas, nitrogen, oxygen etc. or a hypobaric atmosphere (reduced-pressure atmosphere) is made), irradiation of the laser beam may be carried out so that the semiconductor film is crystallized. By the above-described structure, it is possible to prevent contaminants at the molecular level in a clean room, for example, boron etc. which is included in a filter for heightening cleanliness of air from coming to be mixed in the sub-island on the occasion of the crystallization by the laser beam.

BRIEF DESCRIPTION OF THE DRAWRINGS

The invention, together with further advantages thereof, may best be understood by reference to the following description taken in conjunction with the accompanying drawings in which:

FIGS. 1A–D are views showing laser irradiation methods of the invention;

FIGS. 2A–C are views showing physical relationship of beam spots and sub-islands;

FIGS. 3A–C are views showing physical relationship of the beam spots and the sub-islands;

Figure 7A:
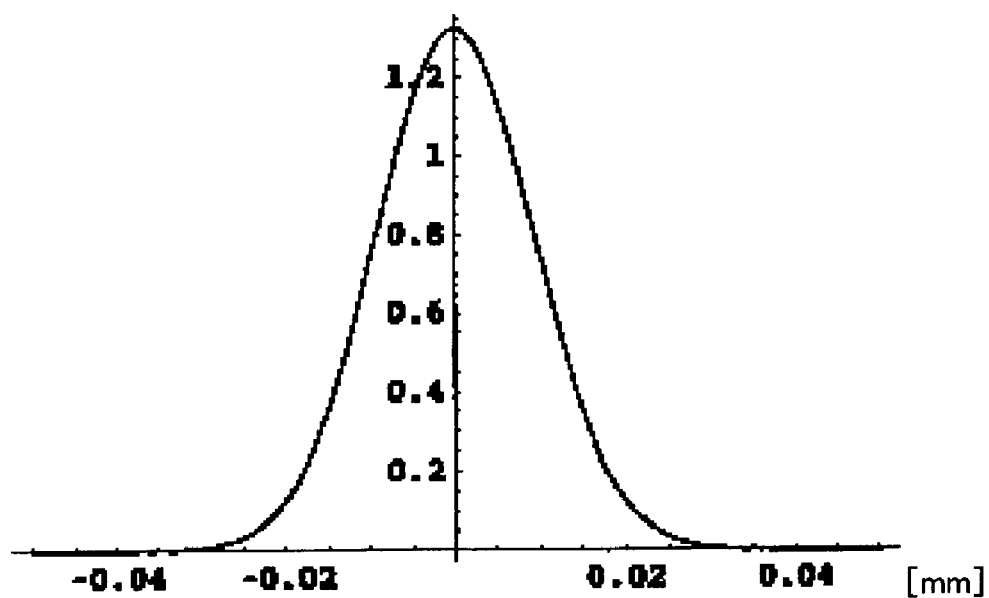
Figure 7B:
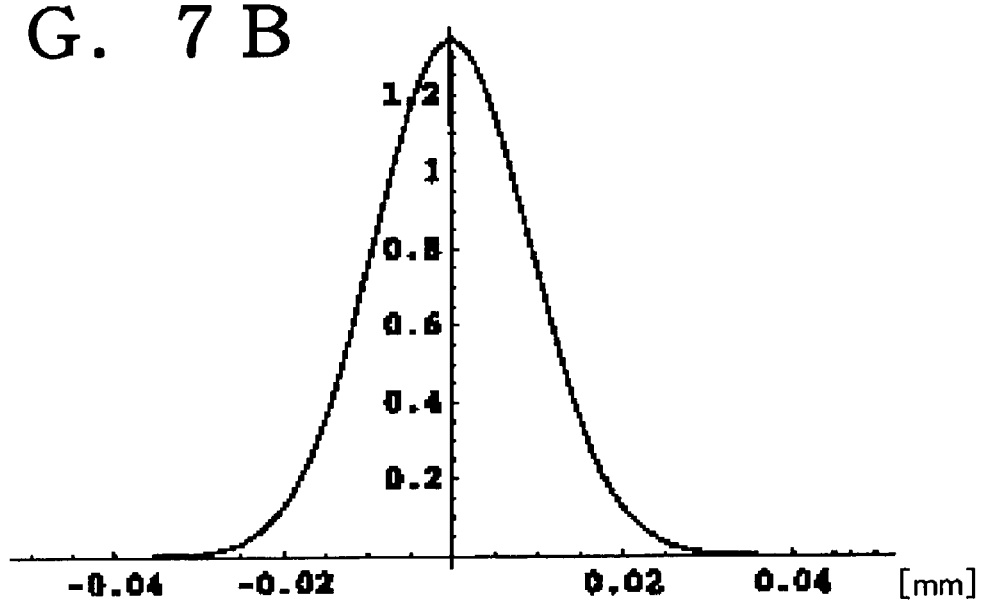
Figure 8:
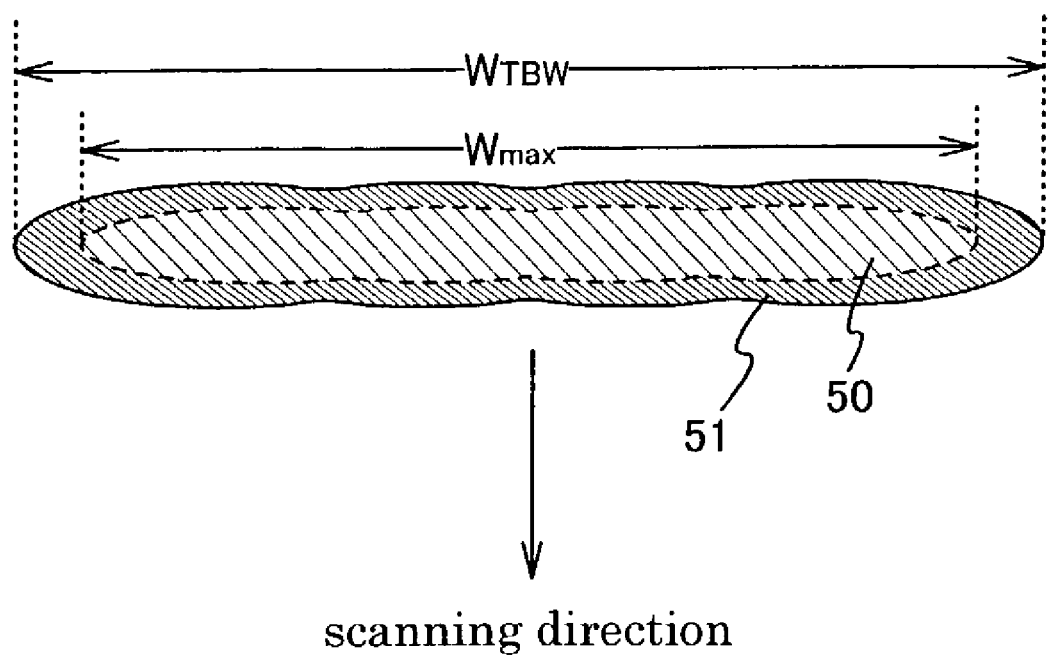
Figure 9:
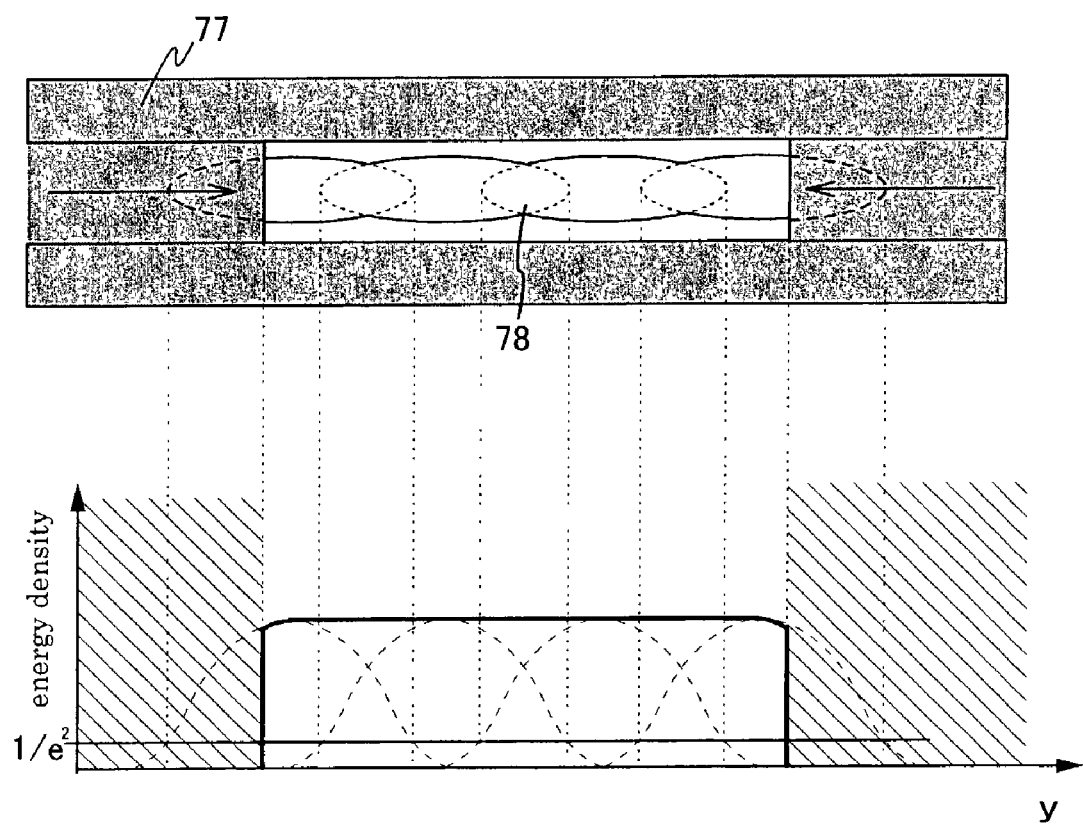
Figure 10A:
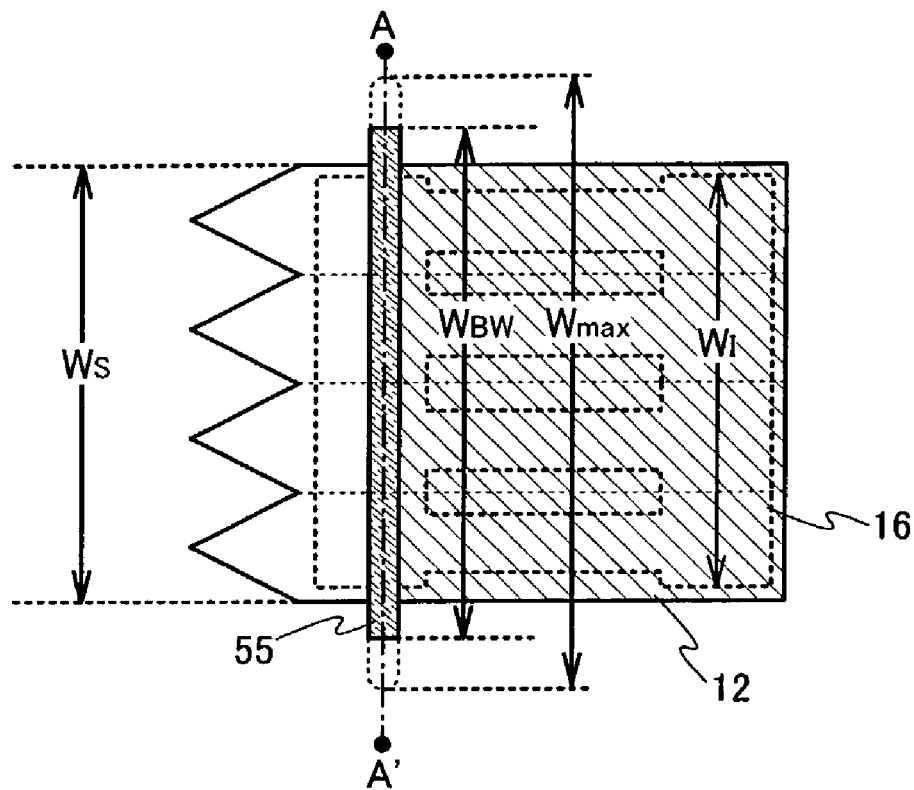
Figure 10B:
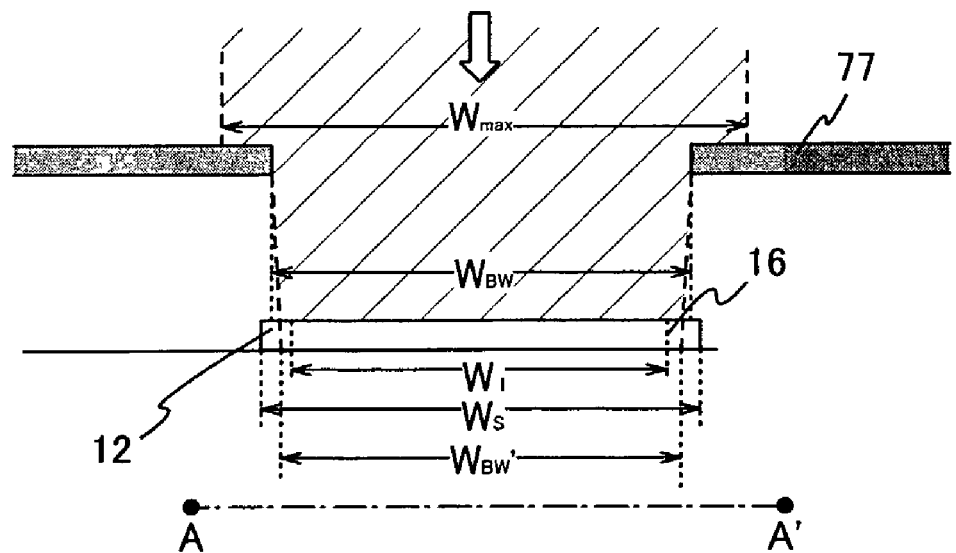
Figure 11A:
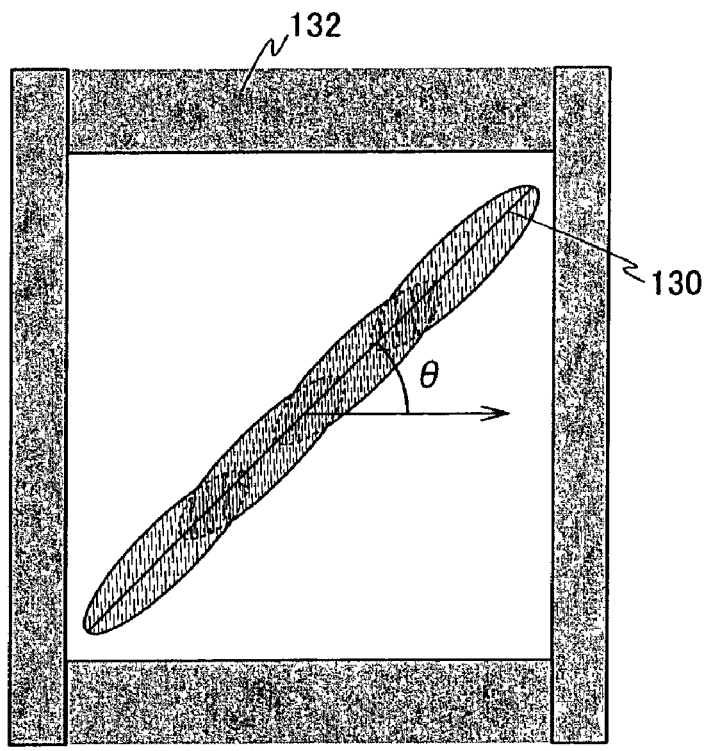
Figure 11B:
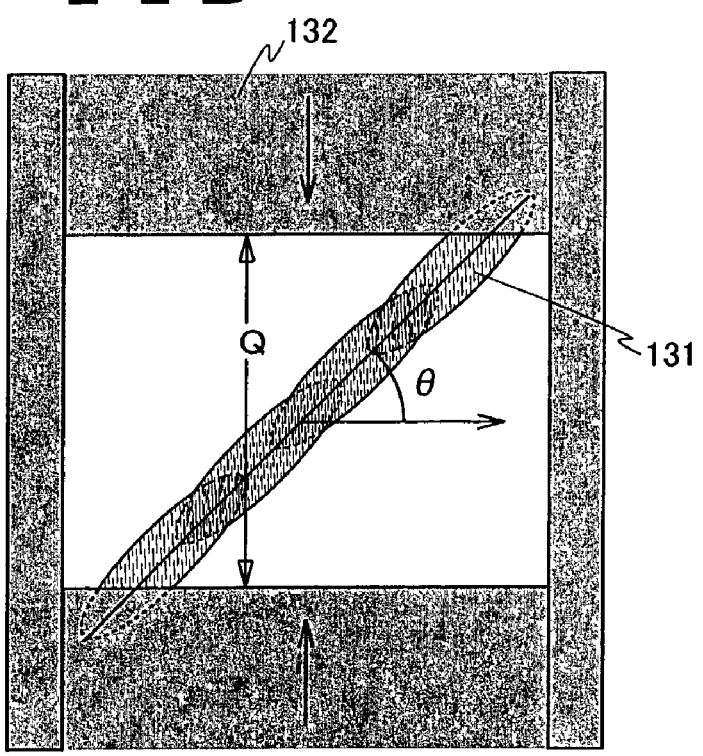
Figure 12A:
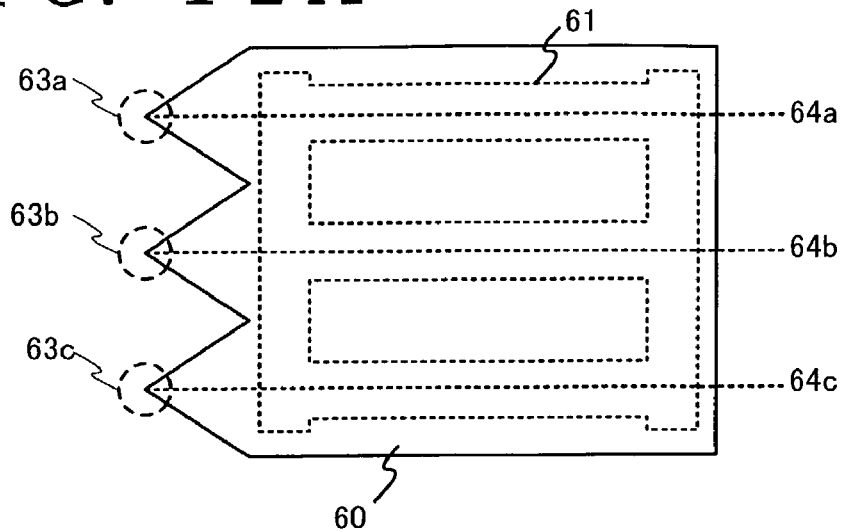
Figure 12B:
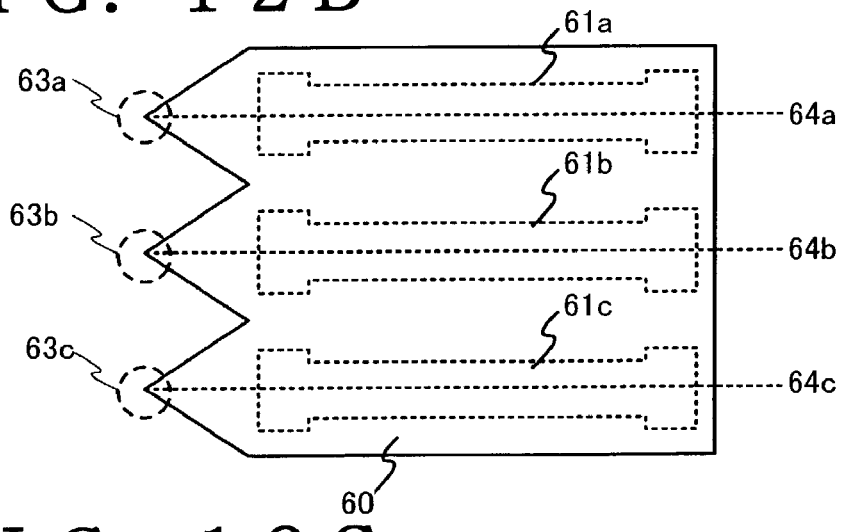
Figure 12C:
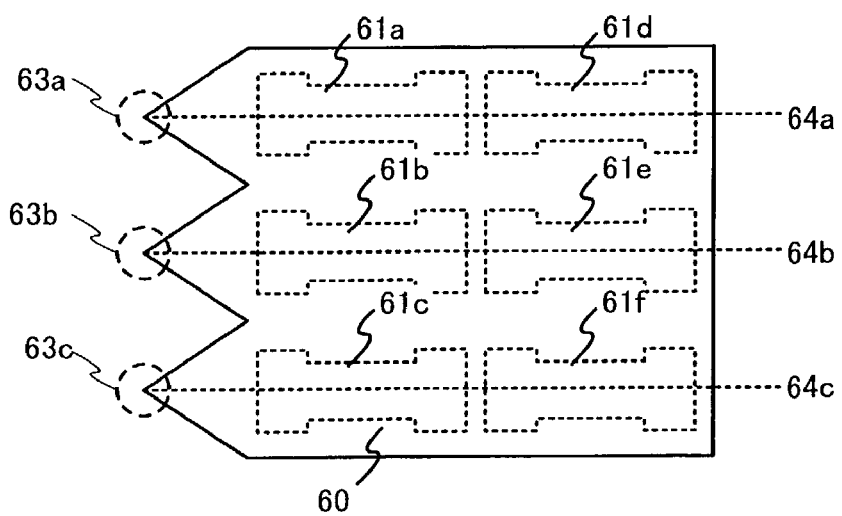
Figure 13A:
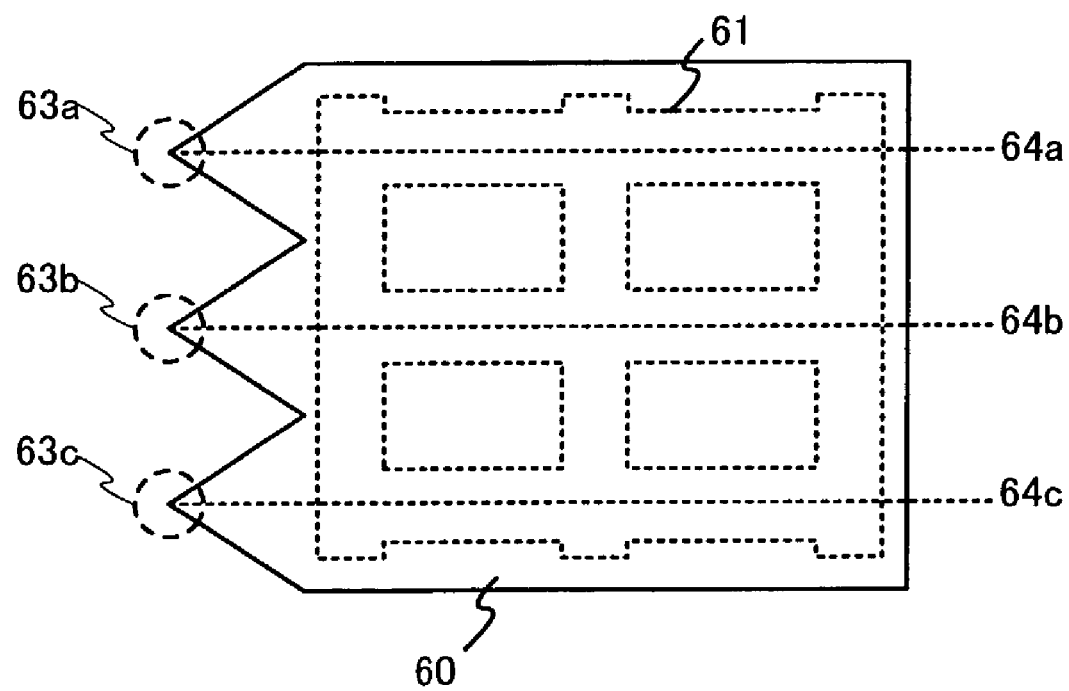
Figure 13B:
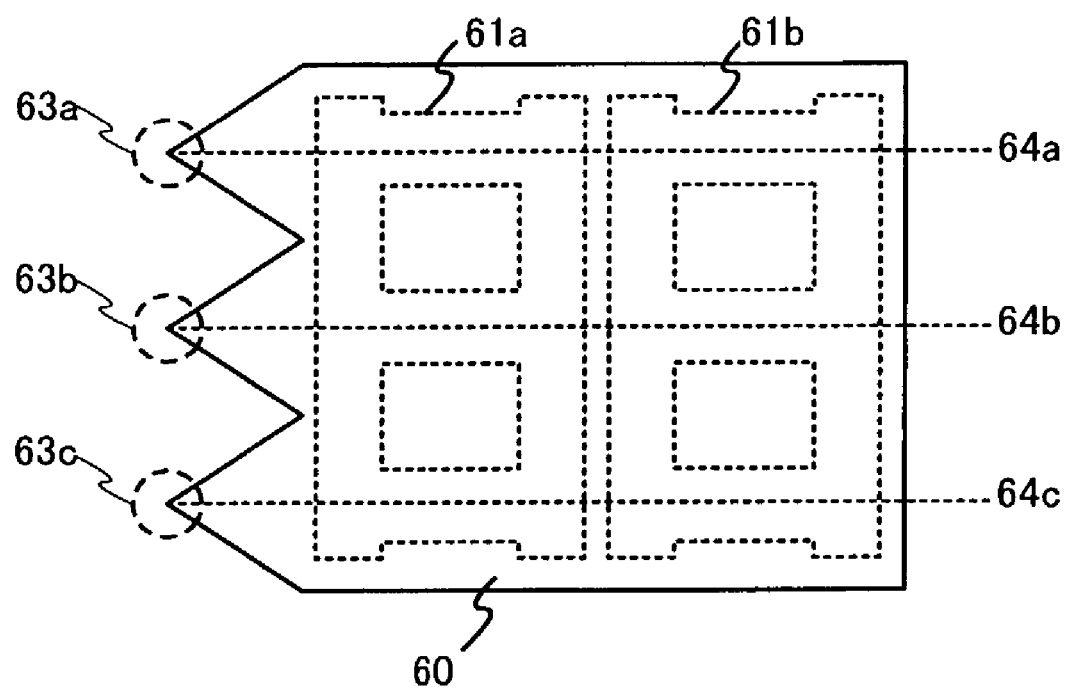
Figure 15A:
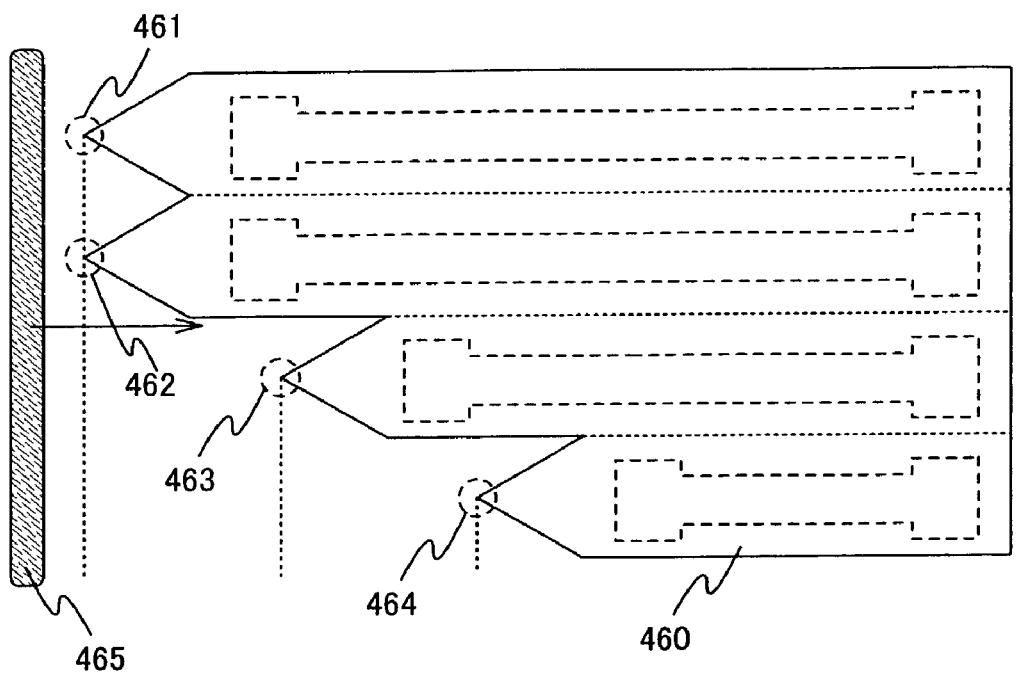
Figure 15B:
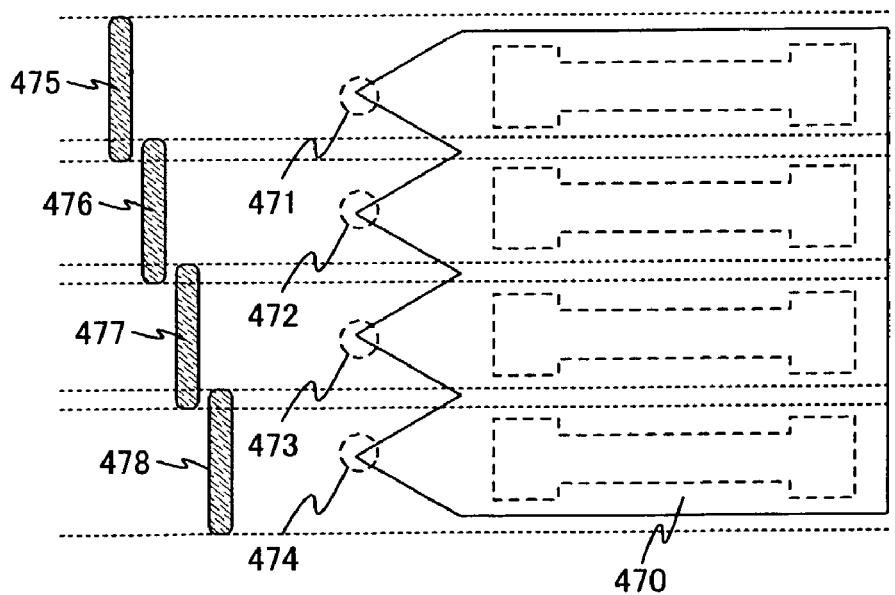
Figure 16A:
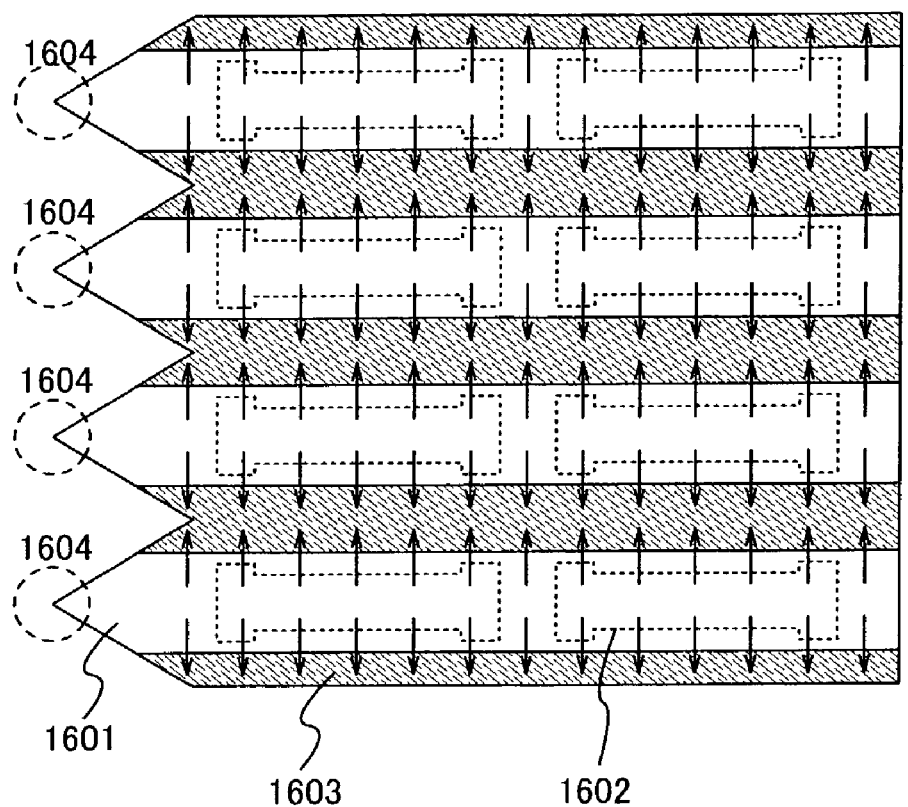
Figure 16B:
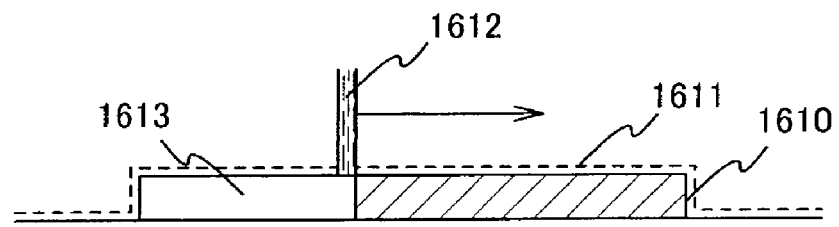
Figure 17A:
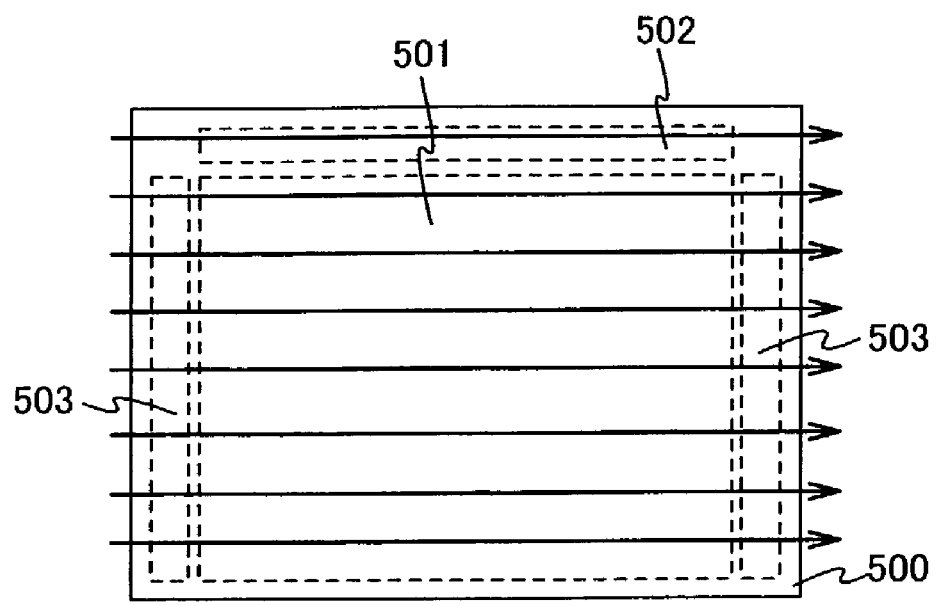
Figure 17B:
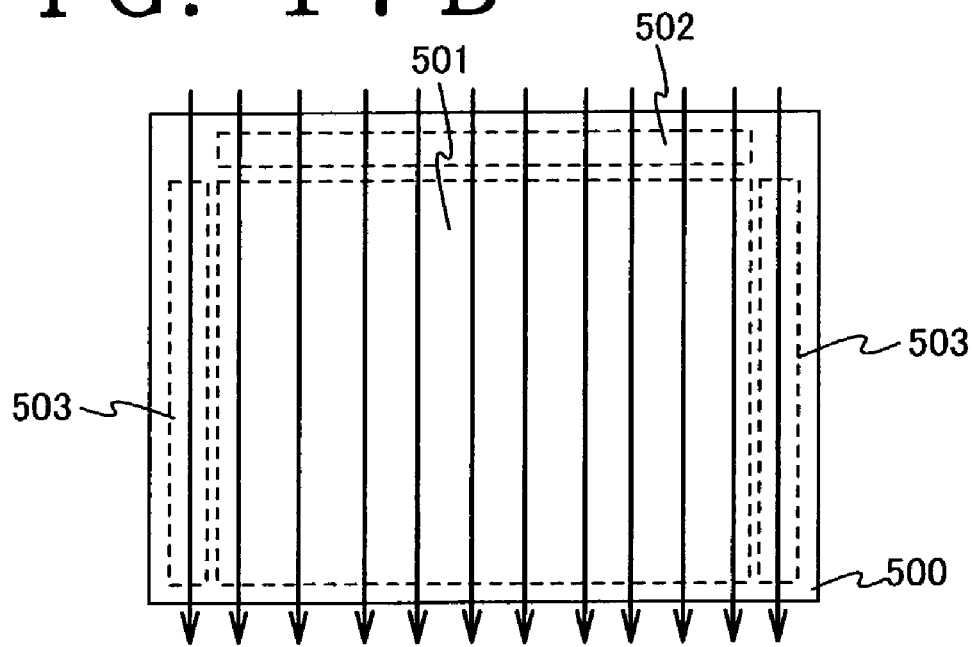
Figure 18A:
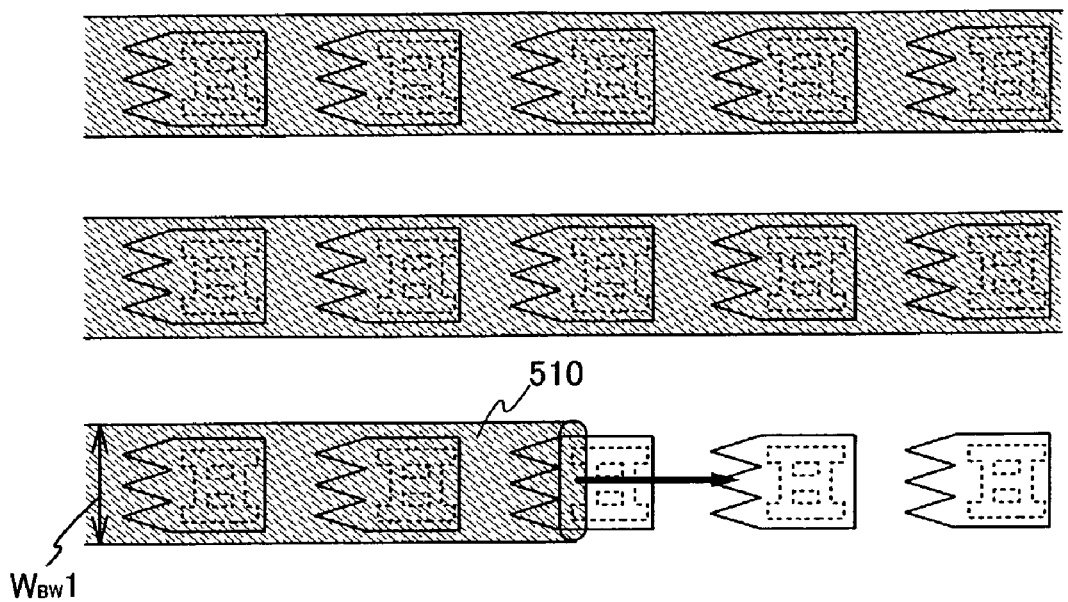
Figure 18B:
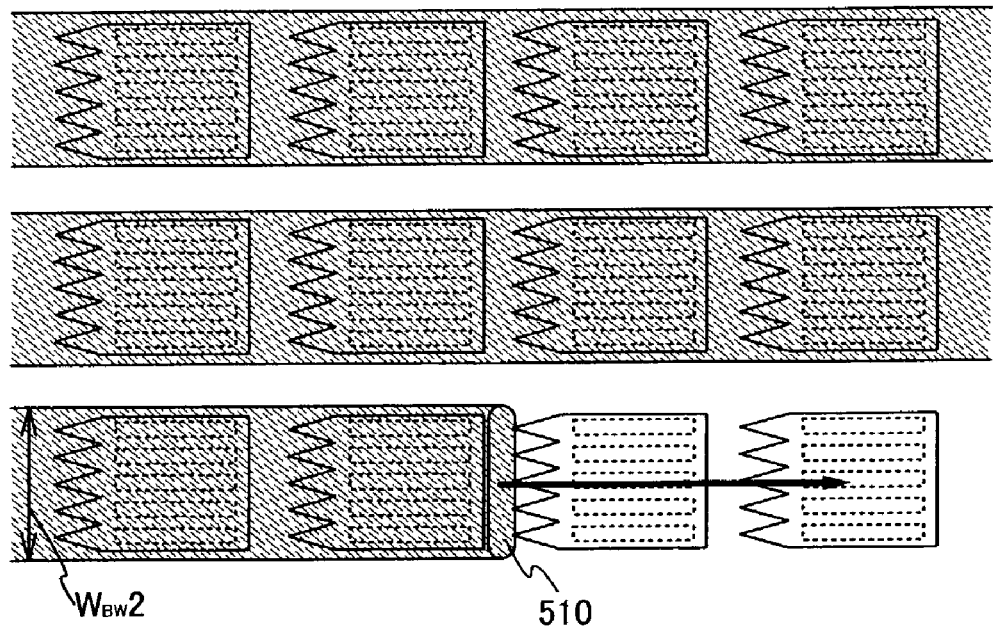
Figure 19:
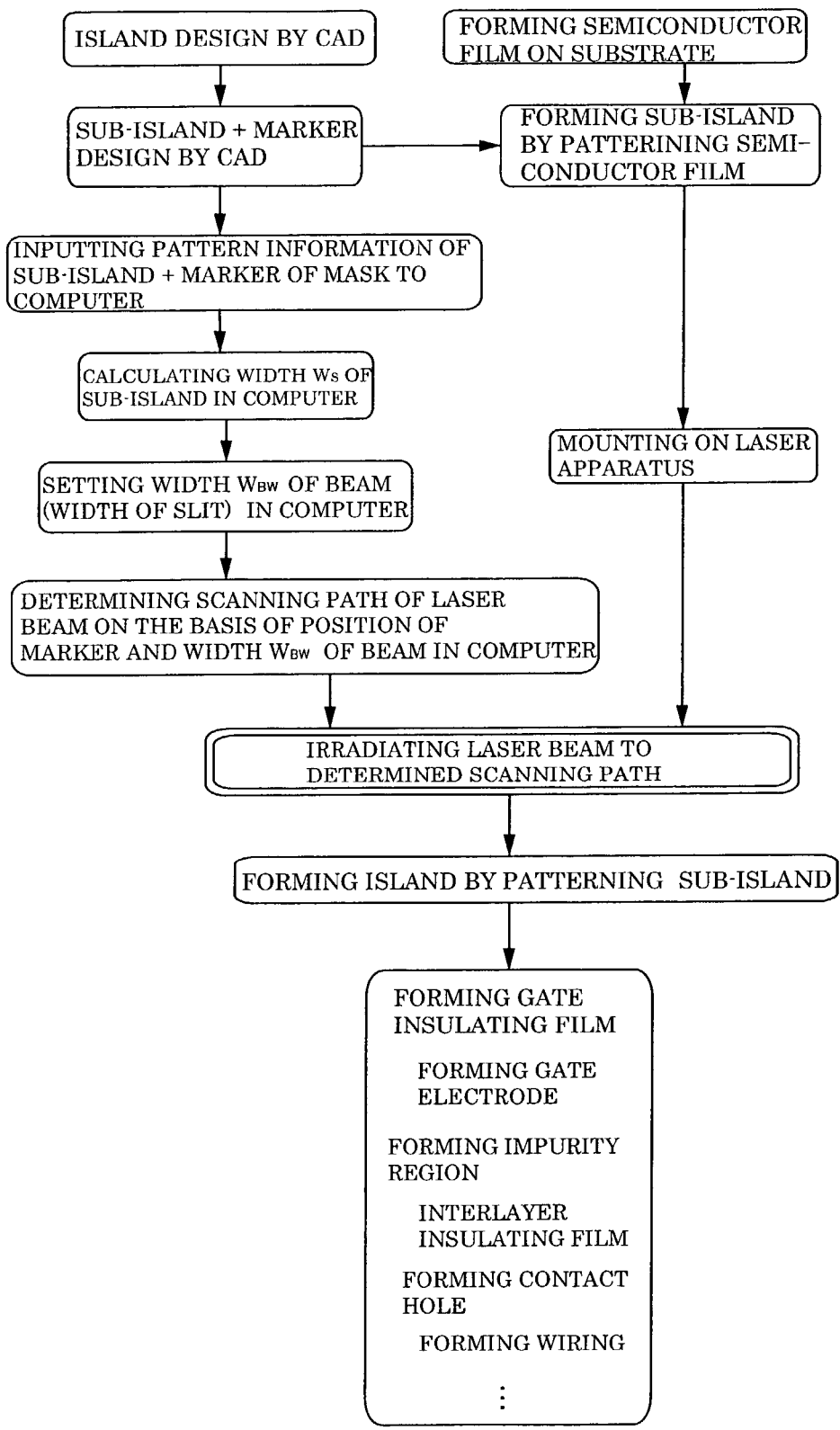
Figure 20:
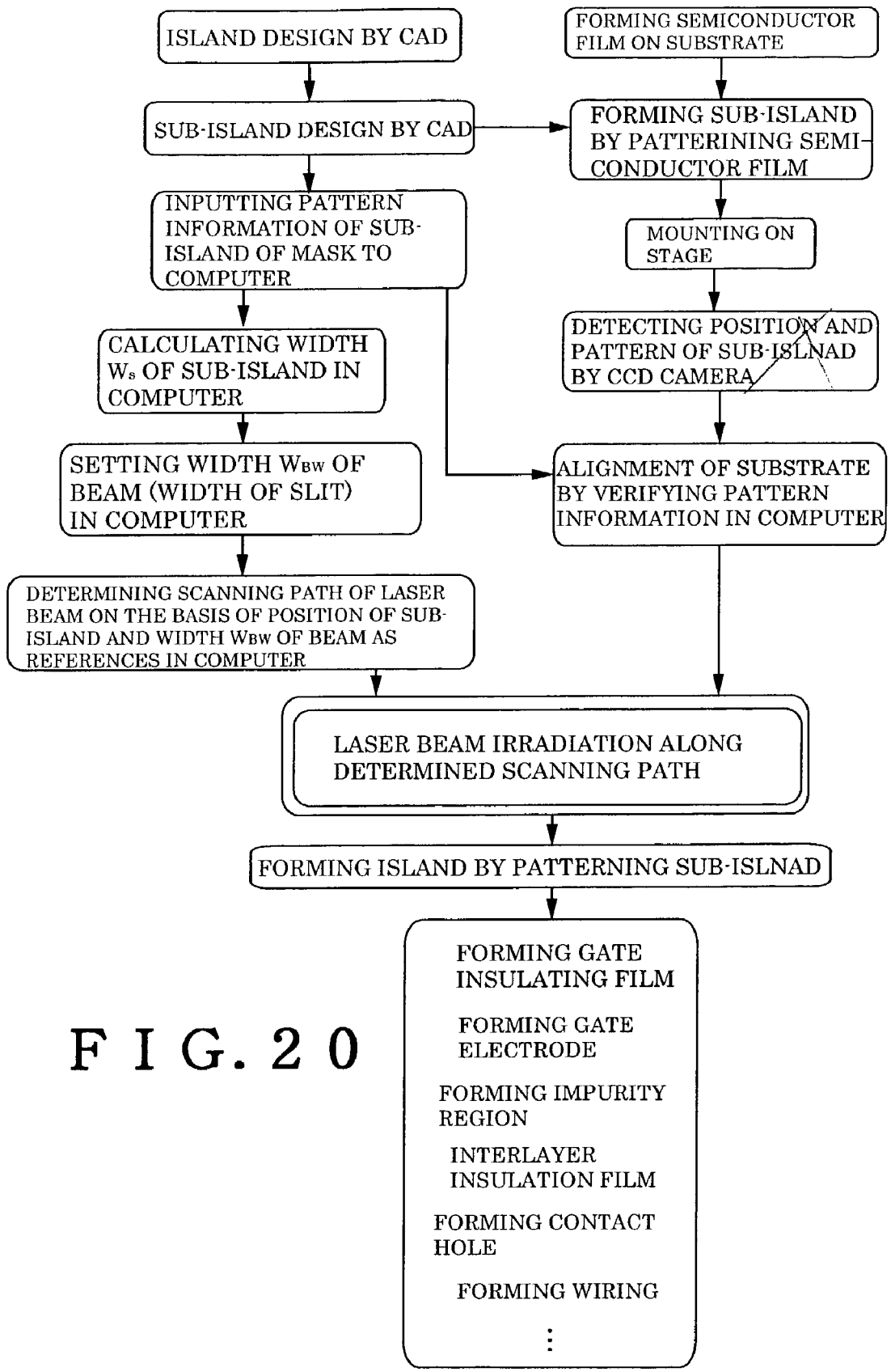
Figure 21:
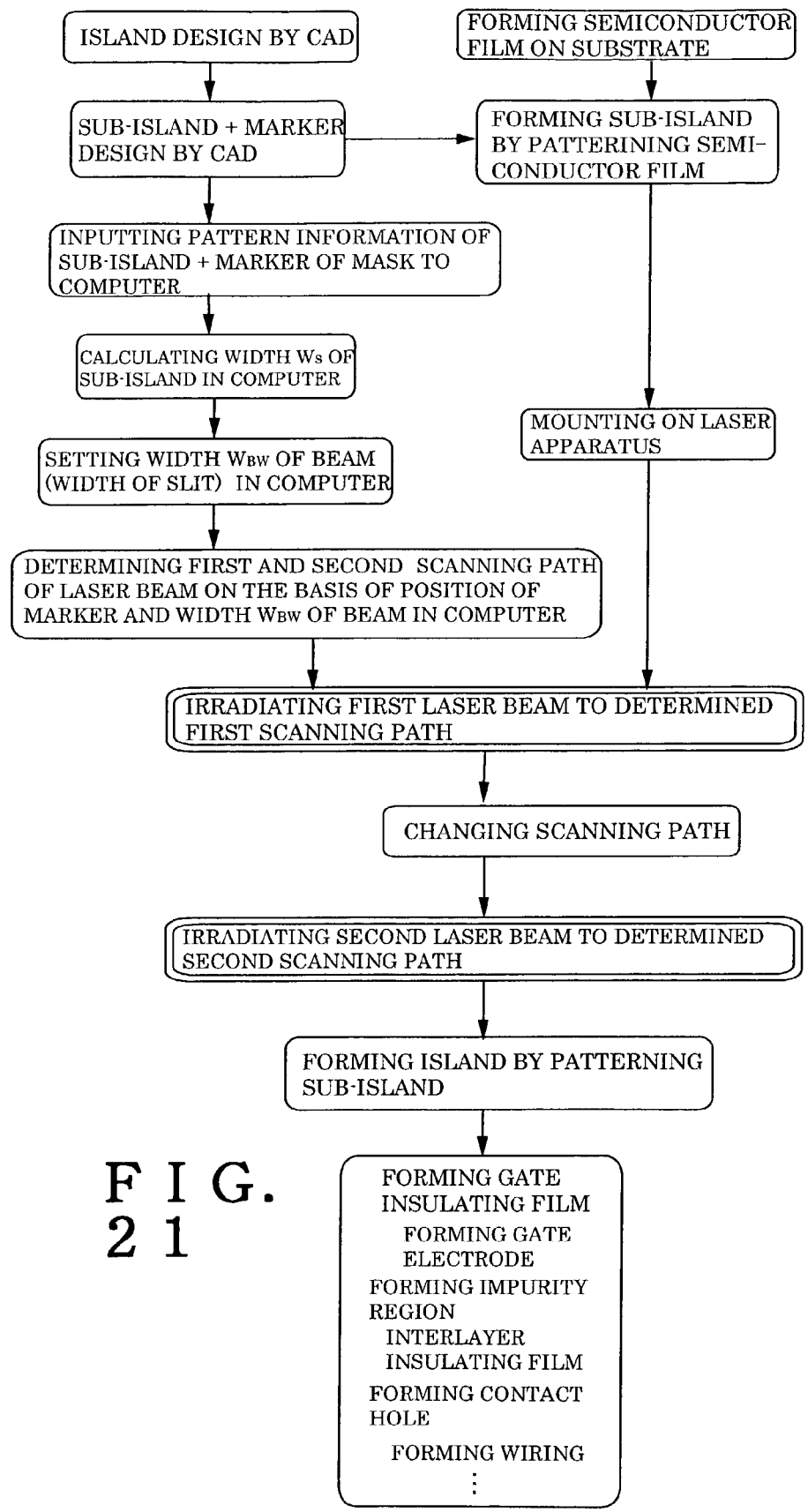
Figure 22:
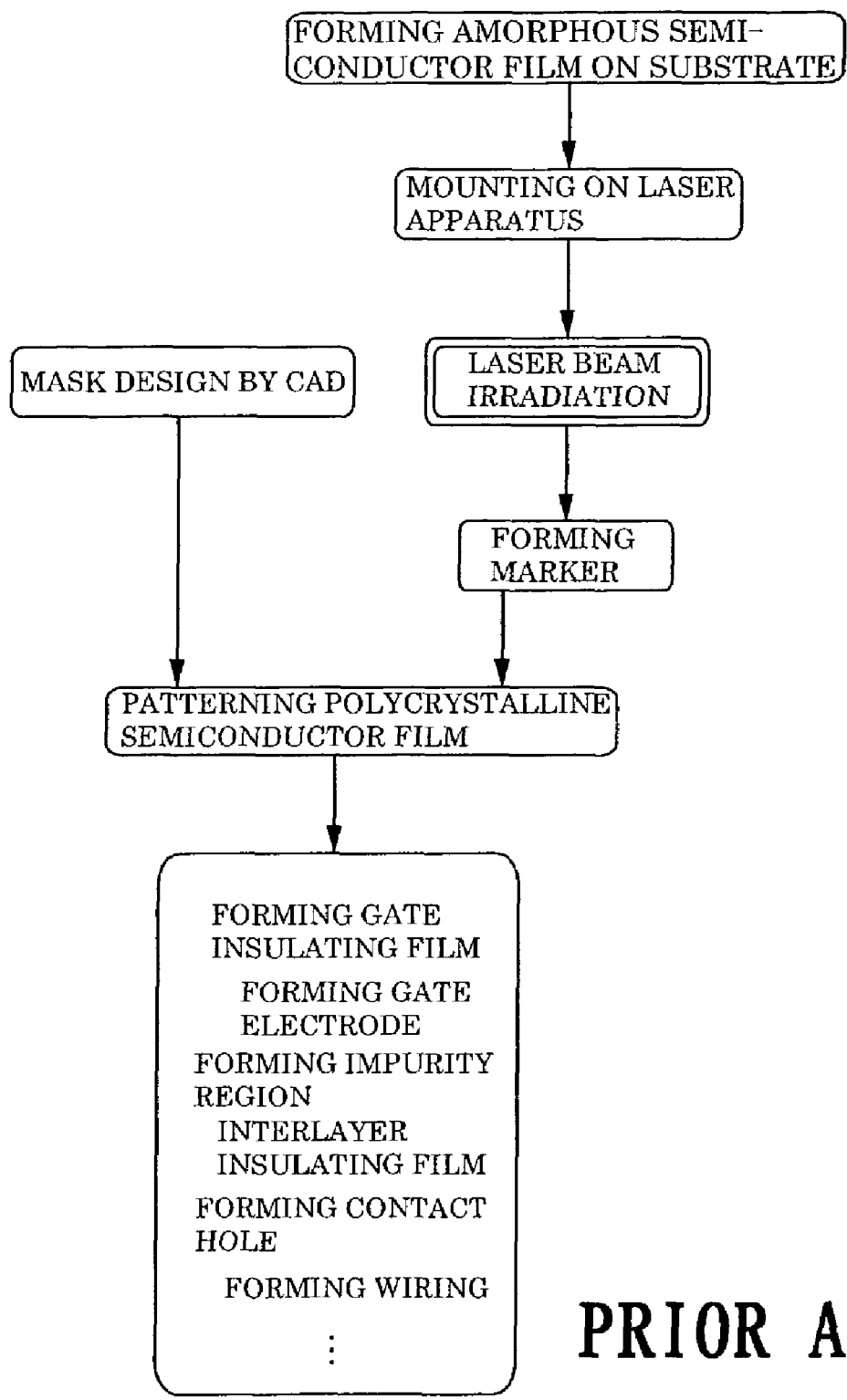
Figure 23A:
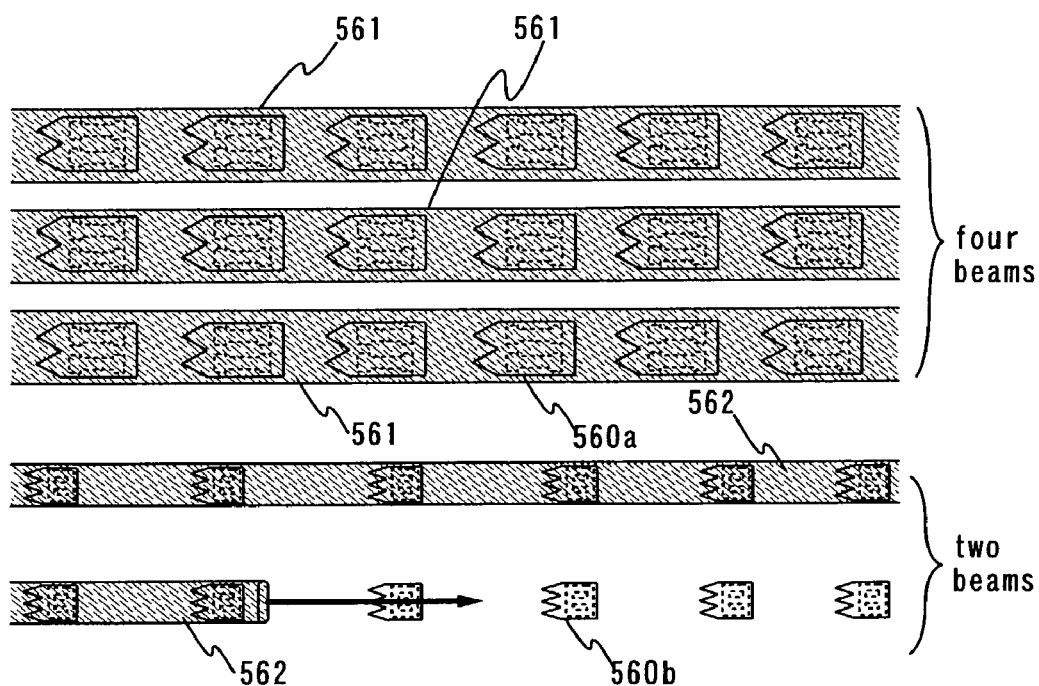
Figure 23B:
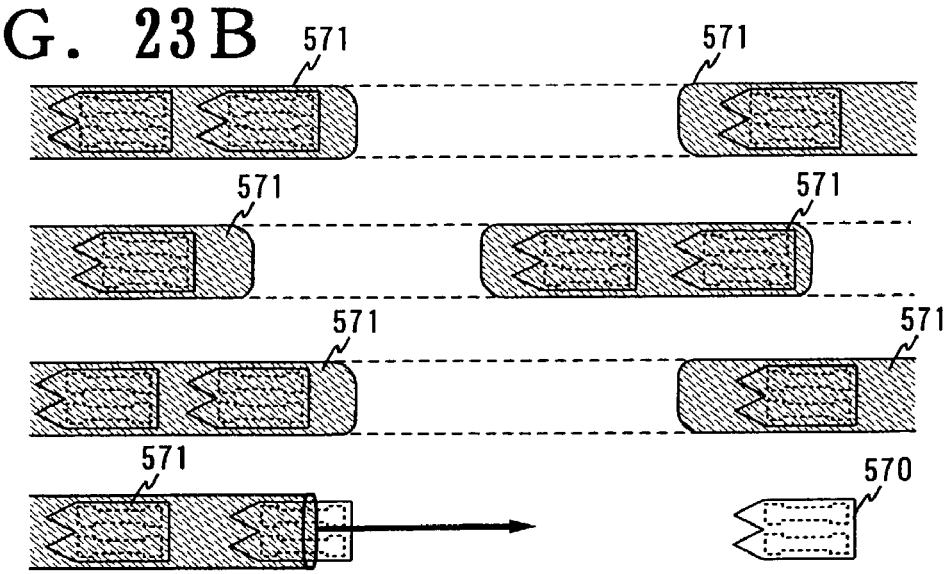
Figure 24:
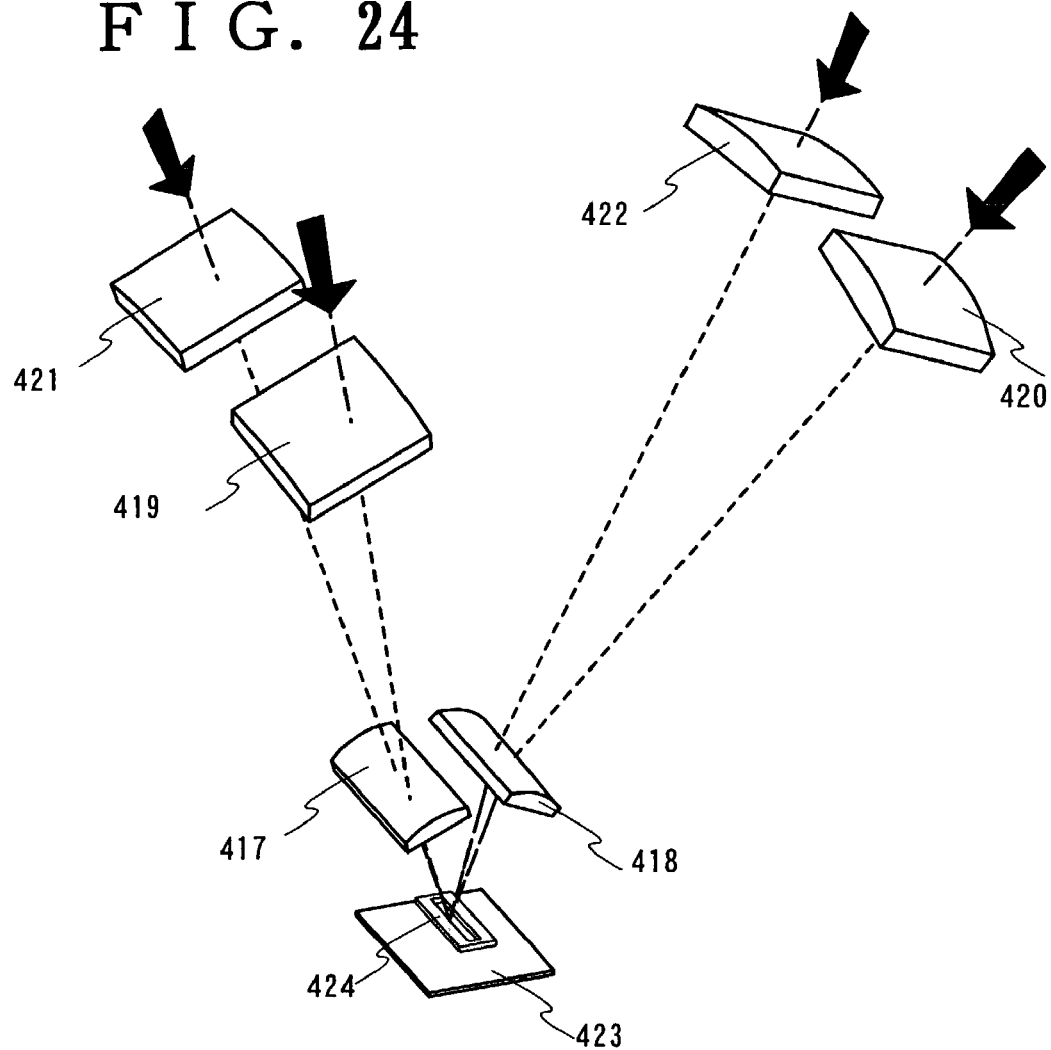
Figure 25A:
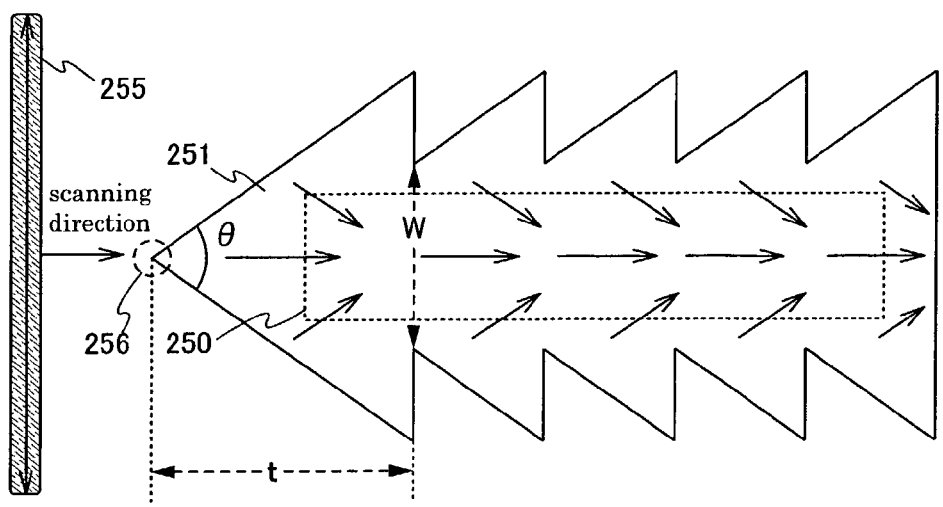
Figure 25B:
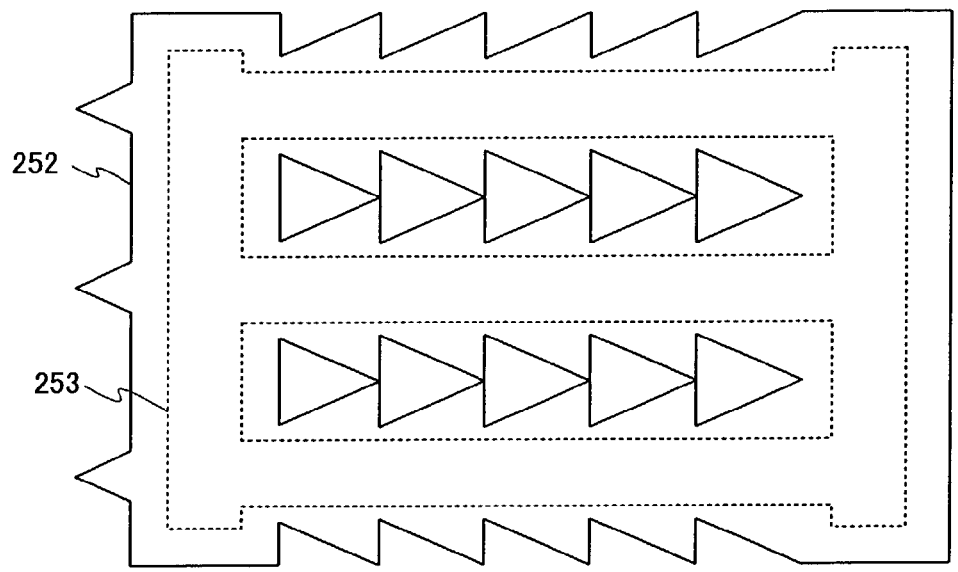
Figure 27:
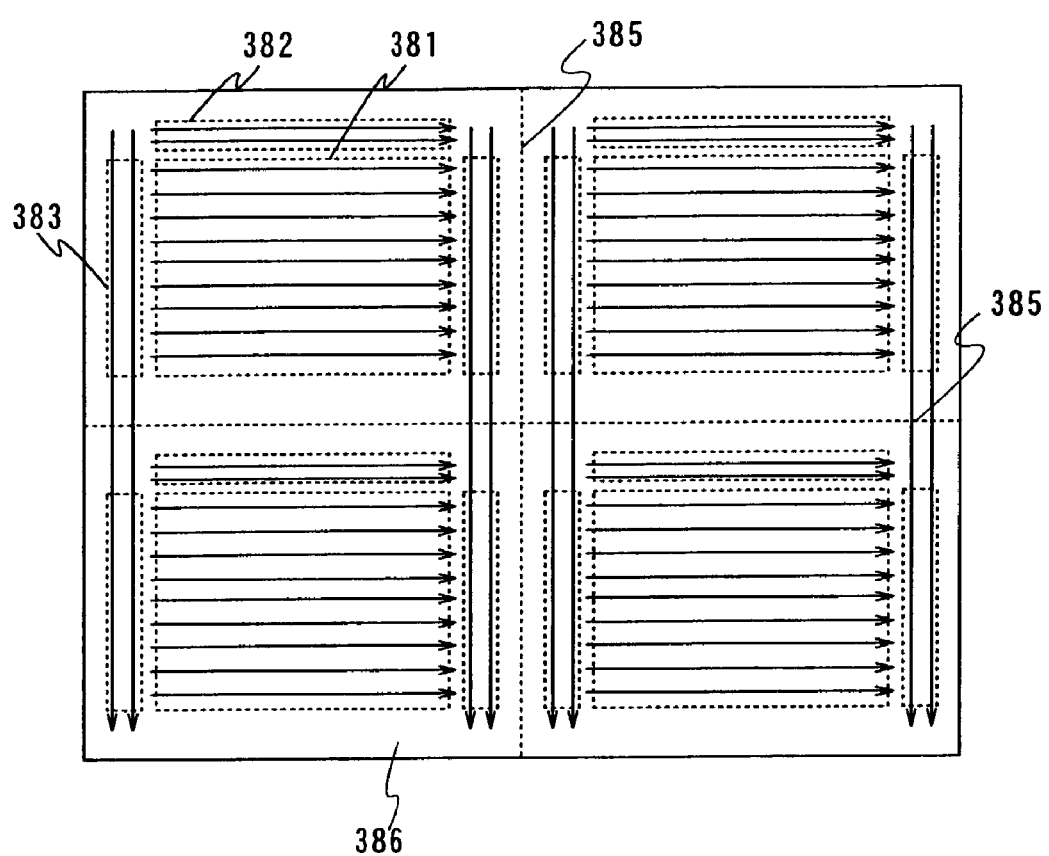
Figure 28:
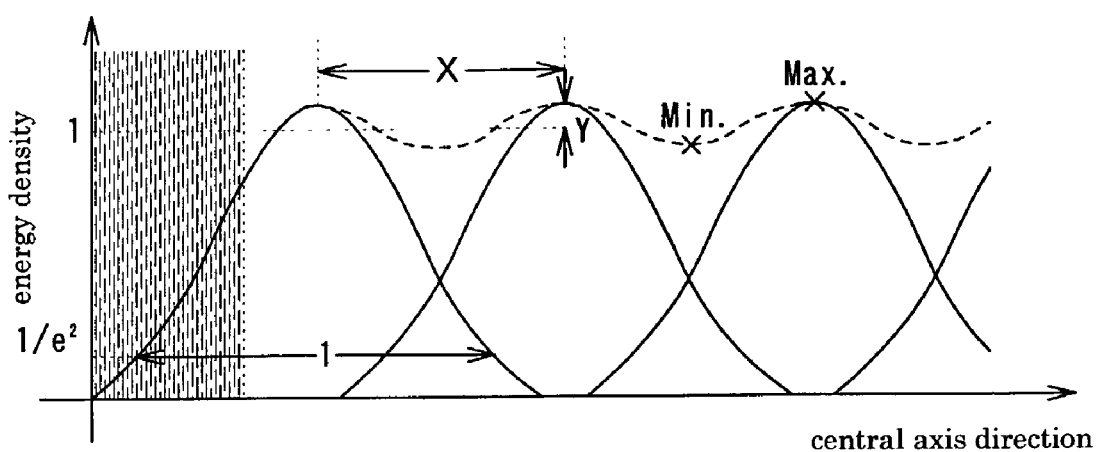
Figure 29:
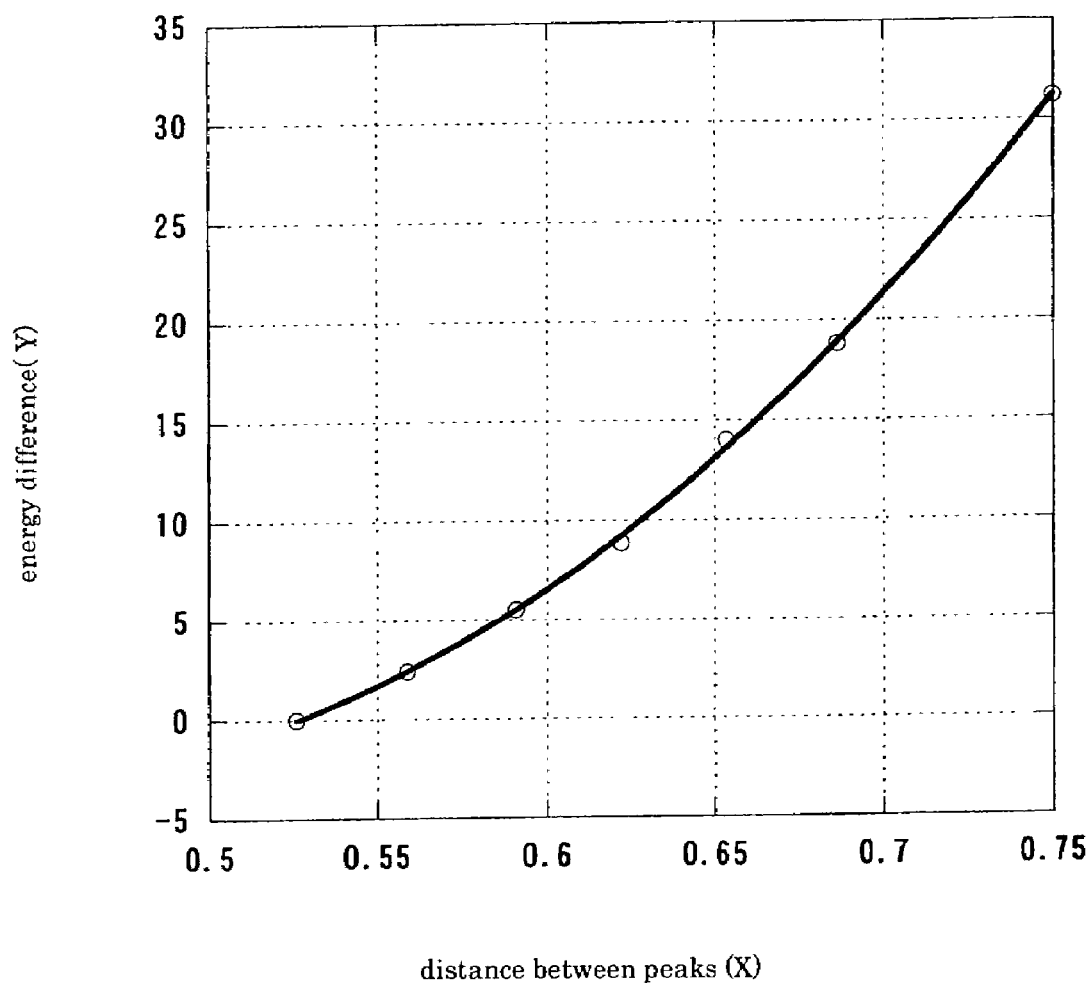
Figure 30:
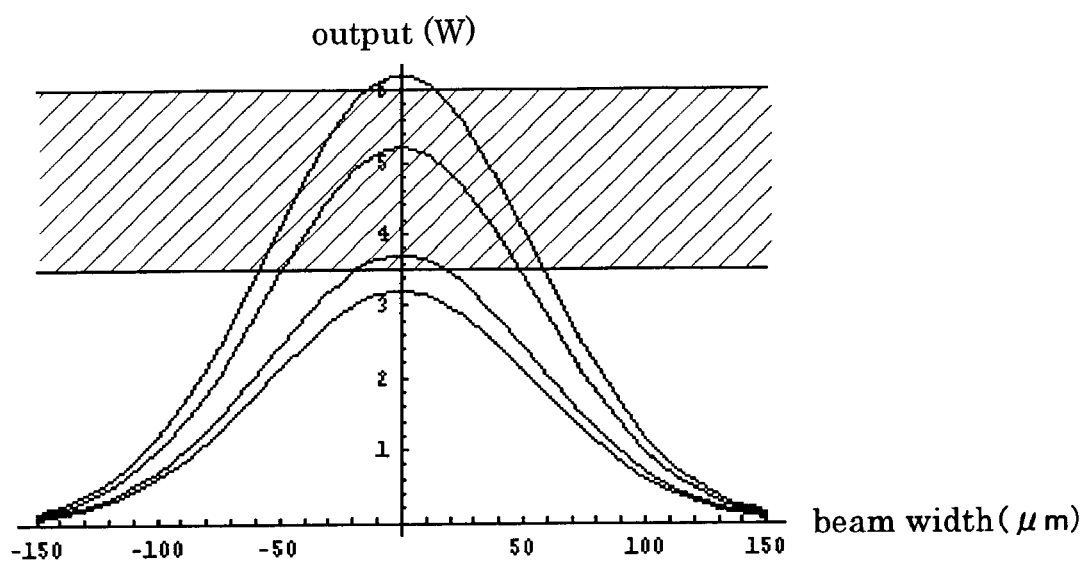
Figure 31A:
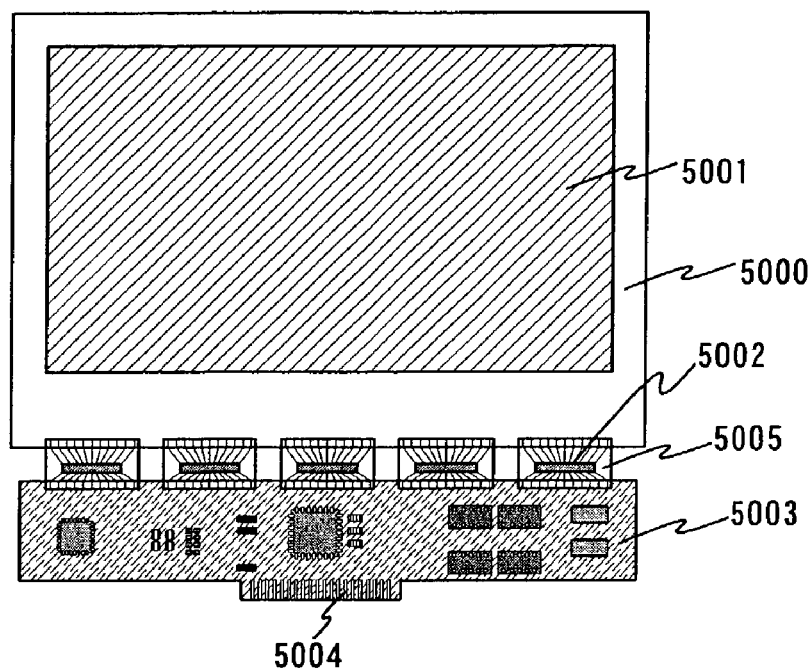
Figure 31B:
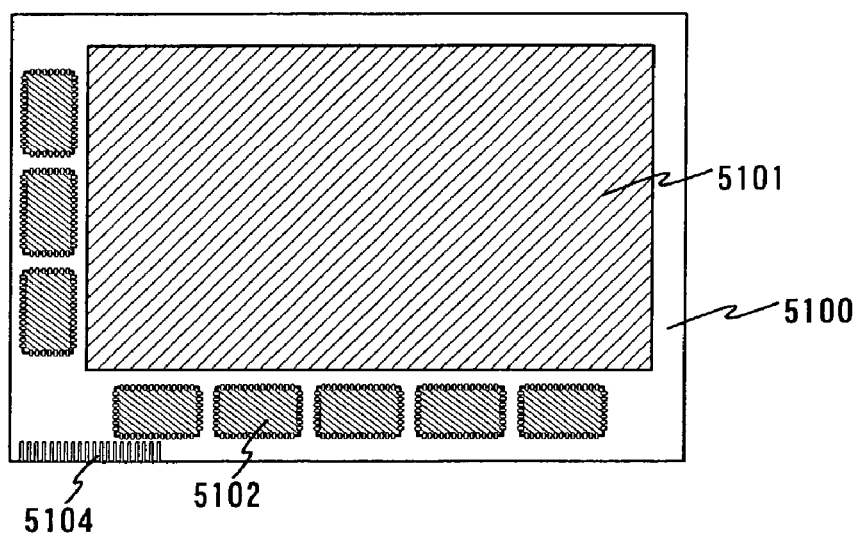
Figures 33A, 33B, 33C:
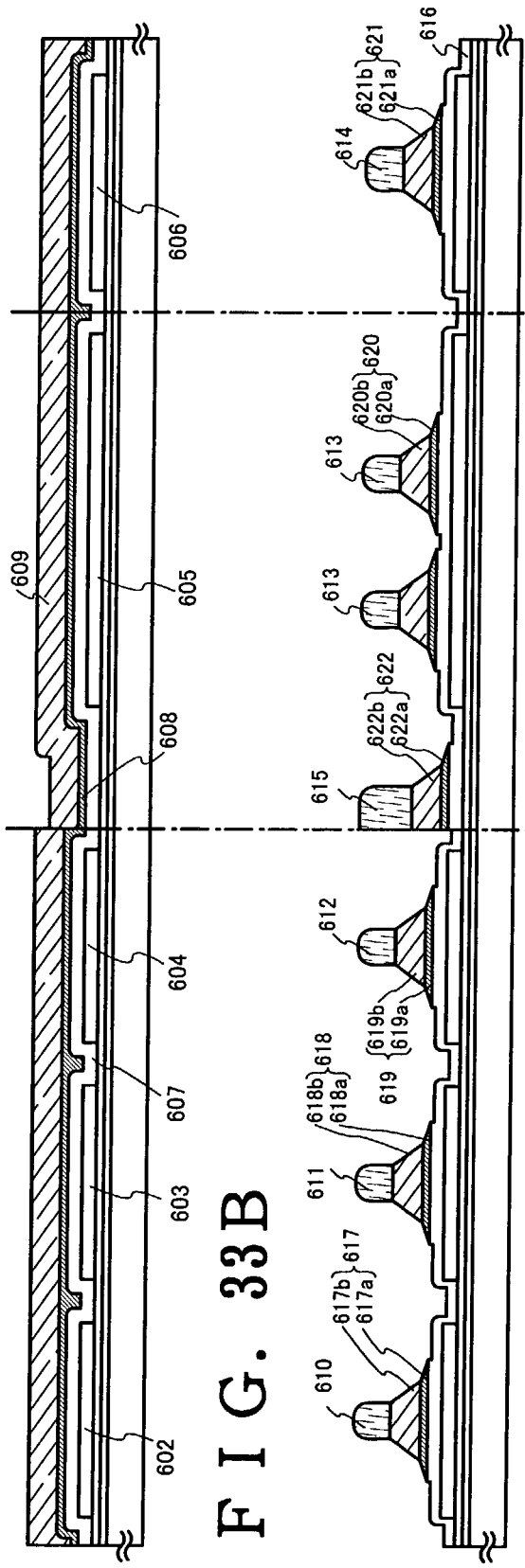
Figure 35:
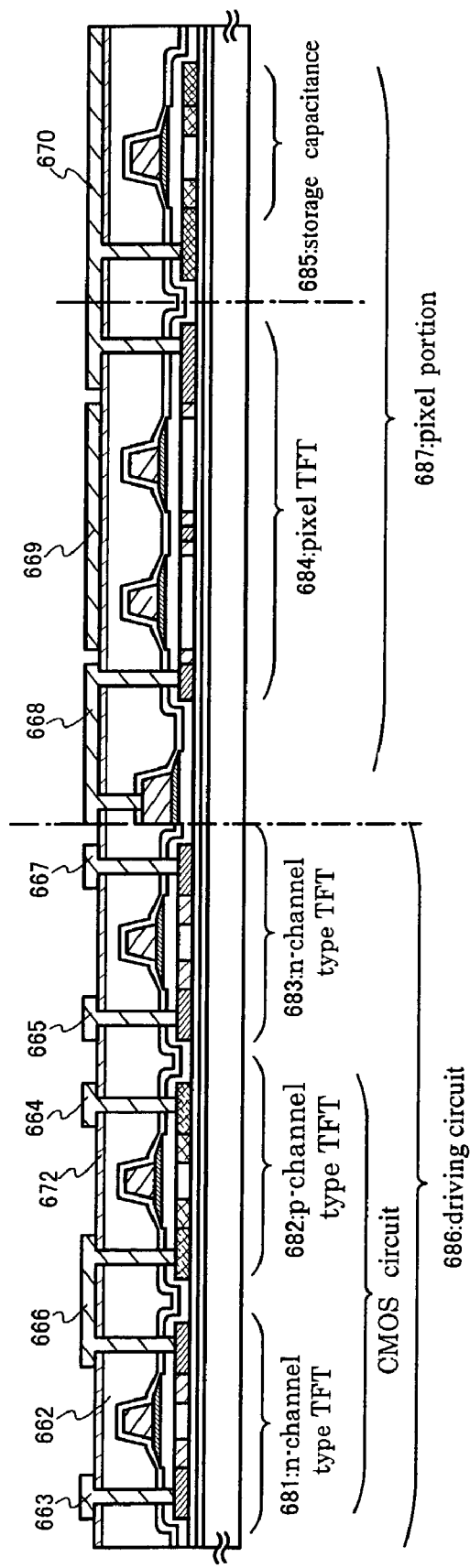
Figure 36:
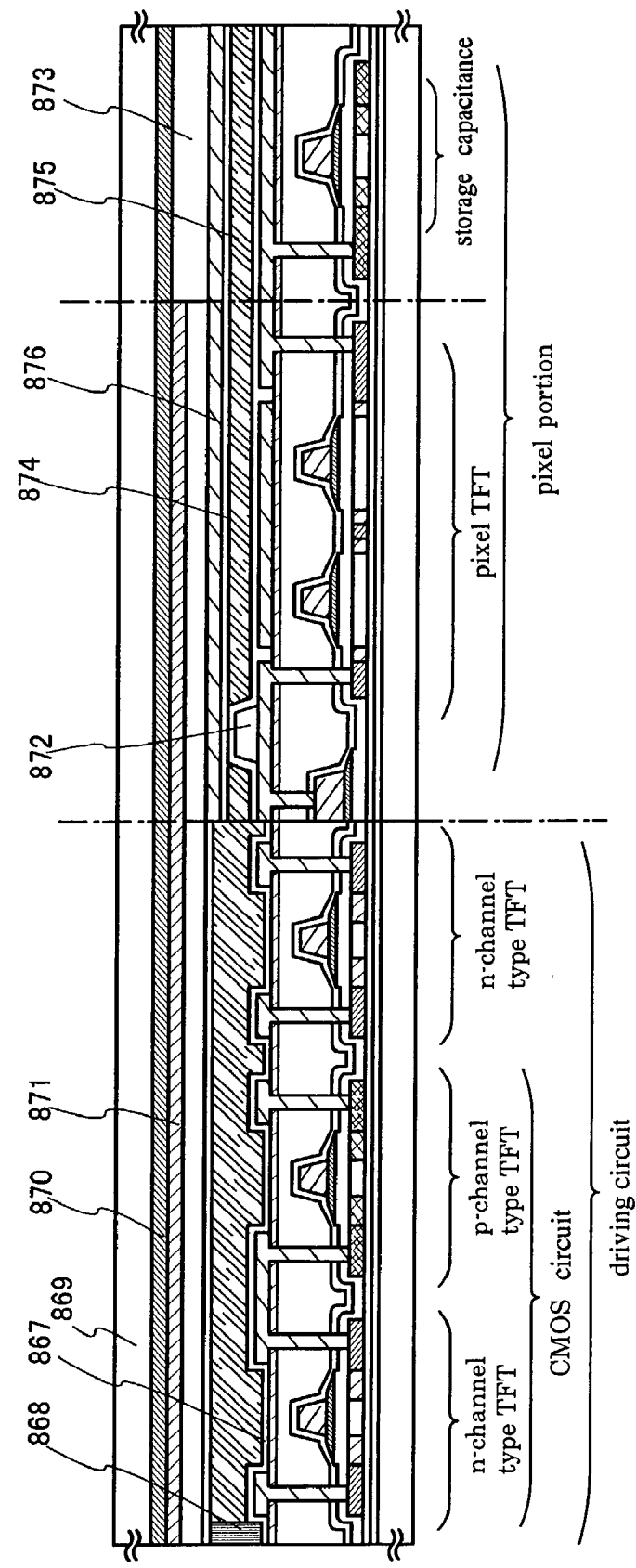
Figure 38:
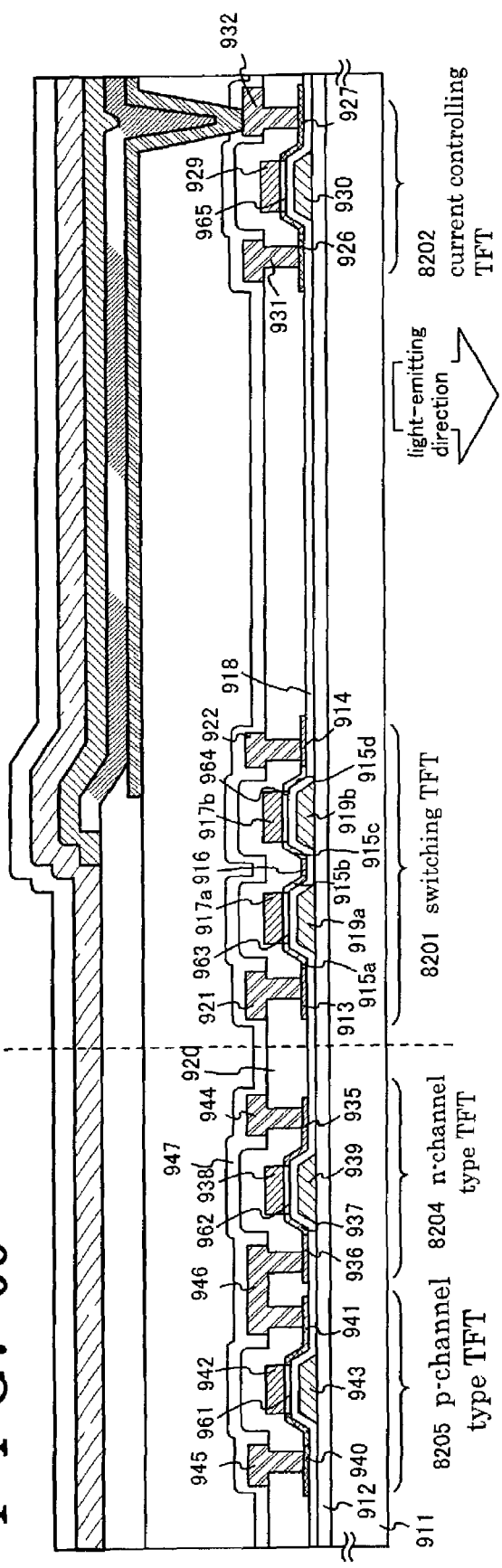
Figure 39:
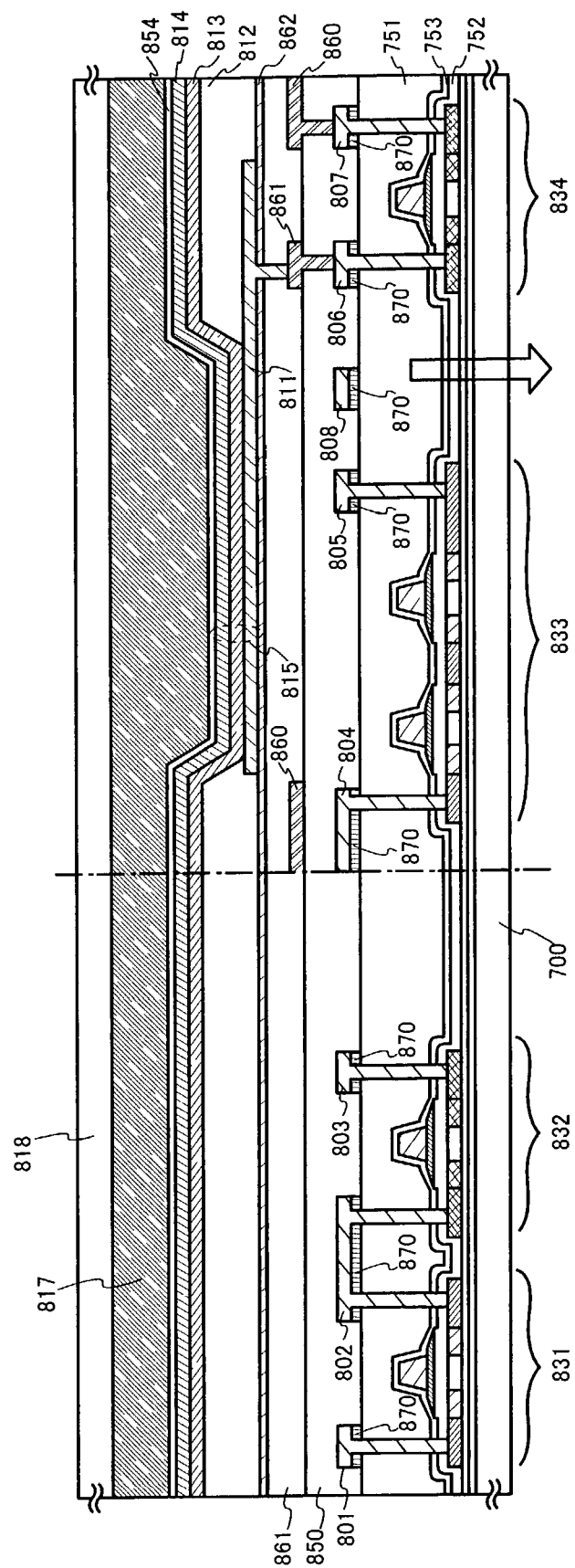
Figure 40:
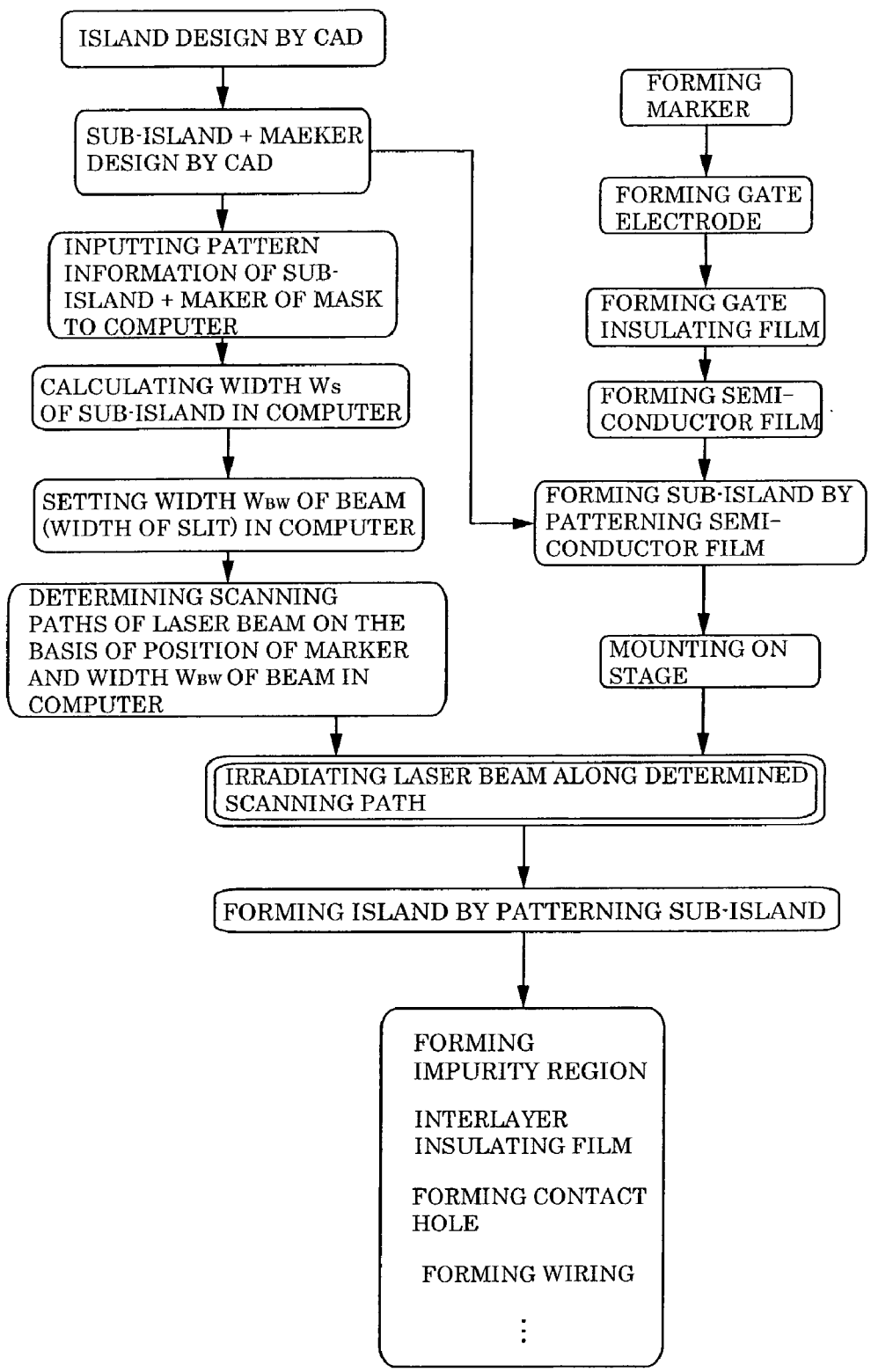
Figure 41:
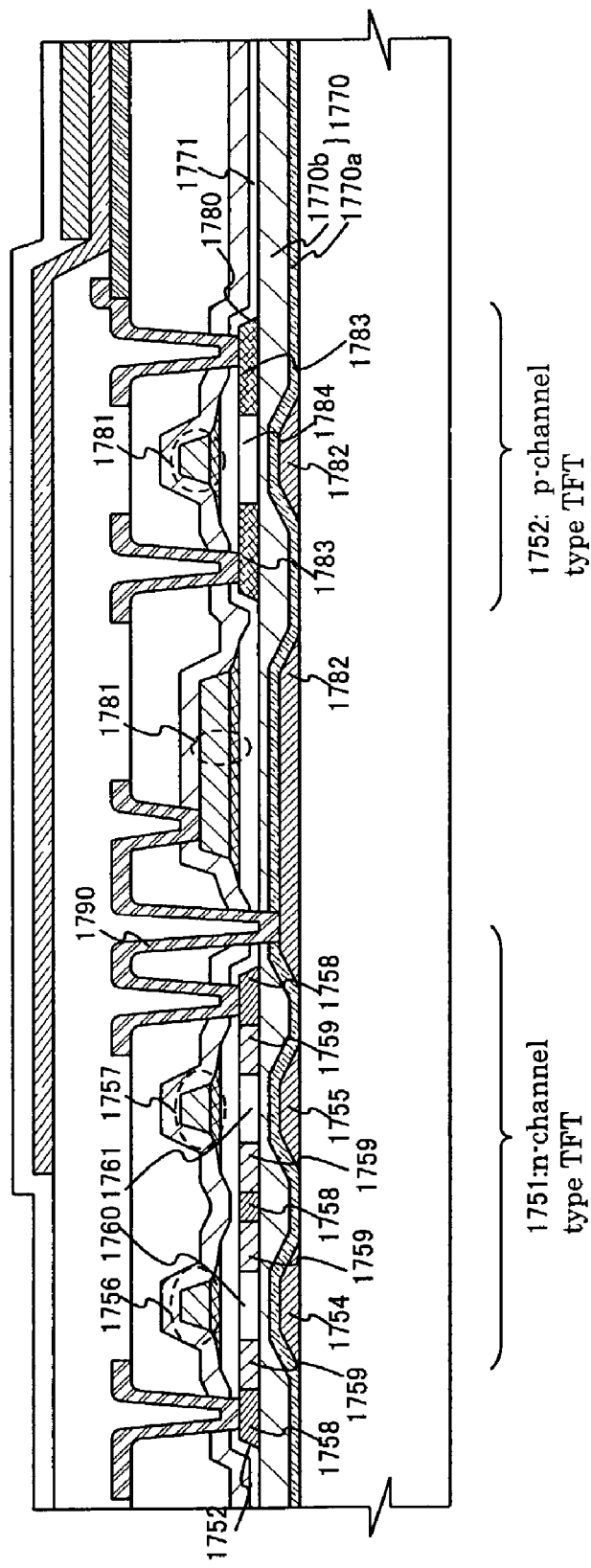
Figure 42:
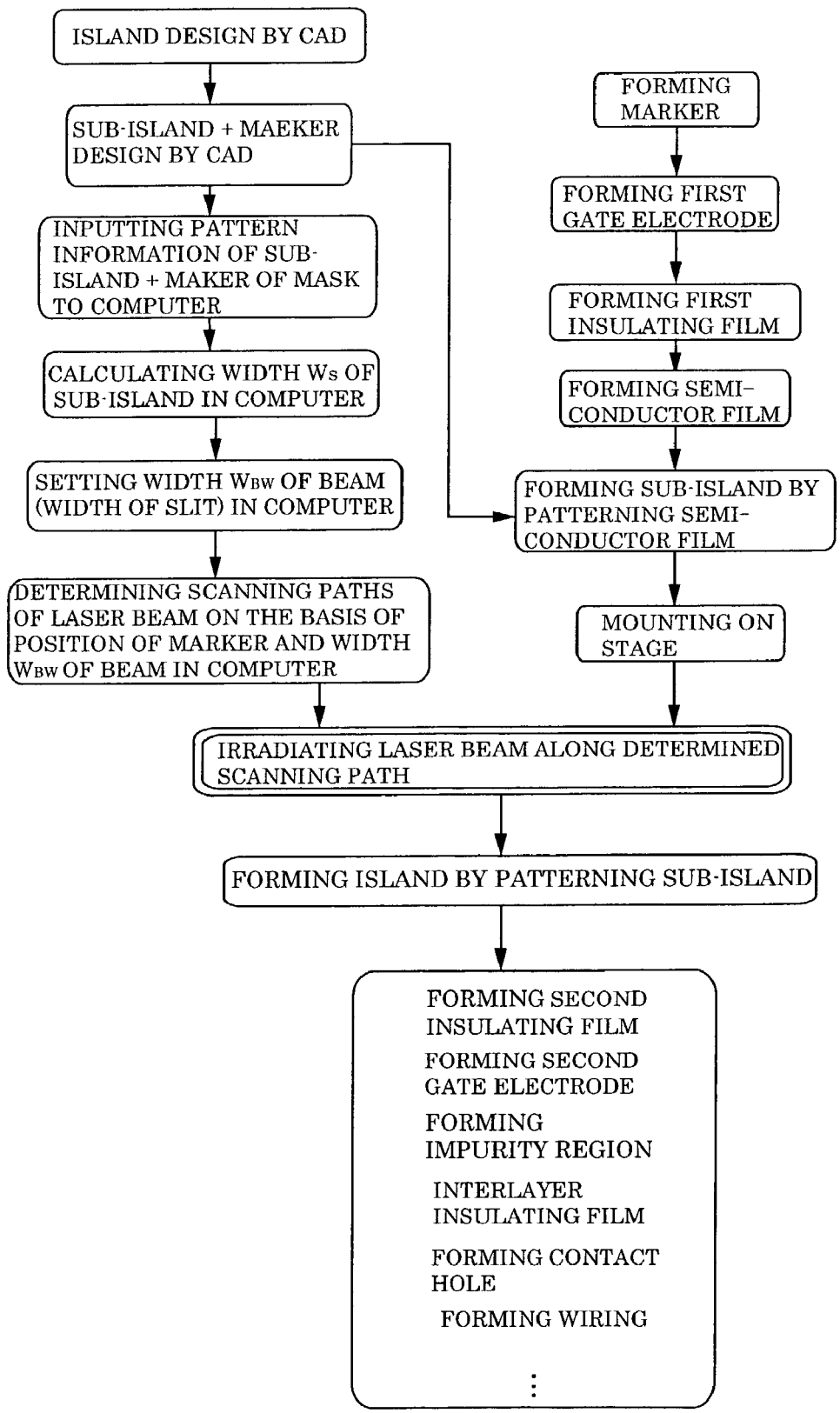
Figure 43:
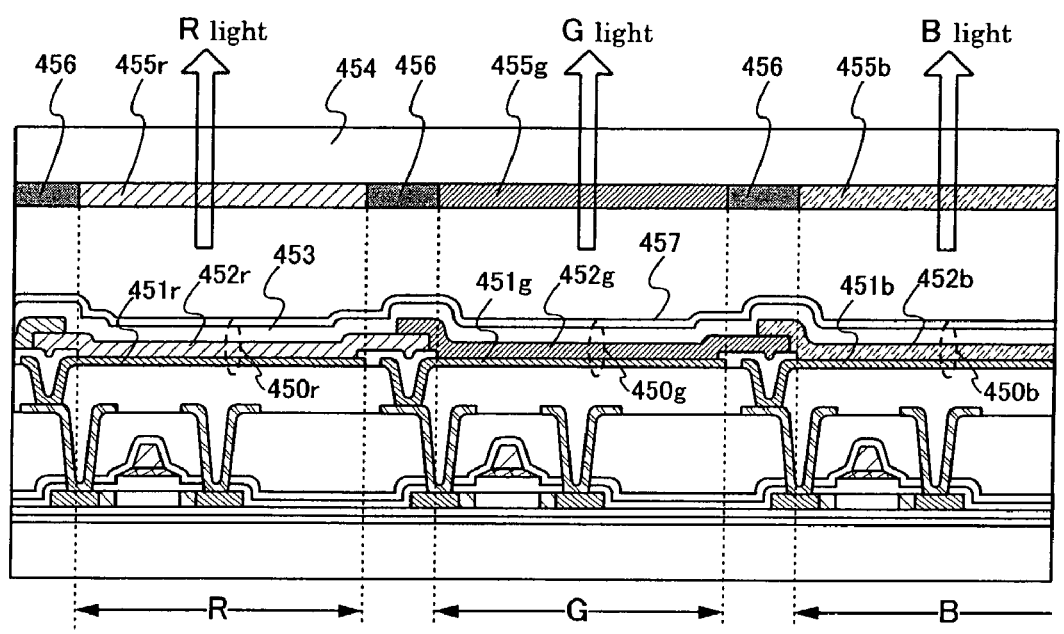
Figure 44:
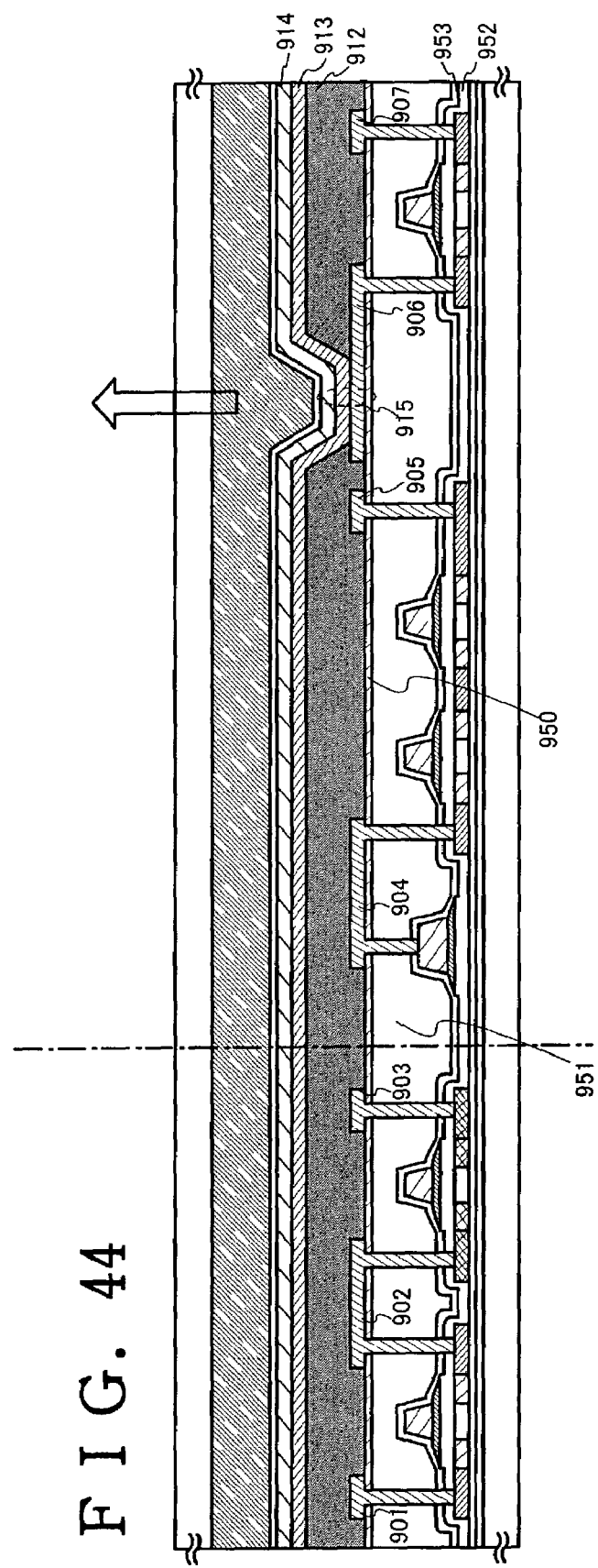
Figure 45A:
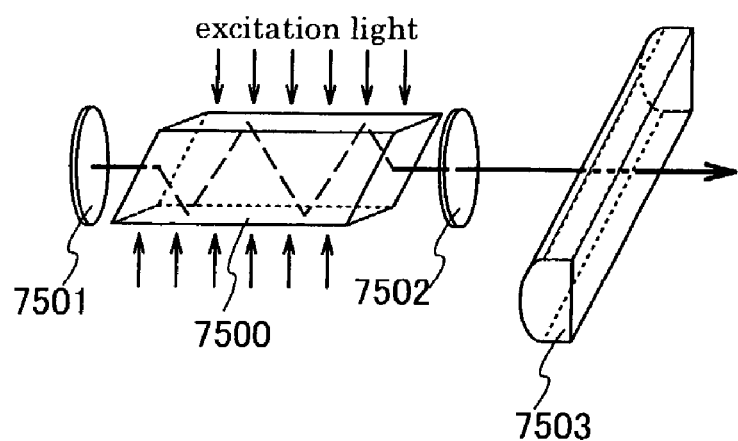
Figure 45B:
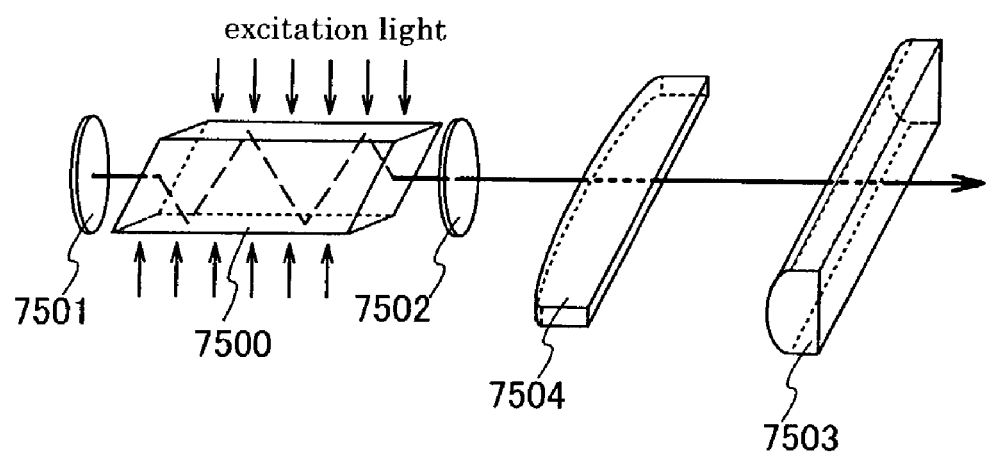

FIGS. 6A–C are views showing distribution of energy density of the laser beam;

FIGS. 7A and FIG. 7B are views showing distribution of energy density of the laser beam;

FIG. 8 is a view showing distribution of energy density of the laser beam;

FIG. 9 is a view showing physical relationship of a slit and a beam spot;

FIG. 10A and FIG. 10B are views showing physical relationship of the slit and the beam spots;

FIG. 11A and FIG. 11B are views showing physical relationship of the slit and the beam spots;

FIGS. 12A–C are views showing physical relationship of sub-islands and islands;

FIG. 13A and FIG. 13B are views showing physical relationship of the sub-islands and the islands;

FIGS. 14A–E are views showing structures of slit shaped TFTs;

FIG. 15A and FIG. 15B are views showing physical relationship of the beam spots and the sub-islands;

FIG. 16A is a view showing a position of a gettering region in the sub-island and FIG. 16B is a view showing an appearance where a laser beam is irradiated to an amorphous semiconductor layer in which a nickel inclusion layer was formed;

FIG. 17A and FIG. 17B are views showing laser beam moving directions in objects to be processed;

FIG. 18A and FIG. 18B are views showing physical relationship of laser beam irradiation portions and masks;

FIG. 19 is a view showing a production flow of the invention;

FIG. 20 is a view showing a production flow of the invention;

FIG. 21 is a view showing a production flow of the invention;

FIG. 22 is a view showing a conventional production flow;

FIGS. 23A and 23B are views showing physical relationship of laser beam irradiation portions and masks;

FIG. 24 is a view of an optical system;

FIG. 25A and FIG. 25B are views showing shapes of a sub-islands;

FIGS. 26A–D are views showing laser beam moving directions in objects to be processed;

FIG. 27 is a view showing the laser beam moving direction in the object to be processed;

FIG. 28 is a view showing distribution of energy density in a center axis direction of overlapped beam spots;

FIG. 29 is a view showing relation of distance between centers of beam spots and energy difference;

FIG. 30 is a view showing distribution of output energy in the center axis direction of the beam spot;

FIG. 31A and FIG. 31B are views in mounting drive circuits on panels;

FIGS. 32A–D are views showing manufacturing methods of semiconductor apparatuses which used a laser irradiation method of the invention;

FIGS. 33A–C are views showing the manufacturing methods of the semiconductor apparatuses which used the laser irradiation method of the invention;

FIGS. 34A–C are views showing the manufacturing methods of the semiconductor apparatuses which used the laser irradiation method of the invention;

FIG. 35 is a view showing the manufacturing method of the semiconductor apparatus which used the laser irradiation method of the invention;

FIG. 36 is a view of a liquid crystal display apparatus which was manufactured by use of the laser irradiation method of the invention;

FIG. 37A and FIG. 37B are views showing manufacturing methods of light emitting apparatuses which used the laser irradiation method of the invention;

FIG. 38 is a cross sectional view of the light emitting apparatus which used the laser irradiation method of the invention;

FIG. 39 is a cross sectional view of the light emitting apparatus which used the laser irradiation method of the invention;

FIG. 40 is a view showing a production flow of the invention;

FIG. 41 is a cross sectional view of the light emitting apparatus which used the laser irradiation method of the invention;

FIG. 42 is a view showing a production flow of the invention;

FIG. 43 is a cross sectional view of the light emitting apparatus which used the laser irradiation method of the invention;

FIG. 44 is a cross sectional view of the light emitting apparatus which used the laser irradiation method of the invention;

FIG. 45A and FIG. 45B are views of optical systems; and

Figure 46:
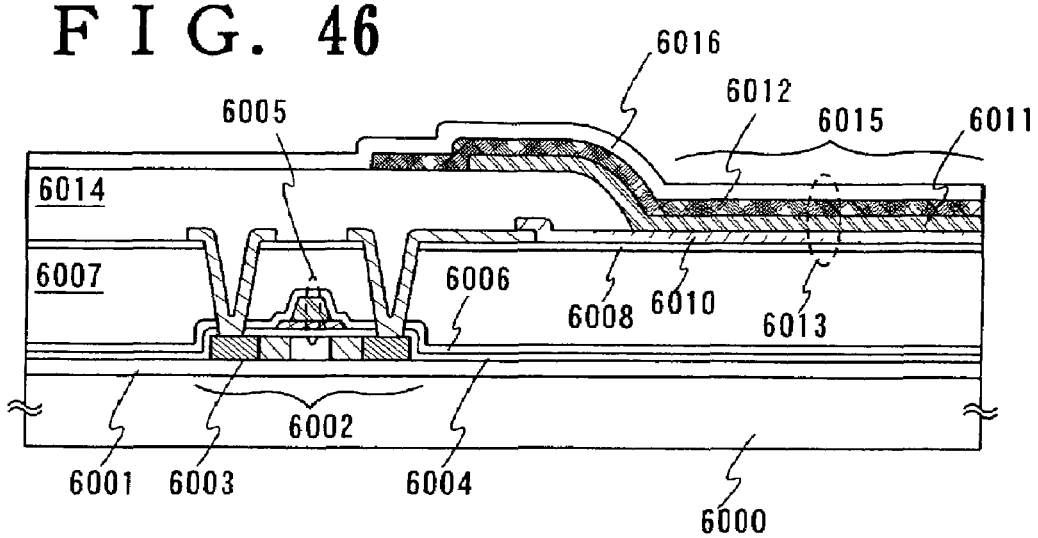

FIG. 46 is a cross sectional view of the light emitting apparatus which was manufactured by use of the laser irradiation of the invention.

DETAILED DESCRIPTION OF THE INVENTION

Hereinafter, an irradiation method of a laser beam of the invention and a manufacturing method of a semiconductor apparatus will be described by use of FIGS. 1A–D.

Figure 1A:
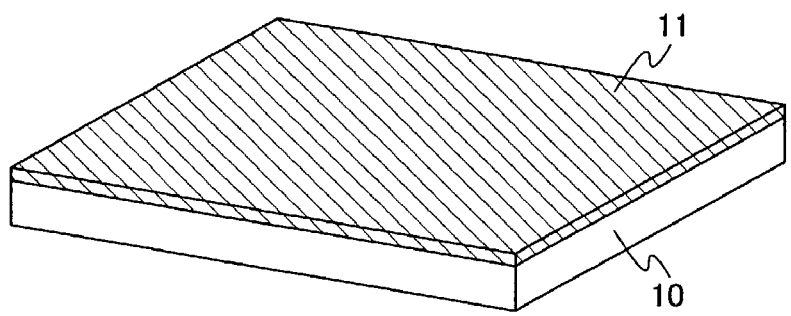

Firstly, as shown in FIG. 1A, a semiconductor film 11 is formed on a substrate 10. The substrate 10 may be of a material which is sustainable to processing temperature in a subsequent process, and for example, it is possible to use a silica substrate, a silicon substrate, a glass substrate such as barium borosilicic acid glass or alumino borosilicic acid glass, a substrate in which an insulation film is formed on a surface of a metal substrate or a stainless substrate. Also, it may be fine to use a plastic substrate having heat resistance so as to be sustainable to the processing temperature.

In addition, between the substrate 10 and the semiconductor film 11, in order to prevent an impurity such as alkali metal included in the substrate 10 from being taken inside the semiconductor film 11, a foundation film which is composed of an insulation film may be formed.

Also, the semiconductor film 11 can be formed by well-known means (spattering method, LPCVD method, plasma CVD method, etc.). In addition, the semiconductor film may be an amorphous semiconductor film, and may be a microcrystal semiconductor film and a crystalline semiconductor film.

Figure 1B:
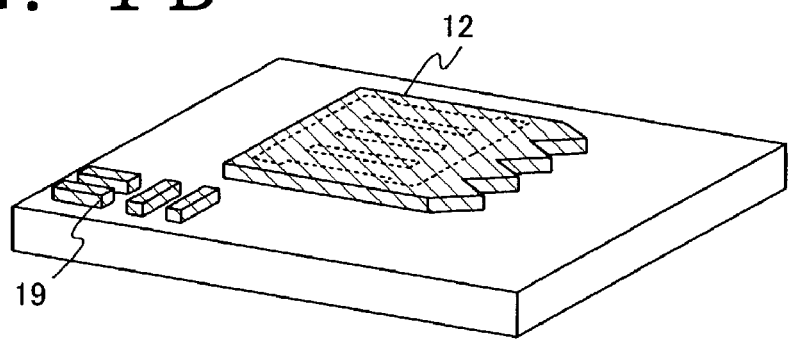

Then, by patterning the semiconductor film 11 as shown in FIG. 1B, a sub-island (before laser crystallization (before LC)) 12 and a marker 19 are formed. In addition, a shape of the marker is not limited to a shape shown in FIG. 1B.

As for the sub-island (before LC) 12, its shape when viewed from a point on the substrate may be a polygon and may have a curved line. The shape of the sub-island (before LC) 12 is not limited to the shape shown in FIG. 1B and, in the process of scanning the beam spot in a fixed direction, may have such a shape that there exist a plurality of contact points to the beam spot. Also, when the sub-island (before LC) 12 has edge angles at the contact points, inner angles of the sub-island at the contact points have to be less than 180 degree and it is desirable that they are 60 degree and above, and less than 120 degree. Also, when the sub-island (before LC) 12 draws a curved line at the contact points, the curved line is needed to be a convex type.

Figure 1C:
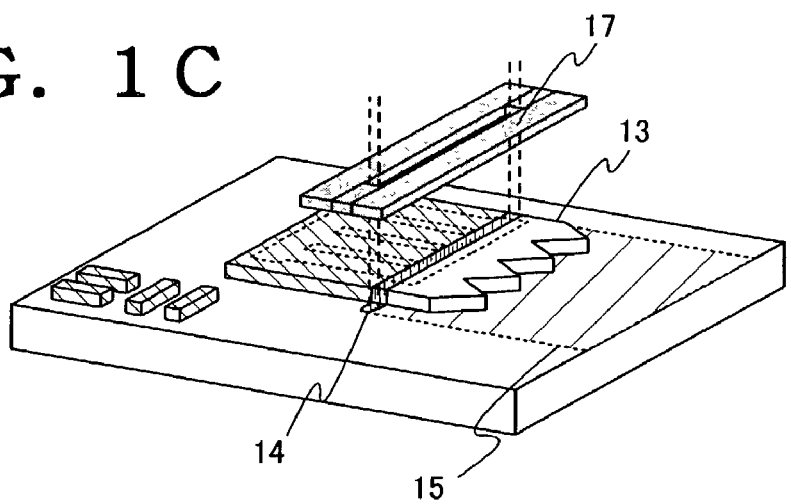

Then, as shown in FIG. 1C, the laser beam is irradiated to the sub-island (before LC) 12, and a sub-island (after LC) 13 in which crystallinity was heightened. In FIG. 1, a portion where energy density of the beam spot is low or is not constant is shielded by use of a slit 17 but, in the invention, it is not necessary to use the slit necessarily. The slit 17 is capable of shielding the laser beam and further, it is desirable to form it by a material which is not transformed or damaged by the laser beam. Then, as for the slit 17, width of the slit is variable, and it is possible to change width of the beam spot according to the width of the slit.

In addition, it is judged that the energy density is low in case that values necessary to obtain a desired crystal are not satisfied. In addition, judgment of whether it is the desired crystal or not can be judged by an engineer at pleasure. Thus, if crystallinity which is desired by an engineer is not obtained, it is possible to judge that the energy density is low.

The energy density of the laser beam became low in the vicinity of an edge of the beam spot which was obtained through the slit, and therefore, a crystal grain in the vicinity of the edge is small, and an portion (ridge) which is projected along grain boundary of the crystal emerges. Therefor, it is arranged that an edge 15 of a track of the beam spot 14 of the laser beam does not overlap with the sub-island (before LC) 12 or an island which is formed after that.

In addition, the scanning direction of the laser beam is intentionally determined so that the beam spot and the sub-island are contacted at a plurality of points in the process of scanning the laser beam. When the irradiation of the laser beam is initiated from the contact point, a crystal having an orientation of a (100) surface is initiated to grow preferentially from the vicinity including the contact point, and therefore, when the irradiation of the laser beam to the sub-island is finished, it is possible to heighten an orientation rate of the (100) surface of the whole sub-island.

In the invention, well-known lasers can be used. As for the laser, it is possible to use a gas laser of continuous oscillation or a solid state laser of continuous oscillation. As the gas laser, there are cited an excimer laser, an Ar laser, a Kr laser etc., and as the solid state laser, there are a YAG laser, a $YVO_4$ laser, a YLF laser, a $YAlO_3$ laser, a glass laser, a ruby laser, an alexandrite laser, a Ti:sapphire laser, a $Y_2O_3$ laser and so on. As the solid state laser, applied is a laser which used a crystal such as YAG, $YVO_4$, YLF, $YAlO_3$ etc. in which Cr, Nd, Er, Ho, Ce, Co, Ti, Yb or Tm is doped. A fundamental wave of the laser differs according to a material to be doped, and it is possible to obtain a laser beam having the fundamental wave of about 1 μm. A higher harmonic wave can be obtained by use of a non-linear optical element.

Also, further, it is possible to use a ultraviolet laser beam which is obtained by a non-linear optical device after an infrared laser beam emitted from the solid state laser is converted to a green laser by another non-linear optical device.

In addition, it may be fine not to irradiate the laser beam to the marker 19.

Figure 1D:
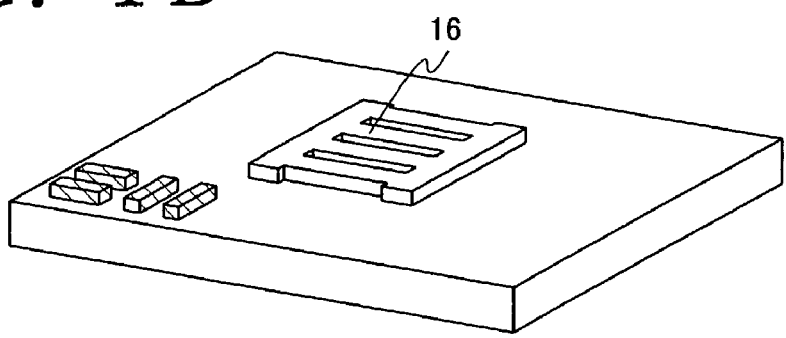

Then, as shown in FIG. 1D, by patterning the sub-island (after LC) 13, an island 16 is formed. It is desirable that the island 16, circumventing the vicinity of the edge of the sub-island, uses a portion where crystallinity at a center part is relatively excellent. Also, as for the sub-island (after LC) 13, since the closer to an extension of the scanning path of the laser beam from each contact point, the higher the crystallinity becomes, in case that the island is used as an active layer of a TFT, it is desirable to do the layout so that a portion which becomes a channel forming region of the island includes a portion whose crystallinity is high. The island 16 which is made by the above-described process is excellent as for its crystallinity, and further, a orientation rate of a (100) surface is heightened.

In addition, on the occasion of patterning, the marker 19 is saved for alignment of masks which are used in a subsequent processes.

Figure 2A:
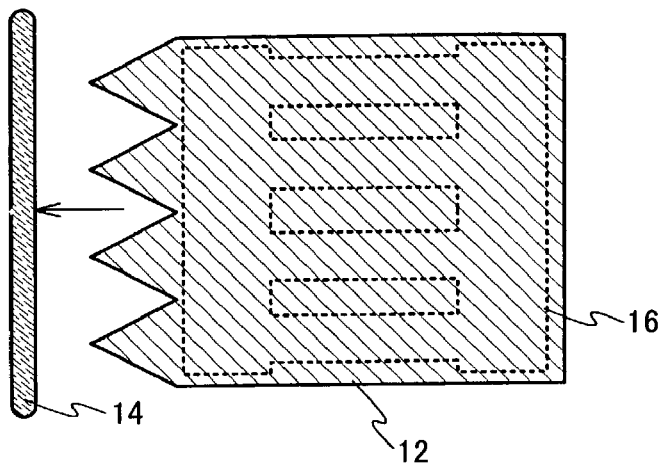

Then, a relation of shapes of the sub-island and the island and the scanning direction of the laser beam will be described. In FIG. 2A, a top plan view of the sub-island 12 shown in FIG. 1B is shown. In addition, inside the sub-island (before LC) 12, a portion 16 which becomes the island is shown by a broken line. Reference numeral 14 designates a beam spot, and FIG. 2A shows a situation before laser irradiation.

From the situation of FIG. 2A, as time goes on, the beam spot 14 is approaching to the sub-island (before LC) 12. In addition, a position of the beam spot is moved by scanning the substrate side.

Figure 2B:
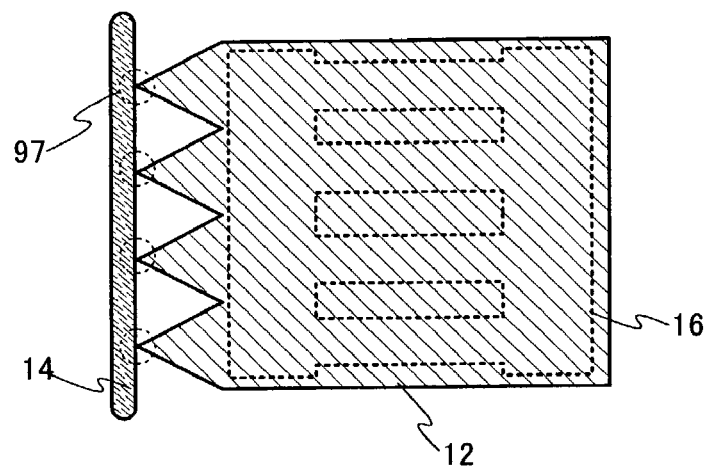
Figure 2C:
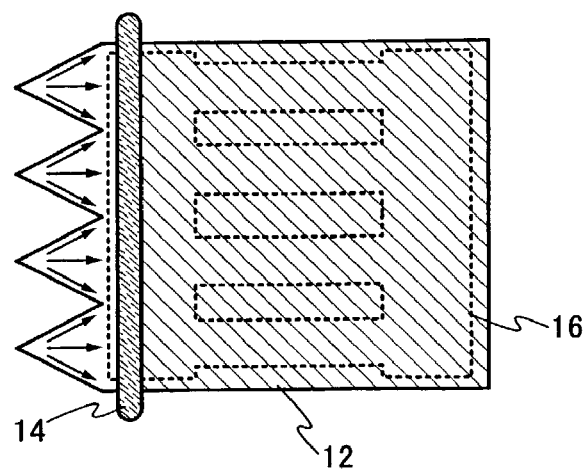

Then, as shown in FIG. 2B, when the beam spot has reached to the sub-island (before LC) 12, the beam spot 14 and the sub-island (before LC) 12 are contacted at a plurality of points. Thus, the sub-island is crystallized from the vicinity 97 of these plural points, and as shown in FIG. 2C, the beam spot 14 moves and crystallization proceeds in a direction shown by an arrow. Since this crystallization proceeds on the basis of a seed crystal of (100) which was formed initially, the orientation rate of the (100) surface is heightened.

Figure 3A:
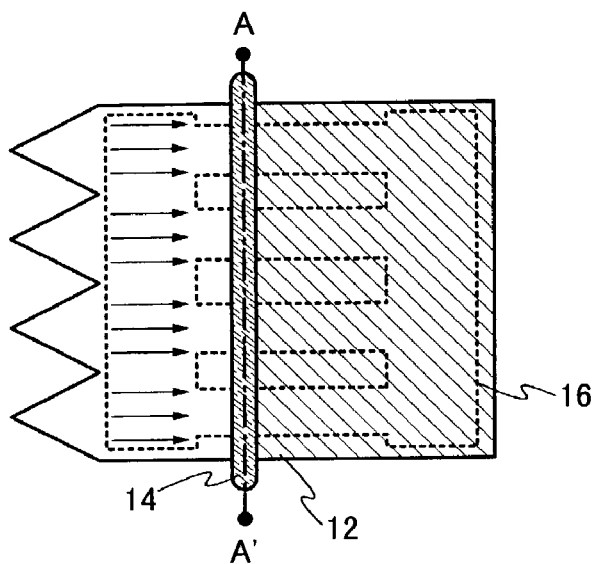
Figure 3B:
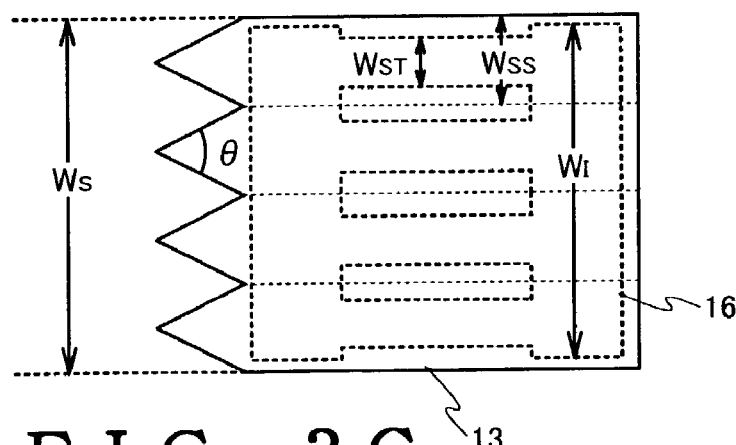

Then, as shown in FIG. 3A, when the movement of the beam spot 14 proceeds, growth of a crystal proceeds, and in the end, as shown in FIG. 3B, the scanning of the beam spot 14 is finished, and the sub-island 13 whose crystallinity was heightened is formed.

In addition, it is necessary that an inner angle θ at a contact point of the sub-island 12 or 13 is larger than 0 degree and less than 180 degree, and it is desirable that it is 60 degree and more and less than 120 degree.

Figure 3C:
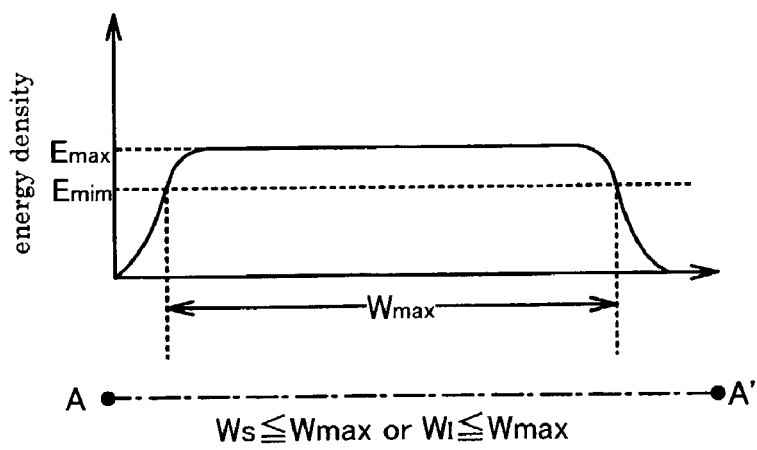

Also, it is necessary to irradiate the laser beam to the whole sub-island 12, more preferably, the whole island 16 so that portions where the energy density of the beam spot is uniform overlaps. FIG. 3C shows distribution of the energy density of the beam spot in FIG. 3A in a center axis direction A–A'. In the invention, it is necessary to overlap an area where the energy density of the beam spot becomes uniform and the sub-island or the island. However, in fact, a value of the energy density differs according to a position inside the beam spot, strictly speaking. Consequently, even if it is not uniform in the strict sense, it may be fine to set an area that a engineer judges that it is uniform.

For example, the area which is judged to be uniform is set between a maximum value $E_{max}$ of the energy density in the center axis direction and a value $E_{min}$ which is judged to be smaller than $E_{max}$ and further to be able to obtain a uniform crystallinity. In this case, when width of the beam spot in the center axis direction whose energy density is $E_{min}$ and above is assumed to be $W_{max}$, and width in a perpendicular direction to the scanning direction of the sub-island is assumed to be $W_s$, in order to irradiate the laser beam with uniform energy density to the whole sub-island, it is necessary to satisfy $W_s \leq W_{max}$. Also, when a maximum value of width of the island in the perpendicular direction to the scanning direction is assumed to be $W_I$, in order to irradiate the laser beam with uniform energy density to the whole island, it is necessary to satisfy $W_I \leq W_{max}$.

Also, as for the island 16 shown in FIGS. 2A–C and 3A–B, a portion which becomes a channel forming region is divided into four pieces, and an area whose crystallinity is heightened on an extension from respective plural contact points is included.

When channel width between respective channel forming regions is assumed to be $W_{ST}$ and distance of points where are most depressed between respective contact points is assumed to be all the same width $W_{SS}$, it is possible for an engineer to set a ratio of $W_{ST}$ and $W_{SS}$ at pleasure but, more preferably, it is desirable to make $^3W_{ST} \cong W_{SS}$.

In addition, shapes of the sub-island and the island are not limited to the shapes shown in FIGS. 2A–C and 3A–B.

Also, in case that the island is used as the active layer of TFT, it is desirable that the scanning direction of the laser beam is held to be in parallel to a carrier moving direction in the channel forming region.

In addition, it may be fine that a track of the beam spot 14 does not necessarily cover the sub-island 12 completely but that it covers the island 16 completely at the very least. However, by scanning the laser beam so as to cover the sub-island completely, it is possible to prevent a crystal from growing by use of an area to which the laser beam is not irradiated as a seed crystal, and to more heighten the orientation rate of the (100) surface.

Then, a shape of the beam spot which is synthesized by overlapping a plurality of beam spots will be described.

FIG. 6A shows one example of a shape of the beam spot of the laser beams oscillated respectively from a plurality of laser oscillation apparatuses in an object to be processed in case that it does not pass through the slit. The beam spot shown in FIG. 6A has an elliptical shape. In addition, in the invention, the shape of the beam spot of the laser beam oscillated from the laser oscillation apparatus is not limited to the ellipse. The shape of the beam spot differs according to kinds of lasers, and also, it is possible to form by an optical system. Also, a shape of a laser beam emitted from a YAG laser becomes circular if a rod shape is a cylindrical shape and becomes rectangular if it is a slab type. By further forming such laser beam by the optical system, it is possible to form a laser beam of desired size.

FIG. 6B shows distribution of the energy density of the laser beam of the beam spot shown in FIG. 6A in its long axis Y direction. The beam spot shown in FIG. 6A corresponds to an area which satisfies the energy density of ½ of a peak value of the energy density in FIG. 6B. The distribution of the energy density of the laser beam whose beam spot is of an elliptical shape becomes high as it is headed to a center O of the ellipse. As just described, as for the beam spot shown in FIG. 6A, its energy density in the center axis direction follows Gaussian distribution, and an area which can be judged that the energy density is uniform becomes narrower.

Then, a shape of the beam spot, when the laser beams having the beam spots shown in FIG. 6A were synthesized, is shown in FIG. 6C. In addition, in FIG. 6C, described was a case that, by overlapping beam spots of four laser beams, one linear shaped beam spot was formed but the number of beam spots to be overlapped is not limited to this.

As shown in FIG. 6C, by matching long axes of the beam spots of each laser beam and further, by overlapping parts of them, one beam spot 18 is formed. In addition, hereinafter, a direct line which can be obtained by connecting centers O of each ellipse is assumed to be a center axis of the beam spot 18.

FIG. 6D shows distribution of the energy density of the laser beam of the beam spot after the synthesis shown in FIG. 6B in the center axis y direction. In addition, the beam spot shown in FIG. 6C corresponds to an area which satisfies the energy density of $1/e^2$ of the peak value of the energy density in FIG. 6B. In a portion where respective beam spots before the synthesis are overlapped, the energy density is added. For example, when the energy densities E1 and E2 of the overlapped beams are added, it becomes approximately equal to the peak value E3 of the energy density of the beam, and the energy density is flattened between the centers O of respective ellipses.

In addition, it is ideal that when addition of E1 and E2 becomes equal to E3 but, in reality, it does not become the equal value necessarily. It is possible for an engineer to set a permissible zone of declination of the added value of E1 and E2 and the value of E3 at pleasure.

When the beam spot is used independently, since distribution of the energy density follows Gaussian distribution, it is difficult to irradiate the laser beam of uniform energy density to the whole sub-island or the whole island. However, as shown in FIG. 6D, by compensating portions where the energy density is low one another by overlapping the plural laser beams, an area where the energy density is uniform is more expanded than in case that the plural laser beams are not overlapped and used independently, and it is possible to heighten the crystallinity of the semiconductor film more efficiently.

In addition, distribution of the energy density at B–B' and C–C' of FIG. 6C obtained by calculation is shown in FIG. 7. In addition, FIG. 7 is formed on the basis of an area of the beam spot before the synthesis which satisfies the energy density of $1/e^2$ of the peak value. When it is assumed that length in a short axis direction of the beam spot before the synthesis is 37 μm and length in a long axis direction is 410 μm and distance between centers is 192 μm, the energy density in B–B' and C–C' has distribution as shown in FIG. 7A and FIG. 7B respectively. Although B–B' is slightly smaller than C–C', they can be assumed to be approximately the same size, and it is possible to express that a shape of the synthesized beam spot in the area which satisfies the energy density of $1/e^2$ of the peak value of the beam spot before the synthesis is of a linear shape.

FIG. 8 is a view showing energy distribution of the synthesized beam spot. An area designated by reference numeral 50 is an area where the energy density is uniform, and an area designated by reference numeral 51 is an area where the energy density is low. In FIG. 8, it is assumed that length in a center axis direction of the beam spot is $W_{TBW}$ and length in a center axis direction in the area 50 where the energy density is uniform is $W_{max}$. The bigger $W_{TBW}$ becomes as compared to $W_{max}$, the bigger a ratio of an area 51 where energy density is not uniform which can not be used for crystallization of the sub-island to an area 50 where energy density is uniform which can be used for crystallization becomes. When only the area 51 where the energy density is not uniform overlaps with the sub-island, crystallinity of the sub-island is considerably wrecked, which is not desirable. Consequently, if it is arranged such that there is no case that only the area 51 overlaps with the sub-island, there occurs a necessity to determine the layout of the scanning path and the sub-island. Then, when the ratio of the area 51 to the area 50 becomes high, its restriction is more enlarged. Consequently, preventing the area 51 where the energy density is not uniform from being irradiated to the sub-island by use of the slit is useful to lessen the restriction which occurs on the occasion of layout of the scanning path and the sub-island.

By use of FIG. 9, physical relationship of the beam spot and the slit will be described. In addition, FIG. 9 shows an example for shielding the area where energy density of the synthesized beam spot is not uniform.

As for a slit 77, width of the slit is variable, and its width can be controlled by a computer. In FIG. 9, 78 designates a shape of the beam spot and 77 designates the slit.

Then, FIG. 9 shows distribution of energy density of the beam spot shown in FIG. 9 in the center axis direction y and an area where the energy density is low is cut by the slit 77.

FIG. 10A shows physical relationship of the beam spot 55 which was formed through the slit, the sub-island 12 and the island 16. When it is assumed that length in the center axis direction of the beam spot 55 is $W_{BW}$, it is necessary to shorten $W_{BW}$ than the length $W_{max}$ in the center axis direction of the area where the energy density is uniform in the beam spot before shielded by the slit.

FIG. 10B shows a cross sectional view in A–A' of FIG. 10A and relation to the beam spot. The laser beam which is irradiated to the substrate through the slit 77 is narrowed from the width in the center axis direction $W_{max}$ to $W_{BW}$ by shielding of the slit. Then, it is ideal that the beam spot of the laser beam in the sub-island becomes the same size as $W_{BW}$. However, in reality, since the slit 77 and the sub-island 16 are separated, as for the laser beam, width in the long axis direction of the beam spot in the sub-island 16 becomes $W_{BW}'$ and satisfies $W_{BW}'<W_{BW}$. Consequently, it is desirable that the width of the slit is set in consideration of diffraction.

In case that the laser beam is intended to be irradiated to the whole sub-island, when the diffraction is not considered, it may be fine if $W_{BW}'>W_s$ is satisfied but when the diffraction is considered, it may be fine if $W_{BW}'>W_S$ is satisfied. Also, when the laser beam is intended to be irradiated to only the sub-island at necessary minimum, it may be fine if $W_{BW}>W_I$ is satisfied but when the diffraction is considered, it may be fine if $W_{BW}'>W_I$ is satisfied. In addition, $W_s$ means length in a perpendicular direction to the moving direction of the beam spot on the sub-island 16 and $W_I$ means length in length in a perpendicular direction to the moving direction of the beam spot on the island 12.

By use of the slit, it becomes easy to avoid the overlapping of only the area where the energy density is not uniform and the sub-island. Consequently, it is possible to lessen the restriction in the layout of the scanning path of the laser beam and the sub-island and the island.

Also, since, without stopping an output of the laser oscillation apparatus, as the energy density is maintained to be constant, width of the beam spot can be changed, it is possible to avoid the overlapping of an edge of the laser beam and the island or its channel forming region. Also, by irradiating the laser beam to a unnecessary portion, it is possible to avoid a case that damages are applied to the substrate.

In addition, in FIG. 10, described was a case that the center axis direction of the beam spot and the scanning direction are maintained to be perpendicular but the center axis of the beam spot and the scanning direction may not be perpendicular necessarily. For example, a sharp angle $\theta_A$ formed between the center axis of the beam spot and the scanning direction is set to become 45°±35°, and more preferably, it may be set to become 45°.

In case that the center axis of the beam spot and the scanning direction are perpendicular, processing efficiency of the substrate is most heightened. On the other hand, in case that scanning is carried out so that the center axis of the beam spot and the scanning direction becomes 45°±35°, and preferably, becomes a value which is more closer to 45°, as compared to a case that scanning is carried out so that the scanning direction and the center axis of the beam spot becomes perpendicular, it is possible to intentionally increase the number of crystal grains which exist in the active layer and to reduce fluctuation of characteristics due to a direction of a crystal and a crystal grain. Also, as compared to a case that scanning is carried out so that the scanning direction and the center axis of the beam spot become perpendicular, even when scanning speed is the same, it is possible to heighten irradiation time of the laser beam per the substrate.

Then, by use of FIG. 11A and FIG. 11B, physical relation ship of the slit and the beam spot in case that the center axis of the beam spot was maintained to be 45° to the scanning direction will be described. Reference numeral 130 designates a beam spot after the synthesis and reference numeral 132 designates a slit. The slit 132 doe not overlap with the beam spot 130. An arrow designates a scanning direction and an angle θ between it and the center axis of the beam spot 130 is maintained to be 45°.

FIG. 11B shows an appearance of the beam spot 131 which is partially shielded by the slit 132 and narrowed in width. In the invention, the slit 132 controls width Q of the beam spot in a perpendicular direction to the scanning direction, and it is arranged that the irradiation of the laser beam is carried out uniformly.

Figure 5:
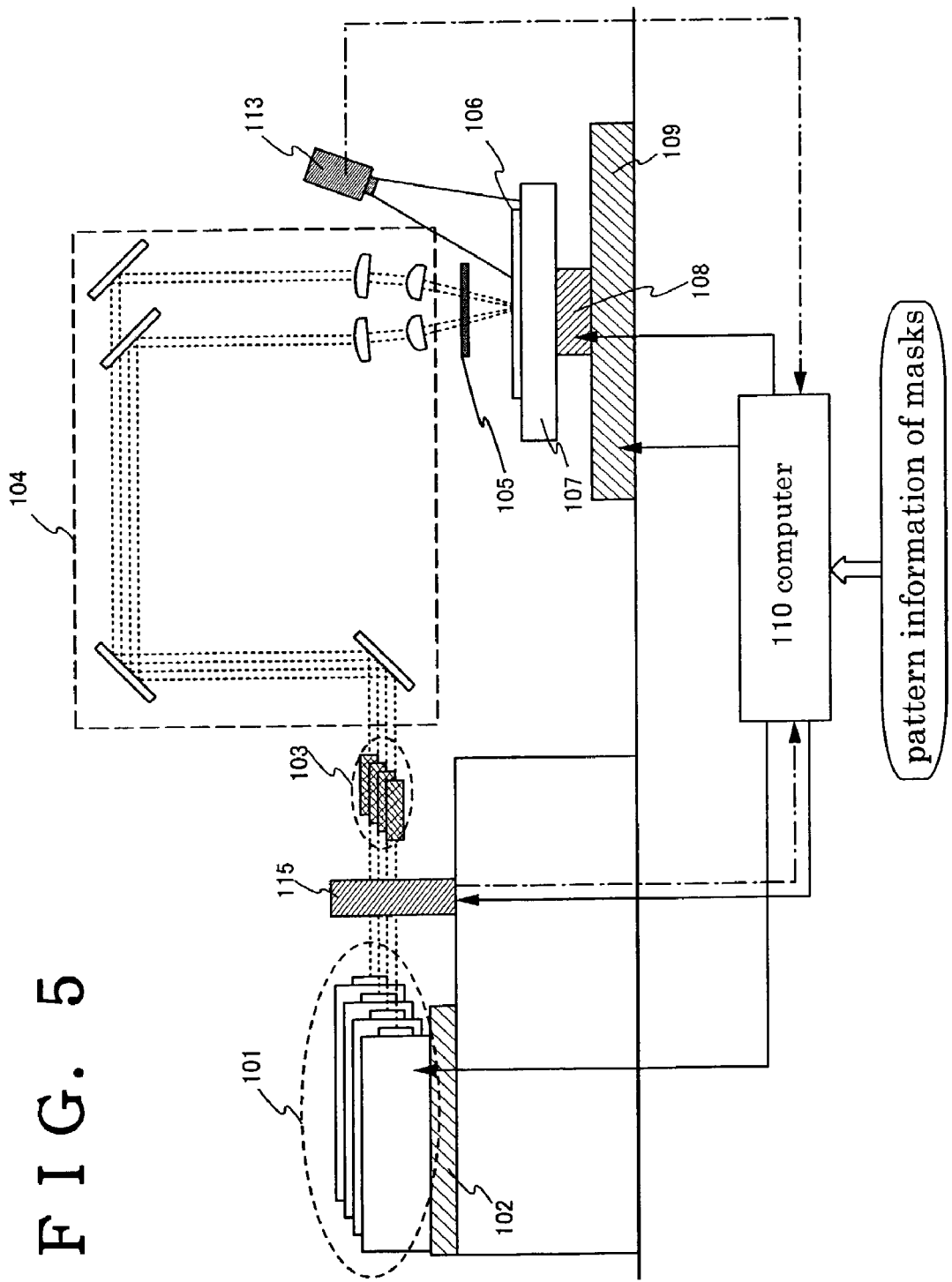
FIG. 5 is a view of the laser irradiation apparatus.

Then, a structure of a laser irradiation apparatus which is used in the invention will be described by use of FIG. 5. Reference numeral 101 designates a laser oscillation apparatus. In FIG. 5, four laser oscillation apparatuses are used but a laser oscillation apparatus which the laser irradiation apparatus has is not limited to this number.

In addition, the laser oscillation apparatus 101 may be designed so as to maintain its temperature constant by use of a chiller 102. The chiller 102 is not disposed necessarily but, by maintaining temperature of the laser oscillation apparatus 101 constant, it is possible to suppress fluctuation of energy of the laser beam to be outputted due to the temperature.

Also, reference numeral 104 designate an optical system, and by changing a light path which was outputted from the laser oscillation apparatus 101 and by processing a shape of its beam spot, it is possible to condense the light beam. Further, in the laser irradiation apparatus of FIG. 5, by partially overlapping the beam spots of the laser beams which were outputted from a plurality of the laser oscillation apparatuses 101 one another, it is possible to synthesize them.

In addition, an AO modulator 103 for changing a traveling direction of the laser beam for extreme short length of time may be disposed in a light path between a substrate 106 as an object to be processed and the laser oscillation apparatus 101. Also, instead of the AO modulator 103, an attenuator (light volume adjustment filter) may be disposed so that the energy density of the laser beam is adjusted.

Also, in the light path between the substrate 106 as the object to be processed and the laser oscillation apparatus 101, means for measuring the energy density of the laser beam which was outputted from the laser oscillation apparatus 101 (energy density measurement means) 115 may be disposed so that variation per hour of the energy density measured is monitored by a computer 110. In this case, so as to compensate attenuation of the energy density of the laser beam, the output from the laser oscillation apparatus 110 may be heightened.

The synthesized beam spot is irradiated to the substrate 106 as the object to be processed through a slit 105. The slit can shield a part or a whole of the laser beam and further, it is desirable to form it by a material which is not transformed or damaged by the laser beam. Then, slit width of the slit 105 may be made to be variable, and width of the beam spot may be made to be changed.

In addition, in case that it is not passed through the slit 105, a shape of the beam spot of the laser beam which is oscillated from the laser oscillation apparatus 101 in the substrate 106 differs according to kinds of lasers and also, can be formed by the optical system.

The substrate 106 is not mounted on a stage 107. In FIG. 5, position control means 108, 109 correspond to means for controlling a position of the beam spot in the object to be processed, and a position of the stage 107 is controlled by the position control means 108, 109.

In FIG. 5, the position control means 108 controls a position of the stage 107 in a X direction, and the position control means 109 carries out a position control of the stage 107 in a Y direction.

Also, the laser irradiation apparatus of FIG. 5 has a computer 110 which had at the same time a central processing apparatus and storage means such as a memory etc. The computer 110 controls oscillation of the laser oscillation apparatus 101 and further, so as for the beam spot of the laser beam to cover an area which is defined according to pattern information of masks, it controls the position control means 108, 109 and it can move the substrate to a predetermined position.

Further, in the invention, by the computer 110, it is possible to control width of the slit 105 and change width of the beam spot according to the pattern information of masks.

Further, in the laser irradiation apparatus, means for adjusting temperature of the substrate 106 as the object to be processed, to be more precise, means for heating the substrate 106 on the stage 107 may be disposed. Also, since the laser beam is light which has high directivity and energy density, it may be fine to prevent reflected light from being irradiated to an irrelevant portion by disposing a damper. It is desirable that the damper has a characteristic for absorbing the reflected light, and it may be fine to prevent temperature of a partition wall from being increased due to absorption of the reflected light, by circulating cooling water in the damper.

In addition, in case that the marker is formed by the laser, a laser oscillation apparatus for the marker may be disposed. In this case, oscillation of the laser oscillation apparatus for the marker may be controlled by the computer 110. Further, in case that the laser oscillation apparatus for the marker is disposed, an optical system for condensing the laser beam which was outputted from the laser oscillation apparatus for the marker is disposed separately. In addition, as the laser used on the occasion of forming the marker, typically, a YAG laser, a $CO_2$ laser etc. are cited and it is of course possible to form it by use of other lasers than these.

Also, for alignment by use of the marker, one unit of a CCD camera 113 may be disposed and, depending on the circumstances, several units thereof may be disposed. In addition, the CCD camera means a camera which used CCD (Charge Coupled Device) as an image pickup device.

In addition, the alignment may be carried out without disposing the marker by recognizing the pattern of the sub-island by the CCD camera 113. In this case, by bringing pattern information of the sub-island by masks which were inputted to the computer 110 into check to pattern information of the actual sub-island which was collected by the CCD camera 113, positional information of the substrate can be grasped. In this case, there is no necessity to dispose the marker separately.

Also, the laser beam which was entered to the substrate 106 is reflected by a surface of the substrate and returns to the same light path as one when entered, becomes a so-called returned light and the returned light gives harmful effect such as variations of the output and frequency of the laser, break-down of a rod and so on. Therefor, in order to remove the returned light and stabilize the oscillation of the laser, an isolator may be disposed.

Figure 4:
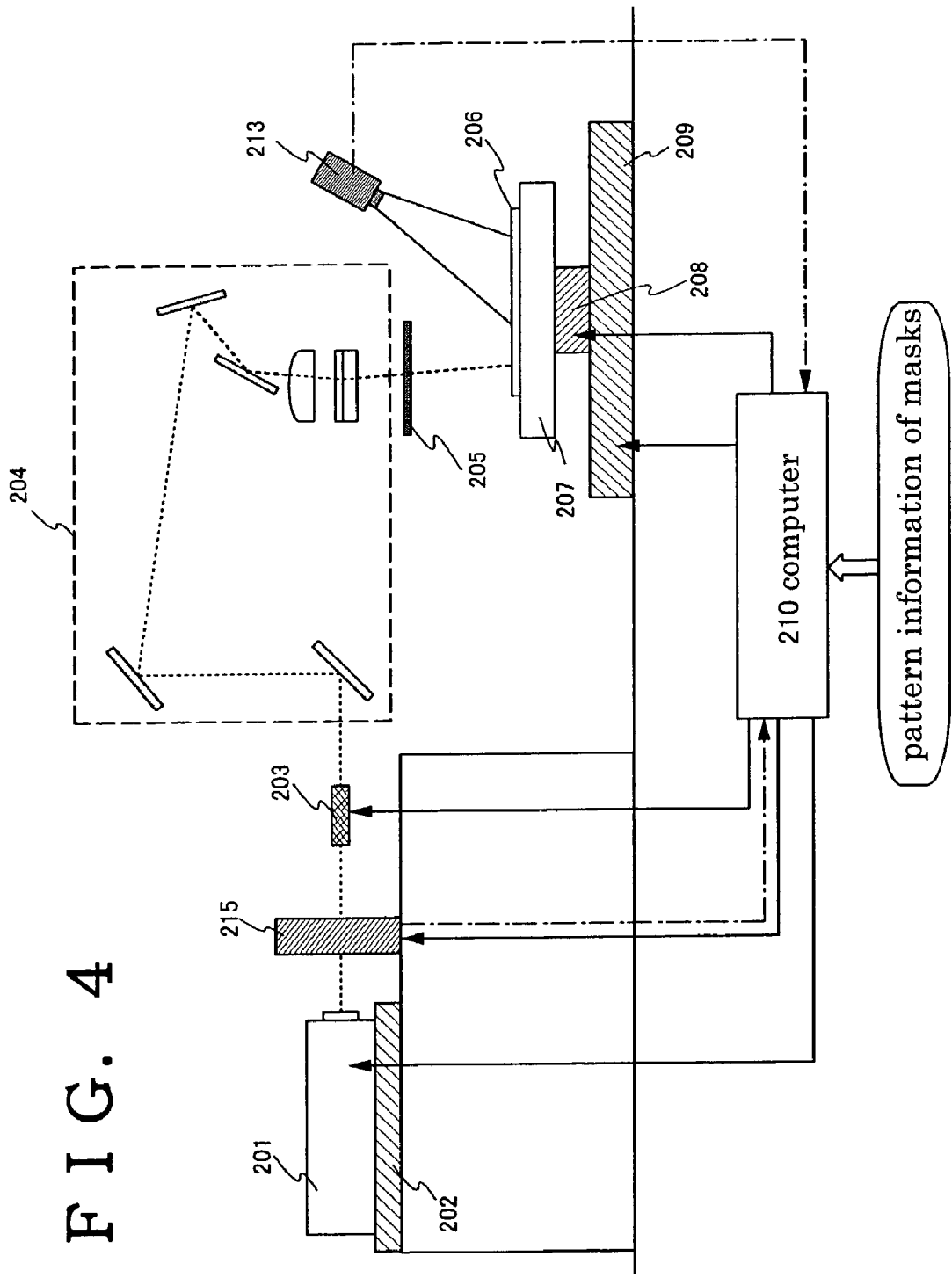
FIG. 4 is a view of a laser irradiation apparatus.

In addition, in FIG. 5, the structure of the laser irradiation apparatus which has a plurality of the laser oscillation apparatuses was described but the laser oscillation apparatus may be one unit. FIG. 4 shows a structure of a laser irradiation apparatus which has one laser oscillation apparatus. In FIG. 4, reference numeral 201 designates a laser oscillation apparatus, and reference numeral 202 designates a chiller. Also, reference numeral 215 designates an energy density measurement apparatus, and 203 designates an AO modulator, and 204 designates an optical system, and reference numeral 205 designates a slit, and reference numeral 213 designates a CCD camera. A substrate 206 is mounted on a stage 207, and a position of the stage 207 is controlled by X direction position control means 208 and Y direction position control means 209. Then, in the same manner as one shown in FIG. 5, operations of respective means that the laser irradiation apparatus has are controlled by a computer 210, and a difference from FIG. 5 is that there is one laser oscillation apparatus. Also, the optical system 204 is different from a case of FIG. 4, and it may have a function for condensing one laser beam.

Then, a shape of the sub-island will be described. In FIG. 12A, reference numeral 60 designates a sub-island and reference numeral 61 shows a shape of the island which is obtained after patterning. The island 61 contacts to the beam spot at contact points 63a, 63b, and 63c. Then, the island 61 is laid out so that portions which become channel forming regions of the island 61 overlap, on an extension of scanning paths 64a, 64b, and 64c from the contact points 63a, 63b, and 63c respectively.

In FIG. 12B, islands 61a, 61b, and 61c each of which have one channel forming region respectively are included in the sub-island 60. Then, the islands 61a, 61b, and 61c are laid out so that portions which become channel forming regions of the islands 61a, 61b, and 61c overlap, on an extension of scanning paths 64a, 64b, and 64c from the contact points 63a, 63b, and 63c respectively.

In FIG. 12C, islands 61a, 61b, 61c, 61d, 61e, and 61f each of which have one channel forming region respectively are included in the sub-island 60. Then, the islands 61a, 61b, 61c, 61d, 61e, and 61f are laid out so that portions which become channel forming regions of the islands 61a, 61b, 61c, 61d, 61e, and 61f overlap, on an extension of scanning paths 64a, 64b, and 64c from the contact points 63a, 63b, and 63c respectively.

In FIG. 13A, the island 61 is included in the sub-island 60. The island 61 contacts to the beam spot at the contact points 63a, 63b, and 63c. Then, the island 61 is laid out so that portions which become channel forming regions of the island 61 overlap, on an extension of scanning paths 64a, 64b, and 64c from the contact points 63a, 63b, and 63c respectively. Then, the island 61 is laid out in a grid shape.

In FIG. 13B, the islands 61a and 61b are included in the sub-island 60. The islands 61a and 61b contact to the beam spot at the contact points 63a, 63b, and 63c. Then, the islands 61a and 61b are laid out so that portions which become channel forming regions of the islands 61a and 61b overlap, on an extension of scanning paths 64a, 64b, and 64c from the contact points 63a, 63b, and 63c respectively. Then, the islands 61a and 61b are laid out in a grid shape.

Then, by use of FIG. 17A and FIG. 17B, the scanning direction of the laser beam in the substrate 500 in which the sub-island was formed for fabricating a semiconductor apparatus of an active matrix type will be described. In FIG. 17A and FIG. 17B, a broken line 501 corresponds to a pixel part, and a broken line 502 corresponds to a signal line drive circuit, and a broken line 503 corresponds to a portion in which a scanning line drive circuit is formed.

FIG. 17A and FIG. 17B show an example where the laser beam is scanned to the substrate 500 only once, and an arrow of a solid line shows a relative scanning direction of the laser beam. In addition, movement of the beam spot may be carried out by moving the substrate 500 and may be carried out by use of an optical system. In FIG. 17A, the laser beam is scanned in the same direction as the scanning line, and in FIG. 17B, the laser beam is scanned in the same direction as the signal line.

In addition, it is possible to change width of the beams spot at pleasure according to size of the sub-island or the island. For example, a TFT of a drive circuit in which it is desired to flow relatively much electric currents has a big channel width, and consequently, there is such a trend that size of the island is big as compared to the pixel part. FIG. 18A and FIG. 18B show a case that the laser beam is scanned to two sizes of the sub-islands by changing width of the slit. FIG. 18A shows a case that length of the sub-island in a perpendicular direction to the scanning direction is short, and FIG. 18B shows a relation of a portion to which the laser beam is scanned and the sub-island in case that length of the sub-island in the perpendicular direction to the scanning direction is long.

When it is assumed that width of the beam spot in FIG. 18A is $W_{BW1}$ and width of the beam spot in FIG. 18B is $W_{BW2}$, $W_{BW1}<W_{BW2}$ is satisfied. It is of course that width of the beam spot is not limited to this, and in case that a distance in the perpendicular direction to the scanning direction between the sub-islands has some flexibility, it is possible to set the width freely.

In addition, in the invention, as shown in FIG. 18A and FIG. 18B, the laser beam is not irradiated to a whole surface of the substrate but the laser beam is scanned so as to crystallize a portion of the sub-island at the very least. Since the laser beam is not irradiated to the whole surface of the substrate but to the portion so as for the sub-island to be able to be crystallized at the very least, it is possible to suppress processing time which is needed for one substrate, and to heighten efficiency of substrate processing.

Then, a flow of manufacturing method of a semiconductor apparatus of the invention will be described.

FIG. 19 shows a production flow by a flow chart. Firstly, design of the semiconductor apparatus is carried out by use of CAD. To be more precise, firstly, a mask of the island is designed and then, a mask of the sub-island which may include one island or a plurality of the islands is designed. At this time, it is desirable that the islands which are included in one sub-island are arranged so that carrier moving directions of all channel forming regions are aligned but, it may be fine not to align the directions intentionally according to need.

Also, a mask of the sub-island may be designed so that the marker is formed together with the sub-island at this time.

Then, information relating to the shape of the mask of the designed sub-island (pattern information) is inputted to the computer which the laser irradiation apparatus has. In the computer, on the basis of the inputted pattern information of the sub-island, width $W_s$ of each sub-island in the perpendicular direction to the scanning direction is calculated. Then, on the basis of the width $W_s$ of each sub-island, width $W_{BW}$ in the perpendicular direction to the scanning direction is set.

Then, based upon the width $W_{BW}$ of the slit, a scanning path of the laser beam is determined on the basis of a position of the marker as a reference.

On the other hand, a semiconductor film is formed on the substrate, and by use of the mask of the sub-island, the semiconductor film is patterned and the sub-island is formed. Then, the substrate on which the sub-island was formed is disposed on the stage of the laser irradiation apparatus. Then, on the basis of the marker as a reference, the laser beam is irradiated according to the determined scanning path, and aiming to the sub-island, crystallization is carried out.

Then, after the laser beam is irradiated, the sub-island whose crystallinity was heightened by the laser beam irradiation is patterned and the island is formed. Hereinafter, a process for manufacturing a TFT from the island is carried out. A concrete manufacturing process of the TFT differs according to the shape of the TFT but, typically, a gate insulating film is formed and an impurity region is formed on the island. Then, so as to cover the gate insulating film and a gate electrode, an interlayer insulating film is formed, and a contact hole is formed in the interlayer insulating film, and a part of the impurity region is exposed. Then, so as to contact to the impurity region through the contact hole, a wiring is formed on the interlayer insulating film.

Then, an example in which alignment of the substrate and the mask is carried out by the CCD camera without forming the marker will be described.

FIG. 20 shows a production flow by a flow chart. Firstly, in the same manner as the case of FIG. 19, design of the semiconductor apparatus is carried out by use of CAD. To be more precise, firstly, the mask of the island is designed, and then, the mask of the sub-island which may include one island or a plurality of the islands is designed.

Then, information relating to the shape of the mask of the designed sub-island (pattern information) is inputted to the computer which the laser irradiation apparatus has. In the computer, on the basis of the inputted pattern information of the sub-island, width $W_s$ of each sub-island in the perpendicular direction to the scanning direction is calculated. Then, on the basis of the width $W_s$ of each sub-island, width $W_{BW}$ in the perpendicular direction to the scanning direction is set.

On the other hand, the semiconductor film is formed on the substrate, and by use of the mask of the sub-island, the semiconductor film is patterned and the sub-island is formed. Then, the substrate on which the sub-island was formed is mounted on the stage of the laser irradiation apparatus.

Then, the pattern information of the sub-island on the substrate mounted on the stage is detected by the CCD camera and inputted to the computer as information. In the computer, by bringing the pattern information of the sub-island which was designed by CAD into check to the pattern information of the sub-island which was actually formed on the substrate, alignment of the substrate and the mask is carried out.

Also, on the basis of the width $W_{BW}$ of the slit and the positional information of the sub-island by the CCD camera, the scanning path of the laser beam is determined.

Then, the laser beam is irradiated according to the determined scanning path, and aiming to the sub-island, crystallization is carried out.

Then, after the laser beam was irradiated, the sub-island whose crystallinity was heightened by the laser beam irradiation is patterned and the island is formed. Hereinafter, a process for manufacturing the TFT from the island is carried out. A concrete manufacturing process of the TFT differs according to the shape of the TFT but, typically, a gate insulating film is formed and an impurity region is formed on the island. Then, so as to cover the gate insulating film and a gate electrode, an interlayer insulating film is formed, and a contact hole is formed in the interlayer insulating film, and a part of the impurity region is exposed. Then, so as to contact to the impurity region through the contact hole, a wiring is formed on the interlayer insulating film.

Then, FIG. 21 shows a flow of a production method by a flow chart in case that the irradiation of the laser beam is twice.

FIG. 21 shows a production flow by a flow chart. Firstly, design of the semiconductor apparatus is carried out by use of CAD. To be more precise, firstly, the mask of the island is designed, and then, the mask of the sub-island which may include one island or a plurality of the islands is designed. At this time, in order for the marker to be formed together with the sub-island, the mask of the sub-island may be designed.

Then, information relating to the shape of the mask of the designed sub-island (pattern information) is inputted to the computer which the laser irradiation apparatus has. In the computer, on the basis of the inputted pattern information of the sub-island, two types of width $W_s$ of each sub-island in the perpendicular direction to the scanning direction are calculated. Then, on the basis of the width $W_s$ of each sub-island, width $W_{BW}$ of the slit in the perpendicular direction to the two respective scanning directions is calculated respectively.

Then, in the two respective scanning directions, based upon the width $W_{BW}$ of the slit determined respectively, the scanning path of the laser beam is determined on the basis of the position of the marker as a reference.

On the other hand, the semiconductor film is formed on the substrate, and by use of the mask of the sub-island, the semiconductor film is patterned and the sub-island is formed. Then, the substrate on which the sub-island was formed is mounted on the stage of the laser irradiation apparatus.

Then, on the basis of the marker as a reference, a first laser beam is irradiated according to a first scanning path out of the determined two scanning paths, and aiming to the sub-island, crystallization is carried out.

In addition, an angle of a scanning direction of a first laser beam and a scanning direction of a second laser beam may be stored in advance in a memory etc., and may be inputted manually on each occasion. Then, on the basis of the marker as a reference, the laser beam is irradiated to a scanning portion of the first laser beam and aiming to the sub-island, crystallization is carried out.

Then, the scanning direction is changed, and the second laser beam is irradiated according to the second scanning path, and aiming to the sub-island, crystallization is carried out.

In addition, in FIG. 21, the example in which the laser beam is irradiated twice on the same sub-island was described but, it is possible to designate a place and change the scanning direction by use of the AO modulator etc. For example, a scanning direction in the signal line drive circuit is made to be different from a scanning direction in the pixel part and the scanning line drive circuit, and in case that the laser beam is irradiated at a portion which becomes the signal line drive circuit by use of the AO modulator, the laser beam is arranged not to be irradiated at a portion which becomes the pixel part and the scanning line drive circuit by use of the AO modulator, and in case that the laser beam is irradiated at the portion which become the pixel part and the scanning line drive circuit, the laser beam can be arranged not to be irradiated at the portion which becomes the signal line drive circuit by use of the AO modulator. Then, in this case, in the computer, the AO modulator is arranged to be synchronized with the position control means.

In addition, after the laser beam was irradiated, the sub-island whose crystallinity was heightened by the laser beam irradiation is patterned, and the island is formed. Thereafter, a process for manufacturing the TFT from the island is carried out. A concrete manufacturing process of the TFT differs according to the shape of the TFT but, typically, the gate insulating film is formed and the impurity region is formed in the island. Then, so as to cover the gate insulating film and the gate electrode, the interlayer insulating film is formed, and the contact hole is formed in the interlayer insulating film, and a part of the impurity region is exposed. Then, so as to contact to the impurity region through the contact hole, a wiring is formed on the interlayer insulating film.

In addition, the flow chart shown in FIG. 19 to FIG. 21 shows the case where the slit was disposed but the invention may not have the slit and is not limited to this structure.

For the purpose of comparison, FIG. 22 shows a flow of a production method of a conventional semiconductor apparatus. As shown in FIG. 22, mask design of the semiconductor apparatus by CAD is carried out. On the other hand, an amorphous semiconductor film is formed, and the substrate on which the amorphous semiconductor film was formed is mounted on the laser irradiation apparatus. Then, scanning is carried out so as for the laser beam to be irradiated to the whole amorphous semiconductor film, and the whole amorphous semiconductor film is crystallized. Then, the marker is formed on a polycrystalline semiconductor film which was obtained by crystallization and on the basis of the marker as a reference, the polycrystalline semiconductor film was patterned and the island is formed. Then, by use of the island, TFT is manufactured.

As just described, in the invention, being different from the conventional case as shown in FIG. 22, the maker is formed before the amorphous semiconductor film is crystallized by use of the laser beam. Then, according to the information of the mask of the patterning of the semiconductor film, the laser beam is scanned.

Since, by the above-described structure, it is possible to omit time for irradiating the laser beam to a portion which is removed by the patterning after the semiconductor film was crystallized, time necessary for the laser beam irradiation can be shortened, and further, processing speed of the substrate can be improved.

In addition, a process for crystallizing the semiconductor film by use of a catalyst may be included. In case of using a catalytic element, it is desirable to use technologies disclosed in JP-A-7-130652 gazette and JP-A-8-78329 gazette.

In case that the process for crystallizing the semiconductor film by use of the catalyst is included, a process for crystallizing by use of Ni after the amorphous semiconductor film was formed (NiSPC) is included. For example, in case of using a technique disclosed in JP-A-7-130652 gazette, nickel acetate salt liquid solution which include nickel of 10 ppm by weight conversion is painted to the amorphous semiconductor film and a nickel included layer is formed, and after a dehydrogenation process for one hour at 500° C., heat treatment for 4 to 12 hours at 500 to 650° C., for example for 8 hours at 550° C. is carried out to carry out crystallization. In addition, the usable catalytic element may be, besides nickel (Ni), an element such as germanium (Ge), iron (Fe), palladium (Pd), tin (Sn), lead (Pb), cobalt (Co), platinum (Pt), copper (Cu), gold (Au).

Then, by the laser beam irradiation, crystallinity of the semiconductor film which was crystallized by NiSPC is more heightened. The polycrystalline semiconductor film which was obtained by the laser beam irradiation includes the catalytic element, and after the laser beam irradiation, a process for removing the catalytic element from a crystalline semiconductor film (gettering) is carried out. For the gettering, it is possible to use techniques described in JP-A-10-135468 gazette and JP-A-10-135469 gazette.

To be more precise, phosphor is added to a part of the sub-island which is obtained after the laser irradiation, and heat treatment is carried out under nitrogen atmosphere for 5 to 24 hours at 550 to 800° C., for example, for 12 hours at 600° C. Thereby, an area of the polycrystalline semiconductor film to which phosphor was added works as a gettering site, and it is possible to segregate phosphor which exists in the polycrystalline semiconductor film in the area to which phosphor was added. Thereafter, by removing the area of the polycrystalline semiconductor film to which phosphor was added by patterning, it became possible to obtain the island in which concentration of the catalytic element is reduced to $1 \times 10^{17}$ atoms/cm$^3$ and less, preferably up to approximately $1 \times 10^{16}$ atoms/cm$^3$.

FIG. 16A shows the area to which phosphor is added in the sub-island when gettering is carried out. Reference numeral 1601 designates a sub-island, and Reference numeral 1602 shows a position of an island which is included in the sub-island. Reference numeral 1603 designates an area to which phosphor was added for carrying out the gettering, and phosphor moves in a direction of an arrow. The area 1603 to which the gettering is applied is disposed so that it overlaps with an area where crystallinity is poor in an extension from a midpoint of each contact point 1604 toward the scanning direction, and further, disposed so that it does not overlap with an area where crystallinity is good in the extension from the midpoint of each contact point 1604 toward the scanning direction.

Also, after a liquid solution which includes the catalytic element is painted on the amorphous semiconductor film, crystal growth may be carried out not by SPC but by the laser beam irradiation. FIG. 16B shows an appearance that the nickel acetate salt liquid solution which include nickel is painted to the amorphous semiconductor film 1610 and a nickel included layer 1611 is formed, and by irradiating the laser beam 1612, the semiconductor film 1613 whose crystallinity was heightened is formed. Also in case that crystallization was carried out as just described, it is desirable that the gettering is applied to the catalytic element as shown in FIG. 16A.

As just described, the invention is not a case that the laser beam is scanned and irradiated to the whole semiconductor film but, the laser beam is scanned so that at least necessary and indispensable portion can be crystallized at the very least. By the above-described structure, it is possible to omit time for irradiating the laser beam to a portion which is removed by patterning after the semiconductor film was crystallized, and to shorten processing time required per one substrate drastically.

Embodiments of the present invention will be described below.

[Embodiment 1]

This embodiment describes optical systems of laser irradiation apparatus used in the present invention, and the positional relation between a slit and each of the optical systems.

FIG. 24 shows an optical system for synthesizing four beam spots to obtain one beam spot. The optical system shown in FIG. 24 has six cylindrical lenses 417 to 422. Four laser beams entering the optical system from the directions indicated by the arrows enter the four cylindrical lenses 419 to 422, respectively. Two laser beams shaped by the cylindrical lenses 419 and 421 reach the cylindrical lens 417, which modifies the shapes of their beam spots. The beam spots travel through a slit 424 to irradiate a processing object 423. On the other hand, two laser beams shaped by the cylindrical lenses 420 and 422 reach the cylindrical lens 418, which modifies the shapes of their beam spots. The beam spots travel through the slit 424 to irradiate the processing object 423.

The beam spots of the laser beams on the processing object 423 partially overlap one another for synthesization, thereby forming one beam spot.

The focal length and incident angle of each lens can be set appropriately at designer's discretion. However, the focal length of the cylindrical lenses 417 and 418 which are the closest to the processing object 423 is set shorter than the focal length of the cylindrical lenses 419 to 422. For example, the focal length of the cylindrical lenses 417 and 418 which are the closest to the processing object 423 is set to 20 mm whereas the focal length of the cylindrical lenses 419 to 422 is set to 150 mm. In this embodiment, the lenses are arranged such that laser beams enter the processing object 423 from the cylindrical lenses 417 and 418 at an incident angle of 25° and laser beams enter the cylindrical lenses 417 and 418 from the cylindrical lenses 419 to 422 at an incident angle of 10°. In order to avoid return light and irradiate uniformly, the incident angle at which laser light enters the substrate is set to larger than 0°, desirably, 5 to 30°.

In the example shown in FIG. 24, four beam spots are synthesized. In this case, four cylindrical lenses respectively associated with four laser oscillation apparatuses and two cylindrical lenses associated with the four cylindrical lenses are provided. The number of beam spots synthesized is not limited to 4. It is sufficient if the number of beam spots synthesized is equal to or more than 2 and equal to or less than 8. When n (n=2, 4, 6, 8) beam spots are synthesized, n cylindrical lenses respectively associated with n laser oscillation apparatuses and n/2 cylindrical lenses associated with the n cylindrical lenses are provided. When n (n=3, 5, 7) beam spots are synthesized, n cylindrical lenses respectively associated with n laser oscillation apparatuses and (n+1)/2 cylindrical lenses associated with the n cylindrical lenses are provided.

When five or more beam spots are synthesized, the fifth and the following laser beams desirably irradiate a substrate from the opposite side of the substrate, taking into consideration where to place the optical system, interference, and the like. In this case, another slit is needed on the opposite side of the substrate. Also, the substrate has to be transmissive.

A plane which is perpendicular to the irradiated face and which includes a shorter side of the rectangular shape of each beam before synthesization, or a longer side thereof, is defined as an incident plane. When the length of the shorter side or longer side included in the incident plane is given as W, and the thickness of a substrate which is transmissive of the laser light and which is set on the irradiated face is given as d, an incident angle θ of the laser light desirably satisfies θ≧arctan (W/2d) to achieve uniform laser light irradiation. This has to be true in each laser light before synthesization. If the track of this laser light is not on the incident plane, the incident angle of the track projected onto the incident plane is deemed as θ. When laser light enters the substrate at this incident angle θ, interference between light reflected at the front side of the substrate and reflected light from the back side of the substrate can be avoided to give the substrate uniform laser beam irradiation. The premise of the above discussion is that the refractive index of the substrate is 1. In practice, the refractive index of the substrate is often around 1.5, and the angle calculated taken this fact into account is larger than the angle calculated in the above discussion. However, the energy of a beam spot is attenuated at its ends in the longitudinal direction and influence of interference is small in these portions. Therefore enough interference attenuation effect can be obtained with the value calculated in the above discussion.

An optical system of the laser irradiation apparatus used in the present invention can have other structures than those shown in this embodiment.

[Embodiment 2]

Since, as for the laser beam having the beam spot of elliptical shape, distribution of the energy density in the perpendicular direction to the scanning direction follows Gaussian distribution, a ratio of an area where the energy density is low in the whole is high as compared to the laser beam having the beam spot of rectangular shape or linear shape. Therefor, in the invention, it is desirable that the beam spot of the laser beam is the rectangular shape or linear shape where distribution of the energy density is relatively uniform.

A typical gas laser by which the beam spot of rectangular shape or linear shape is obtained is an excimer laser, and a typical solid state laser is a slab laser. In this embodiment, the slab laser will be described.

FIG. 45A shows a structure of a slab type laser oscillation apparatus as one example. The stab type laser oscillation apparatus shown in FIG. 45A has a rod 7500, a reflection mirror 7501, an output mirror 7502, and a cylindrical lens 7503.

When excitation light is irradiated to the rod 7500, running with a zigzag light path in the rod 7500, the laser beam is outputted to the reflection mirror 7501 or the output mirror 7502 side. The laser beam which is outputted to the reflection mirror 7501 side is reflected and inputted to inside of the rod 7500 again, and outputted to the output mirror 7502 side. The rod 7500 is of a slab type using a plate shaped slab medium, and it is possible to form a relatively long rectangular or linear shaped beam spot at an output stage. Then, as for the outputted laser beam, the shape of its beam spot is processed so as to become thinner at the cylindrical lens 7503 and outputted from the laser oscillation apparatus.

Then, a structure of the slab type laser oscillation apparatus which is different from the structure shown in FIG. 45A is shown in FIG. 45B. In FIG. 4B, a cylindrical lens 7504 is added to the laser oscillation apparatus shown in FIG. 45A, and it is possible to control length of the beam spot by the cylindrical lens 7504.

In addition, when coherent length is 10 cm and above, preferably 1m and above, it is possible to make the beam spot thinner.

Also, in order to prevent temperature of the rod 7500 from being increased excessively, means for controlling the temperature, for example, circulating cooling water and so on, may be provided.

This embodiment can be implemented in combination with the embodiment 1.

[Embodiment 3]

This embodiment describes an example in which plural laser oscillation apparatuses are used and the width of a beam spot of laser light is changed by an AO modulator in the middle of laser light irradiation.

In this embodiment, a computer grasps a laser light scanning path based on mask information inputted. Furthermore, this embodiment uses an AO modulator to change the direction of laser light outputted from any one of the plural laser oscillation apparatuses to block the laser light and thereby change the width of the beam spot in accordance with the mask shape. In this case, although the width of the beam spot is changed by the AO modulator, a region of the beam spot that is low in energy density still has to be blocked in the direction perpendicular to the scanning direction. Therefore, when the slit is used, control of the slit width and redirection of the laser light by the AO modulator have to be synchronized.

FIG. 23A shows an example of the relation between the shape of a mask for patterning a semiconductor film and the beam spot width when a processing object is irradiated with laser light once. Indicated by 560a, 560b are the shapes of a mask for patterning a semiconductor film. In comparison with 560a, 560b has shorter width of sub-island in the scanning direction and the perpendicular direction.

Denoted by 561 and 562 are areas irradiated with laser light. The areas 561 and 562 are scanned with a beam spot obtained by overlapping and synthesizing laser beams outputted from four laser oscillation apparatuses. 561 overlaps with the sub-island 560a, while 562 overlaps with the sub-island 560b. The AV modulator controls the beam spot width such that it is narrower in 562 than in 561.

By using an AO modulator as in this embodiment, the beam spot width can be changed freely without stopping output of every laser oscillation apparatus and unstable output due to interruption of output of laser oscillation apparatus can be avoided.

With the above structure, the laser light track can be changed in width and edges of the laser light track can be prevented from overlapping a semiconductor that is obtained by patterning. Also, the above structure further reduces damage to a substrate which is caused by irradiating with laser light an area that does not need irradiation.

Next, a description is given on an example of blocking laser light by changing the direction of the laser light by an AO modulator in the middle of laser light irradiation to irradiate only a given area with laser light. In this embodiment, laser light is blocked by using an AO modulator, however, the present invention is not limited thereto and can employ any measure that can block laser light.

In the present invention, a computer grasps which part is to be scanned with laser light from mask information inputted. Furthermore, this embodiment uses an AO modulator to change the direction of laser light so that the laser light is blocked and an area to be scanned alone is irradiated with laser light. The AO modulator is desirably formed of a material which can block laser light and which is not deformed or damaged by laser light.

FIG. 23B shows an example of the relation between the shape of a mask for patterning a semiconductor film and an area to be irradiated with laser light. Indicated by 570 is the shape of a mask for patterning a semiconductor film. A semiconductor film is patterned in accordance with the mask after the semiconductor film is crystallized by laser irradiation.

Denoted by reference numeral 571 is an area irradiated with laser light. An area surrounded by the dashed line is not irradiated with laser light because an AO modulator changes the direction of laser light to block the laser light. In this embodiment, an area where crystallization is unnecessary is not irradiated with laser light, or even if irradiated, laser light used is low in energy density. Therefore, damage to a substrate which is caused by irradiating an area that does not need irradiation with laser light can be further reduced.

Next, a description is given on a process of manufacturing a semiconductor device having a pixel portion, a signal line driving circuit, and a scanning line driving circuit, in which an AO modulator is used for selective laser light irradiation of the pixel portion, the signal line driving circuit, and the scanning line driving circuit to irradiate each of them once.

Figure 26A:
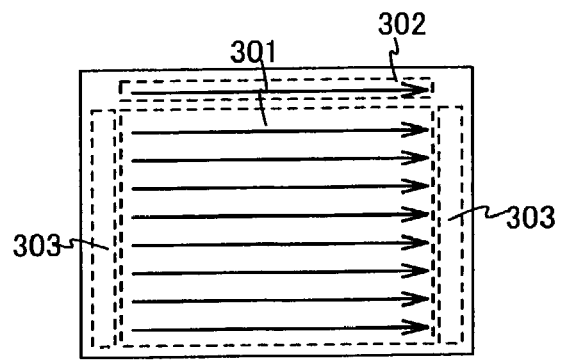

First, as shown in FIG. 26A, laser light runs over a signal line driving circuit 302 and a pixel portion 301 in the direction indicated by the arrow for laser light irradiation. At this point, instead of irradiating the entire surface of the substrate with laser light, an AO modulator is used to change the direction of laser light and block the laser light so that a scanning line driving circuit 303 is not irradiated with laser light.

Figure 26B:
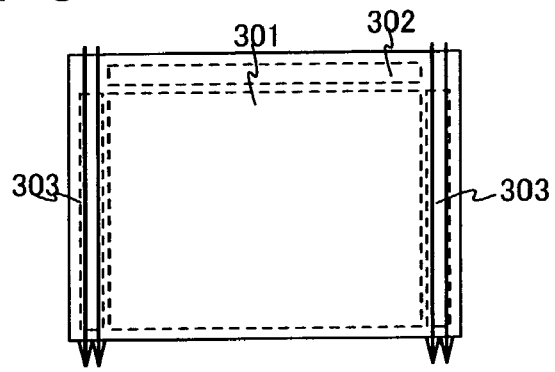

Then, as shown in FIG. 26B, the scanning line driving circuit 303 is irradiated with laser light by running laser light over the scanning line driving circuit 303 in the direction indicated by the arrow. At this time, the signal line driving circuit 302 and the pixel portion 301 are not irradiated with laser light.

The description given next is about another example of using an AO modulator for selective laser light irradiation of a pixel portion, a signal line driving circuit, and a scanning line driving circuit to irradiate each of them once.

Figure 26C:
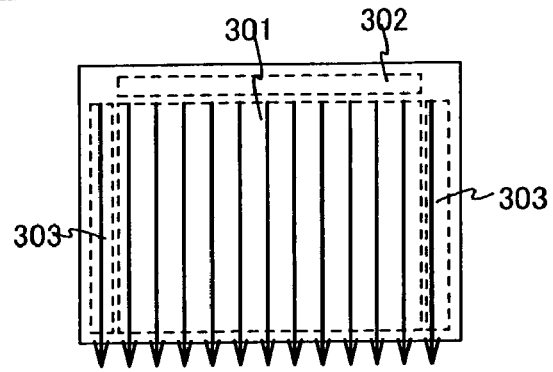
Figure 26D:
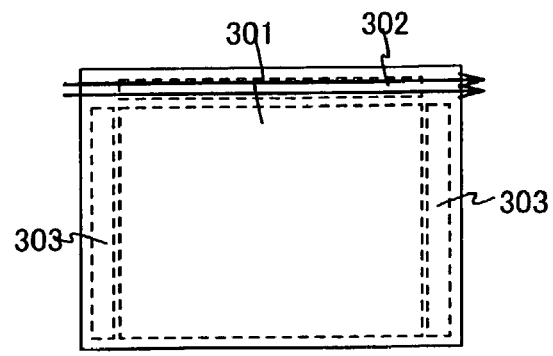

First, as shown in FIG. 26C, laser light runs over the scanning line driving circuit 303 and a pixel portion 301 in the direction indicated by the arrow for laser light irradiation. At this point, instead of irradiating the entire surface of the substrate with laser light, an AO modulator is used to change the direction of laser light and block the laser light so that the signal line driving circuit 302 is not irradiated with laser light.

Then, as shown in FIG. 29B, the signal line driving circuit 302 is irradiated with laser light by running laser light over the signal line driving circuit 302 in the direction indicated by the arrow. During this, the scanning line driving circuit 303 and the pixel portion 301 are not irradiated with laser light.

As described above, using an AO modulator makes selective laser irradiation possible and therefore the laser light scanning direction can be changed for each circuit in accordance with layout of channel formation regions in active layers of the respective circuits. Since irradiating the same circuit with laser light twice can be avoided, it eliminates limitations in laser light path setting and active layer layout which are for preventing edges of second time laser light from overlapping active layers laid out.

Next, an example is described in which plural panels are manufactured from a large-sized substrate when an AO modulator is used for selective laser light irradiation of a pixel portion, a signal line driving circuit, and a scanning line driving circuit to irradiate each of them once.

First, as shown in FIG. 27, laser light runs over a signal line driving circuit 382 and pixel portion 381 of each panel in the direction indicated by the arrow for laser light irradiation. At this point, instead of irradiating the entire surface of the substrate with laser light, an AO modulator is used to change the direction of laser light and block the laser light so that a scanning line driving circuit 383 is not irradiated with laser light.

Then, the scanning line driving circuit 383 of each panel is irradiated with laser light by running laser light over the scanning line driving circuit 383 in the direction indicated by the arrow. At this time, the signal line driving circuit 382 and the pixel portion 381 are not irradiated with laser light. Denoted by 385 is a scrub line of a substrate 386.

This embodiment can be combined with Embodiment 1 or Embodiment 2.

[Embodiment 4]

This embodiment describes, in relation to the energy density, the distance between centers of beam spots when they are overlapped.

In FIG. 28, the energy density distribution in the central axis direction of each beam spot is indicated by the solid line and the energy density distribution of the synthesized beam spot is indicated by the dashed line. The energy density value in the central axis direction of a beam spot generally follows Gaussian distribution.

Assume that, before synthesization, the distance in the central axis direction of a beam spot where the energy density is equal to or more than the peak value, $1/e^2$, is 1. Then, the distance between peaks is given as X. Further, in the synthesized beam spot, an increase from the peak value of the average valley value to the peak value after synthesization is given as Y. The relation between X and Y obtained through simulation is shown in FIG. 29. Y in FIG. 29 is expressed as a percentage.

In FIG. 29, the energy difference Y is expressed by the following Expression 1, which is an approximate expression.

$$Y = 60 - 293X + 340X^2 \text{ (X is the larger one of two solutions.)} \quad \text{[Expression 1]}$$

According to Expression 1, if energy difference is desired to be, for example, around 5%, $X \cong 0.584$ has to be satisfied. Ideally, Y=0 but this makes the length of the beam spot short. Therefore, X is preferably determined balancing it with throughput.

The acceptable range of Y is described next. FIG. 30 shows the output (W) distribution of an $YVO_4$ laser in relation to the beam width in the central axis direction when a beam spot has an elliptical shape. A hatched region is the range of an energy output necessary to obtain satisfactory crystallinity. The graph shows that it is sufficient if the output energy of synthesized laser light falls between 3.5 W and 6 W The energy difference Y for obtaining satisfactory crystallinity reaches its maximum when the maximum value and minimum value of the output energy of the synthesized beam spot fall within the range of an energy output necessary to obtain satisfactory crystallinity such that the values closely match the upper limit and lower limit of the range, respectively. Therefore, in the case of FIG. 30, satisfactory crystallinity is obtained if the energy difference Y is ±26.3%.

The range of an energy output necessary to obtain satisfactory crystallinity is varied depending on which level of crystallinity is deemed as satisfactory, and the output energy distribution is also varied depending on the beam spot shape. Accordingly, the acceptable range of the energy difference Y is not limited to the values described above. The appropriate range of energy density is affected by the state and thickness of a semiconductor film to be annealed. It is necessary for a designer to determine the range of an energy output necessary to obtain satisfactory crystallinity and to set the acceptable range of the energy difference Y from the output energy distribution of the laser light used.

This embodiment can be combined with Embodiments 1 to 3.

[Embodiment 5]

This embodiment gives a description with reference to FIGS. 32A to 35 on a method of manufacturing an active matrix substrate using a laser crystallization method of the present invention. In this specification, a substrate on which a CMOS circuit, a driving circuit, and a pixel portion that has a pixel TFT and capacitor storage are all formed is called an active matrix substrate for conveniences' sake.

This embodiment uses glass such as barium borosilicate glass or aluminoborosilicate glass to form a substrate 600. Instead of glass, the substrate 600 may be a quartz substrate, silicon substrate, metal substrate, or stainless steel substrate with an insulating film formed on its surface. A plastic substrate may also be employed if it has enough heat resistance to withstand the processing temperature.

Figure 32A:
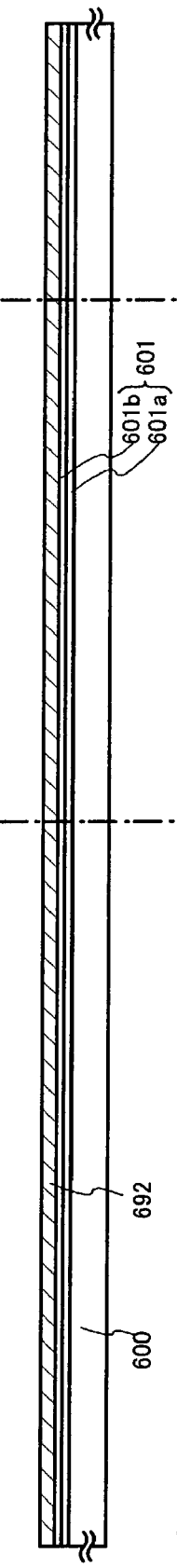

On the substrate 600, an insulating film such as a silicon oxide film, a silicon nitride film, or a silicon oxynitride film is formed as a base film 601 by a known method (sputtering, LPCVD, plasma CVD, or the like). The base film 601 in this embodiment consists of two layers, base films 601a and 601b. However, the base film 601 may be a single layer or three or more layers of the insulating films listed in the above (FIG. 32A).

Next, an amorphous semiconductor film 692 is formed on the base film 601 by a known method (sputtering, LPCVD, plasma CVD, or the like) to a thickness of 25 to 80 nm (preferably 30 to 60 nm). Although an amorphous semiconductor film is formed in this embodiment, a microcrystalline semiconductor film or a crystalline semiconductor film may be formed instead. A compound semiconductor film having an amorphous structure, such as an amorphous silicon germanium film, may also be employed.

Figure 32B:
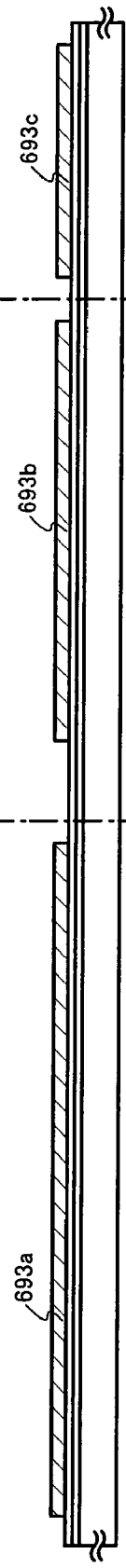

Next, the amorphous semiconductor film 692 is patterned and etched by anisotropic dry etching in an atmosphere containing halogen fluoride, for example, ClF, $ClF_3$, BrF, $BrF_3$, IF, or $IF_3$, to form sub-islands 693a, 693b, and 693c (FIG. 32B).

The sub-islands 693a, 693b, and 693c are crystallized by laser crystallization. This laser crystallization employs a laser irradiation method of the present invention. Specifically, the sub-islands 693a, 693b, and 693c are selectively irradiated with laser light in accordance with mask information inputted to a computer of laser irradiation apparatus. Instead of crystallizing the sub-islands by laser crystallization alone, other known crystallization methods (such as RTA, thermal crystallization using an annealing furnace, or thermal crystallization using a metal element that promotes crystallization) may be used in combination with laser crystallization.

If the amorphous semiconductor film is crystallized by a continuous wave solid-state laser using the second to fourth harmonic of the fundamental wave thereof, crystals of large grain size can be obtained. Typically, the second harmonic (532 nm) or third harmonic (355 nm) of an Nd: $YVO_4$ laser (fundamental wave: 1064 nm) is desirably employed. To be specific, laser light emitted from a continuous wave $YVO_4$ laser is converted into harmonic by a non-linear optical element to obtain laser light with output of 10 W. Alternatively, harmonic is obtained by putting an $YVO_4$ crystal and a non-linear optical element in a resonator. The harmonic is preferably shaped into oblong or elliptical laser light on an irradiation surface by an optical system and then irradiates a processing object. The energy density required at this point is around 0.01 to 100 $MW/cm^2$ (preferably 0.1 to 10 $MW/cm^2$). During the irradiation, the semiconductor film is moved relative to the laser light at a rate of about 10 to 2000 cm/s.

For laser irradiation, a continuous wave gas laser or solid-state laser can be employed. Examples of the gas laser include an excimer laser, an Ar laser, and a Kr laser. Examples of the solid-state laser include a YAG laser, a $YVO_4$ laser, a YLF laser, a $YAlO_3$ laser, a glass laser, a ruby laser, an alexandrite laser, a Ti: sapphire laser, and a $Y_2O_3$ laser. The solid-state laser employed may be a laser that uses crystals of YAG, $YVO_4$, YLF, $YAlO_3$ or the like doped with Cr, Nd, Er, Ho, Ce, Co, Ti, Yb, or Tm. Further, a slab laser also may be used. The fundamental wave of the laser is varied depending on the material used for doping but laser light obtained has a fundamental wave of about 1 μm. A non-linear optical element is used to obtain harmonic of the fundamental wave.

Figure 32C:
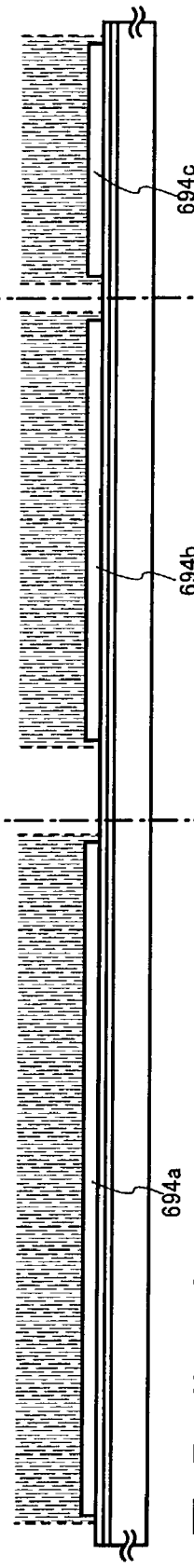

Through the above laser crystallization, the sub-islands 693a, 693b, and 693c are irradiated with laser light and sub-islands 694a, 694b, and 694c with improved crystallinity are formed (FIG. 32C).

Figure 32D:
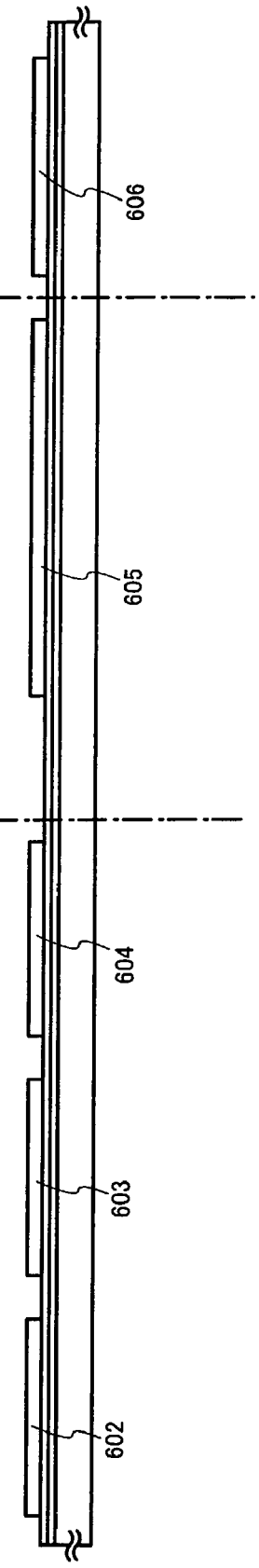

The sub-islands 694a, 694b, and 694c with improved crystallinity are patterned into desired shapes to form crystallized islands 602 to 606 (FIG. 32D).

After the islands 602 to 606 are formed, the islands may be doped with a minute amount of impurity element (boron or phosphorus) in order to control the threshold of TFTs.

Then a gate insulating film 607 is formed to cover the islands 602 to 606. The gate insulating film is an insulating film containing silicon and is formed by plasma CVD or sputtering to a thickness of 40 to 150 nm. In this embodiment, a silicon oxynitride film (composition ratio: Si=32%, O=59%, N=7%, H=2%) is formed by plasma CVD to a thickness of 110 nm. The gate insulating film is not limited to the silicon oxynitride film, and a single layer or laminate of other insulating films containing silicon may also be employed.

If a silicon oxide film is chosen for the gate insulating film, it is formed by plasma CVD in which TEOS (tetraethyl orthosilicate) and $O_2$ are mixed, the reaction pressure is set to 40 Pa, the substrate temperature to 300 to 400° C., and the high frequency (13.56 MHz) power density to 0.5 to 0.8 $W/cm^2$ for electric discharge. The thus formed silicon oxide film can provide excellent characteristics as a gate insulating film if it subsequently receives thermal annealing at 400 to 500° C.

Next, a laminate of a first conductive film 608 with a thickness of 20 to 100 nm and a second conductive film 609 with a thickness of 100 to 400 nm is formed on the gate insulating film 607. (FIG. 33A) In this embodiment, a TaN film with a thickness of 30 nm is formed as the first conductive film 608 and then a W film with a thickness of 370 nm is laid thereon as the second conductive film 609. The TaN film is formed by sputtering with Ta as the target in an atmosphere containing nitrogen. The W film is formed by sputtering using a W target. The W film may instead be formed by thermal CVD using tungsten hexafluoride ($WF_6$). In either case, the W film has to have low resistivity in order to use it as a gate electrode. Desirably, the W film has a resistivity of 20 μΩcm or less. The resistivity of the W film can be lowered by increasing the grain size. However, if too many impurity elements such as oxygen are contained in the W film, crystallization is hindered to raise the resistivity. Accordingly, this embodiment uses sputtering with W of high purity (purity: 99.9999%) as the target to form the W film taking care not to allow impurities from the air to mix in the film during its formation. As a result, the W film can have a resistivity of 9 to 20 μΩcm.

Although the first conductive film 608 and the second conductive film 609 in this embodiment are a TaN film and a W film, respectively, there is no particular limitation thereto. The first conductive film and second conductive film each can be formed from an element selected from the group consisting of Ta, W, Ti, Mo, Al, Cu, Cr, and Nd, or an alloy or compound mainly containing the above elements. Alternatively, the first conductive film and the second conductive film may be semiconductor films, typically polycrystalline silicon films, doped with phosphorus or other impurity elements or may be Ag—Pd—Cu alloy films. The following combinations are also employable: a combination of a tantalum (Ta) film as the first conductive film and a W film as the second conductive film, a combination of a titanium nitride (TiN) film as the first conductive film and a W film as the second conductive film, a combination of a tantalum nitride (TaN) film as the first conductive film and a W film as the second conductive film, a combination of a tantalum nitride (TaN) film as the first conductive film and an Al film as the second conductive film, and a combination of a tantalum nitride (TaN) film as the first conductive film and a Cu film as the second conductive film.

The present invention is not limited to a two-layer structure conductive film. For example, a three-layer structure consisting of a tungsten film, aluminum-silicon alloy (Al—Si) film, and titanium nitride film layered in this order may be employed. When the three-layer structure is employed, the tungsten film may be replaced by a tungsten nitride film, the aluminum-silicon alloy (Al—Si) film may be replaced by an aluminum-titanium alloy (Al—Ti) film, and the titanium nitride film may be replaced by a titanium film.

It is important to select the optimum etching method and etchant for the conductive film material employed.

Next, resist masks 610 to 615 are formed by photolithography and the first etching treatment is conducted in order to form electrodes and wirings. The first etching treatment employs first and second etching conditions (FIG. 33B). In this embodiment, the first etching conditions include employing ICP (inductively coupled plasma) etching, using $CF_4$, $Cl_2$, and $O_2$ as etching gas, setting the gas flow rate ratio thereof to 25:25:10 (sccm), and applying an RF (13.56 MHz) power of 500 W to a coiled electrode at a pressure of 1 Pa to generate plasma for etching. The substrate side (sample stage) also receives an RF (13.56 MHz) power of 150 W to apply a substantially negative self-bias voltage. The W film is etched under these first etching conditions to taper the first conductive layer around the edges.

Thereafter, the first etching conditions are switched to the second etching conditions without removing the resist masks 605 to 615. The second etching conditions include using $CF_4$ and $Cl_2$ as etching gas, setting the gas flow rate ratio thereof to 30:30 (sccm), and giving an RF (13.56 MHz) power of 500 W to a coiled electrode at a pressure of 1 Pa to generate plasma for etching for about 30 seconds. The substrate side (sample stage) also receives an RF power (13.56 MHz) of 20 W to apply a substantially negative self-bias voltage. Under the second etching conditions where a mixture of $CF_4$ and $Cl_2$ is used, the W film and the TaN film are etched to the same degree. In order to etch the films without leaving any residue on the gate insulating film, the etching time is increased by around 10 to 20%.

In the first etching treatment, the first conductive layer and the second conductive layer are tapered around their edges by the effect of the bias voltage applied to the substrate side if the resist masks have appropriate shapes. The angle of the tapered portions is 15 to 45'. In this way, first shape conductive layers 617 to 622 consisting of the first conductive layer and the second conductive layer (first conductive layers 617a to 622a) are formed through the first etching treatment. Denoted by 616 is a gate insulating film, and regions of the gate insulating film that are not covered with the first shape conductive layers 617 to 622 are etched and thinned by about 20 to 50 nm.

Next follows the second etching treatment with the resist masks kept in place (FIG. 33C). Here, $CF_4$, $Cl_2$ and $O_2$ are used as etching gas to etch the W film selectively. Second shape conductive layers 628 to 633 are formed through the second etching treatment. The first conductive layers 617a to 622a are hardly etched in this treatment while the second conductive layers 617b to 622b are etched by priority. In order to distinguish the before and behind conductive layers of the second etching treatment, in second shape conductive layers 628 to 633, first conductive layers are 628a to 633a, second conductive layers are 628b to 633b.

Without removing the resist masks, the first doping treatment is conducted to dope the islands with an impurity element that gives the n-type conductivity in low concentration. The doping treatment employs ion doping or ion implantation. The ion doping conditions include setting the dose to $1 \times 10^{13}$ to $5 \times 10^{14}$ atoms/cm$^2$ and the acceleration voltage to 40 to 80 kV. In this embodiment, the dose is set to $1.5 \times 10^{13}$ atoms/cm$^2$ and the acceleration voltage is set to 60 kV. An impurity element that gives the n-type conductivity is an element belonging to Group 15, typically, phosphorus (P) or arsenic (As). This embodiment employs phosphorus (P). In this case, the conductive layers 628 to 633 serve as masks against the impurity element that gives the n-type conductivity and impurity regions 623 to 627 are formed in a self-aligning manner. The impurity regions 623 to 627 are doped with the impurity element that gives the n-type conductivity in a concentration of $1 \times 10^{18}$ to $1 \times 10^{20}$/cm$^3$.

The resist masks are removed and new resist masks 634a to 634c are formed for the second doping treatment. The acceleration voltage is higher in the second doping treatment than in the first doping treatment. The ion doping conditions include setting the dose to $1 \times 10^{13}$ to $1 \times 10^{15}$ atoms/cm$^2$ and the acceleration voltage to 60 to 120 kV. In the second doping treatment, the second conductive layers 628b to 632b are used as masks against the impurity element and the islands under the tapered portions of the first conductive layers 628a to 632a are doped with the impurity element. Then, the third doping treatment is carried out with the acceleration voltage set lower than that in the second doping treatment to obtain the state of FIG. 34A. The ion doping conditions of the third doping include setting the dose to $1\times10^{15}$ to $1\times10^{17}$ atoms/cm$^2$ and the acceleration voltage to 50 to 100 kV. As a result of the second and third doping treatments, low concentration impurity regions 636, 642, and 648 overlapping the first conductive layers are doped with an impurity element that gives the n-type conductivity in a concentration of $1\times10^{18}$ to $5\times10^{19}$/cm$^3$, and high concentration impurity regions 635, 641, 644, and 647 are doped with an impurity element that gives the n-type conductivity in a concentration of $1\times10^{19}$ to $5\times10^{21}$/cm$^3$.

If the acceleration voltage is suitably set, the second doping treatment and the third doping treatment can be integrated, so that the low concentration impurity regions and high concentration impurity regions are formed in one doping treatment.

Next, the resist masks are removed and new resist masks 650a to 650c are formed for the fourth doping treatment. Through the fourth doping treatment, impurity regions 653, 654, 659, and 660 are formed in the islands that are to serve as active layers of p-channel TFTs. The impurity regions 653, 654, 659, and 660 are doped with an impurity element that gives the conductivity reverse to the n-type conductivity. In the fourth doping treatment, the second conductive layers 628a to 632a are used as masks against the impurity element. In this way, the impurity regions doped with an impurity element that gives the p-type conductivity are formed in a self-aligning manner. The impurity regions 653, 654, 659 and 660 in this embodiment are formed by ion doping using diborane (B$_2$H$_6$) (FIG. 34B). In the fourth doping treatment, the islands for forming n-channel TFTs are covered with the resist masks 650a to 650c.

In addition, the impurity regions 653, 654, 659, and 660 have been doped with phosphorus by the first through the third doping treatment in different concentrations. However, any of the impurity regions is doped in the fourth doping treatment with an impurity element that gives the p-type conductivity in a concentration of $1\times10^{19}$ to $5\times10^{21}$ atoms/cm$^2$. Therefore, the impurity regions have no problem in functioning as source regions and drain regions of p-channel TFTs.

Through the above steps, impurity regions are formed in the respective islands.

Next, the resist masks 650a to 650c are removed and a first interlayer insulating film 661 is formed. This first interlayer insulating film 661 is an insulating film containing silicon and is formed by plasma CVD or sputtering to a thickness of 100 to 200 nm. In this embodiment, a silicon oxynitride film is formed by plasma CVD to a thickness of 150 nm. The first interlayer insulating film 661 is not limited to the silicon oxynitride film but may be a single layer or laminate of other insulating films containing silicon.

Next, a laser irradiation is conducted for activation treatment. If laser annealing is chosen, the laser that has been used in crystallization can be employed. In activation, the mobility is set to the same level as the mobility in crystallization and the energy density required is 0.01 to 100 MW/cm$^2$ (preferably 0.01 to 10 MW/cm$^2$).

The activation treatment may be conducted before the first interlayer insulating film 661 is formed.

Then, thermal processing (heat treatment at 300 to 550° C. for 1 to 12 hours) is conducted for hydrogenation. This step is to terminate dangling bonds in the islands using hydrogen that is contained in the first interlayer insulating film 661. Examples of alternative hydrogenation means include plasma hydrogenation using hydrogen that is excited by plasma, and heat treatment conducted in an atmosphere which contains 3 to 100% of hydrogen at 300 to 650° C. for 1 to 12 hours. In this case, the island can be hydrogenated irrespective of presence or absence of the first interlayer insulating film 661.

On the first interlayer insulating film 661, a second interlayer insulating film 662 is formed from an inorganic insulating material or an organic insulating material. In this embodiment, an acrylic resin film is formed to a thickness of 1.6 µm. Next, a third interlayer insulating film 672 is formed after the formation of the second interlayer insulating film 662 so as to come into contact with the second interlayer insulating film 662. In this embodiment, a silicon nitride film is used for the third interlayer insulating film 672.

Subsequently, wirings 663 to 667 are formed to be electrically connected to the respective impurity regions in a driving circuit 686. These wirings are formed by patterning a laminate of a 50 nm thick Ti film and 500 nm thick alloy film (Al—Ti alloy film). The wirings are not limited to the two-layer structure and may take a single-layer structure or a multi-layer structure with three or more layers. Wiring materials are not limited to Al and Ti. For example, the wirings may be formed by patterning a laminate film in which an Al film or a Cu film is formed on a TaN film and a Ti film is formed thereon (FIG. 35).

In a pixel portion 687, a pixel electrode 670, a gate wiring 669, and a connection electrode 668 are formed. The connection electrode 668 allows source wirings (a laminate of 633a and 633b) to electrically connect with a pixel TFT 684. The gate wiring 669 forms an electrical connection with a gate electrode of the pixel TFT 684. The pixel electrode 670 forms an electrical connection with a drain region 658 of the pixel TFT 684 and another electrical connection with an impurity region 659 of the capacitor storage 685. In this patent application, the pixel electrode and the connection electrode are formed from the same material. Desirably, the pixel electrode 670 is formed from a material having excellent reflectivity, for example, a film mainly containing Al or Ag, or a laminate of such films.

The driving circuit 686, which has a CMOS circuit composed of an n-channel TFT 681 and a p-channel TFT 682 and has an n-channel TFT 683, and the pixel portion 687, which has a pixel TFT 684 and capacitor storage 685, can thus be formed on the same substrate. In this way, an active matrix substrate is completed.

The n-channel TFT 681 of the driving circuit 686 has a channel formation region 637, the low concentration impurity regions 636 (GOLD (gate overlapped LDD) region), and high concentration impurity regions 652. The low concentration impurity regions 636 overlap the first conductive layer 628a that constitutes a part of a gate electrode. One of the high concentration impurity regions 652 serves as a source region and the other serves as a drain region. Connected to this n-channel TFT 681 through an electrode 666 to form the CMOS circuit is the p-channel TFT 682. The p-channel TFT 682 has a channel formation region 640, the high concentration impurity regions 653, and the impurity regions 654. One of the high concentration impurity regions 653 serves as a source region and the other serves as a drain region. The impurity regions 654 have introduced therein an impurity element that gives the p-type conductivity. The n-channel TFT 683 has a channel formation region 643, the low concentration impurity regions 642 (GOLD regions), and high concentration impurity regions 656. The low concentration impurity regions 642 overlap the first conductive layer 630a that constitutes a part of a gate electrode. One of the high concentration impurity regions 656 serves as a source region and the other serves as a drain region.

The pixel TFT 684 of the pixel portion has a channel formation region 646, the low concentration impurity regions 645 (LDD regions), and high concentration impurity regions 658. The low concentration impurity regions 645 are formed outside of the gate electrode. One of the high concentration impurity regions 658 serves as a source region and the other serves as a drain region. The island that serves as one of electrodes of the capacitor storage 685 is doped with an impurity element that gives the n-type conductivity and an impurity element that gives the p-type conductivity. The capacitor storage 685 is composed of an electrode (a laminate of 632a and 632b) and an island with the insulating film 616 as dielectric.

This embodiment can be combined with Embodiments 1 through 4.

[Embodiment 6]

This embodiment describes a process of manufacturing a reflective liquid crystal display device from the active matrix substrate that is manufactured in Embodiment 5. The description is given with reference to FIG. 36.

First, an active matrix substrate in the state of FIG. 35 is obtained following the description in Embodiment 5. On the active matrix substrate of FIG. 35, at least on the pixel electrode 670, an orientation film 867 is formed and subjected to rubbing treatment. In this embodiment, before forming the orientation film 867, an acrylic resin film or other organic resin film is patterned to form in desired positions columnar spacers 872 for keeping the gap between substrates. Instead of the columnar spacers, spherical spacers may be sprayed onto the entire surface of the substrate.

Next, an opposite substrate 869 is prepared. Colored layers 870 and 871 and a planarization film 873 are formed on the opposite substrate 869. The red colored layer 870 and the blue colored layer 871 are overlapped to form a light-shielding portion. Alternatively, a red colored layer and a green colored layer may be partially overlapped to form a light-shielding portion.

This embodiment uses the substrate shown in Embodiment 5. Therefore, at least the gap between the gate wiring 669 and the pixel electrode 670, the gap between the gate wiring 669 and the connection electrode 668, and the gap between the connection electrode 668 and the pixel electrode 670 have to be shielded against light. In this embodiment, the colored layers are arranged such that the light-shielding portion that is a laminate of the colored layers overlaps these gaps to be shielded against light. Then, the opposite substrate is bonded.

The number of steps is thus reduced by using a light-shielding portion that is a laminate of colored layers to shield gaps between pixels against light instead of forming a light-shielding layer such as a black mask.

Next, a transparent conductive film is formed as an opposite electrode 876 on the planarization film 873 at least in the pixel portion. An orientation film 874 is formed on the entire surface of the opposite substrate and is subjected to rubbing treatment.

Then, the opposite substrate is bonded by a seal member 868 to the active matrix substrate on which the pixel portion and the driving circuit are formed. The seal member 868 has fillers mixed therein, and the fillers together with the columnar spacers keep the gap uniform between the two substrates while they are bonded. Thereafter, a liquid crystal material 875 is injected to the space between the two substrates and the device is completely sealed with a sealing agent (not shown in the drawing). The liquid crystal material 875 is a known liquid crystal material. In this way, a reflective liquid crystal display device shown in FIG. 36 is completed. If necessary, the active matrix substrate or the opposite substrate is cut into pieces of desired shapes. A polarizing plate (not shown in the drawing) is then bonded to the opposite substrate alone. Thereafter, an FPC is bonded by a known technique.

The thus manufactured liquid crystal display device has TFTs formed from a semiconductor film that has crystal grains of large grain size formed through irradiation by laser light with periodic or uniform energy distribution. This gives the liquid crystal display device satisfactory operation characteristics and reliability. Such liquid crystal display device can be used as a display unit of various electronic equipment.

This embodiment can be combined with Embodiments 1 through 5.

[Embodiment 7]

This embodiment describes an example of manufacturing a light emitting device using the TFT manufacturing method when manufacturing the active matrix substrate shown in Embodiment 5. "Light emitting device" is a generic term for a display panel in which a light emitting element is formed on a substrate and sealed between the substrate and a cover member, and for a display module obtained by mounting a TFT and the like to the display panel. A light emitting element has a layer containing an organic compound that provides luminescence upon application of electric field (electroluminescence), as well as an anode layer and a cathode layer. Luminescence obtained from organic compounds is classified into light emission upon return to the base state from singlet excitation (fluorescence) and light emission upon return to the base state from triplet excitation (phosphorescence). The present invention includes one or both of the two types of light emission.

In this specification, all the layers that are formed between a cathode and an anode in a light emitting element are collectively defined as an organic light emitting layer. Specifically, an organic light emitting layer includes a light emitting layer, a hole injection layer, an electron injection layer, a hole transporting layer, an electron transporting layer, etc. The basic structure of a light emitting element is a laminate of an anode layer, light emitting layer, and cathode layer layered in this order. The basic structure may be modified into a laminate in which an anode layer, a hole injection layer, a light emitting layer, a cathode layer, etc. are layered in this order, or a laminate in which an anode layer, a hole injection layer, a light emitting layer, an electron transporting layer, a cathode layer, etc. are layered in this order.

A light emitting element used in this embodiment may also take a mode in which a hole injection layer, an electron injection layer, a hole transporting layer, or an electron transporting layer is formed solely of an inorganic compound or from a material obtained by mixing an inorganic compound with an organic compound. The layers listed may be partially mixed with one another.

FIG. 37A is a sectional view of a light emitting device of this embodiment where manufacturing process is finished up through formation of a third interlayer insulating film 750. In FIG. 37A, a switching TFT 733 and a current controlling TFT 734 on a substrate 700 are formed by the manufacturing method of Embodiment 5. The switching TFT 733 in this embodiment has a double gate structure in which two channel formation regions are formed. However, the switching TFT 733 may take a single gate structure having one channel formation region or a structure having three or more channel formation regions. The current controlling TFT 734 in this embodiment has a single gate structure in which one channel formation region is formed, but it may take a structure having two or more channel formation regions.

An n-channel TFT 731 and p-channel TFT 732 of a driving circuit on the substrate 700 are formed by the manufacturing method of Embodiment 5. The TFTs have a single gate structure in this embodiment, but may take a double gate structure or a triple gate structure.

The third interlayer insulating film 750 is, in a light emitting device, effective in preventing moisture contained in a second interlayer insulating film 751 from entering an organic light emitting layer. When the second interlayer insulating film 751 has an organic resin material, forming the third interlayer insulating film 750 is particularly effective since organic resin materials contain a lot of moisture.

After the process of Embodiment 5 is finished up through the step of forming the third interlayer insulating film, a pixel electrode 711 is formed on the third interlayer insulating film 750 in this embodiment (FIG. 37A).

The pixel electrode 711 is a pixel electrode formed from a transparent conductive film (an anode of a light emitting element). The transparent conductive film used may be formed from a compound of indium oxide and tin oxide or a compound of indium oxide and zinc oxide, or from zinc oxide alone, tin oxide alone, or indium oxide alone. The transparent conductive film doped with gallium may be used. The pixel electrode 711 is formed on the flat third interlayer insulating film 750 before wirings are formed. In this embodiment, it is very important to use a second interlayer insulating film 751 formed of a resin to level the level differences caused by the TFTs. If there are level differences, they may cause defective light emission since a light emitting layer which is formed later is very thin. Accordingly, the surface should be leveled before the pixel electrode is formed, so that the light emitting layer can be formed on as flat a surface as possible.

Next, as shown in FIG. 37B, a resin film dispersed with black dye, carbon, or black pigments is formed so as to cover the third interlayer insulating film 750. An opening is formed in the film at a position where a light emitting element is formed. This film serves as a light-shielding film 770. The material of the resin film is typically polyimide, polyamide, acrylic, or BCB (benzocyclobutene), but is not limited thereto. Examples of other light-shielding film materials than organic resins include silicon, silicon oxide, silicon oxynitride, and the like with black dye, carbon, or black pigments mixed therein. The light-shielding film 770 has an effect of preventing external light reflected by wirings 701 to 707 from reaching eyes of a viewer.

After the pixel electrode 711 is formed, contact holes are formed in a gate insulating film 752, a first interlayer insulating film 753, the second interlayer insulating film 751, the third interlayer insulating film 750, and the light-shielding film 770. Then a conductive film is formed on the light-shielding film 770 to cover the pixel electrode 711. The conductive film is etched to form wirings 701 to 707 that are electrically connected to impurity regions of the respective TFTs. These wirings are formed by patterning a laminate of a 50 nm thick Ti film and 500 nm thick alloy film (an alloy of Al and Ti). The wirings are not limited to the two-layer structure and may take a single-layer structure or a multi-layer structure of three or more layers. Wiring materials are not limited to Al and Ti. For example, the wirings may be formed by patterning a laminate film in which an Al film or a Cu film is formed on a TaN film and a Ti film is formed thereon (FIG. 37B).

The wiring 707 is a source wiring (corresponding to a current supply line) of the current controlling TFT. The wiring 706 is an electrode that electrically connects a drain region of the current controlling TFT with the pixel electrode 711.

After the wirings 701 to 707 are formed, a bank 712 is formed from a resin material. The bank 712 is formed by patterning acrylic film or polyimide film with a thickness of 1 to 2 µm so as to expose a part of the pixel electrode 711.

A light emitting layer 713 is formed on the pixel electrode 711. Although only one pixel is shown in FIG. 37B, three types of light emitting layers for R (red), G (green), and B (blue) colors are formed in this embodiment. The light emitting layers in this embodiment are formed by evaporation from low-molecular weight organic light emitting materials. Specifically, a copper phthalocyanine (CuPc) film with a thickness of 20 nm is formed as a hole injection layer and a tris-8-quinolinolate aluminum complex ($Alq_3$) film is layered thereon as a light emitting layer. The color of emitted light can be controlled by doping $Alq_3$ with a fluorescent pigment such as quinacridon, perylene, or DCM1.

However, the materials given in the above are merely examples of organic light emitting materials that can be used as light emitting layers and there is no need to exclusively use them. A light emitting layer (a layer in which carriers are moved to thereby emit light) is formed by freely combining a light emitting layer with an electric charge transporting layer or an electric charge injection layer. Although a low-molecular weight organic light emitting material is used for a light emitting layer in the example shown in this embodiment, an intermediate-molecular weight organic light emitting material or a high-molecular weight organic light emitting material may be used instead. In this specification, an intermediate molecular weight organic light-emitting material can be defined that an aggregate of an organic compound which does not have subliming property or dissolving property (preferably, an aggregate which has molecularity of 10 or less), or an organic compound which has a molecular chain length of 5 µm of less (preferably 50 nm or less). As an example of employing a high-molecular weight organic light emitting material, a laminate structure may be adopted in which a polythiophene (PEDOT) film is formed as a hole injection layer by spin coating to a thickness of 20 nm and a paraphenylene vinylene (PPV) film with a thickness of about 100 nm is layered thereon as a light emitting layer. If a π-conjugate polymer of PPV is used, a light emission wavelength ranging from red to blue can be chosen. Inorganic materials such as silicon carbide can be used for an electric charge transporting layer and an electric charge injection layer. These organic light emitting materials and inorganic materials may be known materials.

Next, a cathode 714 is formed from a conductive film on the light emitting layer 713. In this embodiment, the conductive film is a film of an alloy of aluminum and lithium. A known MgAg film (a film of an alloy of magnesium and silver) may also be used. It is sufficient if the cathode material is a conductive film formed of an element that belongs to Group 1 or 2 in the periodic table or a conductive film doped with such element.

With formation of the cathode 714, a light emitting element 715 is completed. The light emitting element 715 here refers to a diode composed of the pixel electrode (anode) 711, the light emitting layer 713, and the cathode 714.

A protective film 754 may be provided so as to completely cover the light emitting element 715. A carbon film or insulating films including a silicon nitride film and a silicon oxynitride film can be used for the protective film 754, which is a single layer or laminate of those films.

Preferably, a film with good coverage is used as the protective film 754. A carbon film, especially DLC (diamond-like carbon) film is effective. A DLC film can be formed at a temperature ranging from room temperature to 100° C. or less and therefore it is easy to form a DLC film above the light emitting layer 713, which has low heat resistance. Also, a DLC film has high oxygen blocking effect and is capable of preventing oxidization of the light emitting layer 713. Therefore, a problem of the light emitting layer 713 being oxidized during the subsequent sealing step can be avoided.

In this embodiment, the light emitting layer 713 is completely covered with an inorganic insulating film such as a carbon film, a silicon nitride film, a silicon oxynitride film, an aluminum nitride film, or an aluminum oxynitride film, which serves well as a barrier. Therefore, degradation of the light emitting layer due to moisture, oxygen, and the like seeping into the light emitting layer can be prevented more effectively.

Prevention of the intrusion of impurities into the light emitting layer becomes more thorough if silicon nitride films formed by sputtering with silicon as the target are used particularly for a third insulating interlayer film 750, and the protective film 754. The film formation conditions can be suitably chosen. Particularly preferable conditions include using nitrogen ($N_2$) or a mixture gas of nitrogen and argon as sputtering gas and applying a high-frequency power for sputtering. The substrate temperature is set to room temperature and no heating means is necessary. If an organic insulating film and an organic compound layer have already been formed, it is desirable to form the silicon nitride films without heating the substrate. However, heating in vacuum for several minutes to several hours at 50 to 100° C. for dehydrogenation treatment is preferable in order to thoroughly remove adsorbed or occluded moisture.

Silicon nitride films formed from nitrogen gas alone by sputtering at room temperature using silicon as the target and applying a 13.56 MHz high-frequency power are characterized in that the absorption peaks of N—H bond and Si—H bond are not observed in its infrared absorption spectrum and neither is the absorption peak of Si—O bond, and the oxygen concentration and hydrogen concentration in these silicon nitride films are each 1 atomic % or less. This is another proof of effectiveness of the silicon nitride films in preventing the intrusion of impurities such as oxygen and moisture.

The light emitting element 715 is further covered with a sealing member 717 and a cover member 718 is bonded thereto. A UV-curable resin can be used as the sealing member 717 and it is effective to put a hygroscopic material or antioxidant inside the sealing member. The cover member 718 used in this embodiment is a glass substrate, quartz substrate, or plastic substrate with a carbon film (preferably diamond-like carbon film) formed on each side.

In this way, a light emitting device structured as shown in FIG. 37B is completed. As the steps following formation of the bank 712, it is effective to process in succession without exposing the device to the air until after the protective film 754 is formed. An advanced version of this is to process in succession without exposing the device to the air until after the cover member 718 is bonded.

The n-channel TFTs 731 and 732, the switching TFT (n-channel TFT) 733, and the current controlling TFT (n-channel TFT) 734 are thus formed on the substrate 700.

The light-shielding film 770 is formed between the third interlayer insulating film 750 and the bank 712 in this embodiment. However, the present invention is not limited to this structure. The important thing about placement of light-shielding film is that it has to be placed in such a position that can prevent external light reflected by the wirings 701 to 707 from reaching eyes of a viewer. For instance, if light emitted from the light emitting element 715 travels toward the substrate 700 side as in this embodiment, the light-shielding film may be placed between the first interlayer insulating film 753 and the second interlayer insulating film 751. In this case also, the light-shielding film has an opening to let light from the light emitting element to pass therethrough.

As described with reference to FIGS. 37A and 37B, an n-channel TFT that is not easily degraded by the hot carrier effect can be formed by providing an impurity region that overlaps a gate electrode with an insulating film sandwiched therebetween. Therefore, a highly reliable light emitting device is obtained.

Although this embodiment shows the structures of the pixel portion and driving circuit alone, logic circuits such as a signal divider circuit, a D/A converter, an operation amplifier, and a γ correction circuit can be formed on the same insulator in addition to the pixel portion and the driving circuit by following the manufacturing process of this embodiment. Furthermore, a memory and a microprocessor can be formed on the same insulator.

The thus manufactured light emitting device has TFTs formed from a semiconductor film that has crystal grains of large grain size formed through irradiation by laser light with periodic or uniform energy distribution. This gives the light emitting device satisfactory operation characteristics and reliability. Such light emitting device can be used as a display unit of various electronic equipment.

Light emitted from the light emitting element travels toward the TFT side in this embodiment. Alternatively, light from the light emitting element may travel in the opposite direction of the TFTs. In this case, a resin with black dye, carbon, or black pigments mixed therein can be used for the bank. A sectional view of a light emitting device in which light emitted from a light emitting element travels in the opposite direction of TFTs is shown in FIG. 44.

In FIG. 44, after a third interlayer insulating film 950 is formed, contact holes are formed in a gate insulating film 952, a first interlayer insulating film 953, a second interlayer insulating film 951, and the third interlayer insulating film 950. Then, a conductive film is formed on the third interlayer insulating film 950 and is etched to form wirings 901 to 907 that are electrically connected to impurity regions of the respective TFTs. These wirings are formed by patterning an aluminum alloy film (an aluminum film containing 1 wt % of titanium) with a thickness of 300 nm. The wirings are not limited to a single-layer structure and may take a multi-layer structure having two or more layers. Wiring materials are not limited to Al and Ti. A part of the wiring 906 doubles as a pixel electrode.

After the wirings 901 to 907 are formed, a bank 912 is formed from a resin material. The bank 912 is formed by patterning a resin film with black dye, carbon, or black pigments mixed therein, having a thickness of 1 to 2 μm so as to expose a part of the pixel electrode 906. The material of the resin film is typically polyimide, polyamide, acrylic, or BCB (benzocyclobutene), but is not limited thereto.

A light emitting layer 913 is formed on the pixel electrode 906. Then, an opposite electrode (an anode of a light emitting element) is formed from a transparent conductive material to cover the light emitting layer 913. The transparent conductive film used may be formed from a compound of indium oxide and tin oxide or a compound of indium oxide and zinc oxide, or from zinc oxide alone, tin oxide alone, or indium oxide alone. The transparent conductive film may be doped with gallium.

The pixel electrode 906, the light emitting layer 913, and an opposite electrode 1914 constitute a light emitting element 915.

A bank 912 has an effect of preventing external light reflected by the wirings 901 to 907 from reaching eyes of a viewer.

This embodiment can be combined with any one of Embodiments 1 through 6.

[Embodiment 8]

This embodiment describes the structure of a pixel in a light emitting device that is one of semiconductor devices of the present invention. A sectional view of a pixel in a light emitting device of this embodiment is shown in FIG. 38.

In FIG. 38, 911 denotes a substrate and 912 denotes an insulating film that serves as a base (hereinafter referred to as base film). The substrate 911 is a light-transmissive substrate, typically, a glass substrate, a quartz substrate, a glass ceramic substrate, or a crystallized glass substrate. However, one that can withstand the highest processing temperature of the manufacturing process has to be chosen.

Denoted by 8201 is a switching TFT that is an n-channel TFT and 8202 is a current controlling TFT that is a p-channel TFT. When light is emitted from an organic light emitting layer toward the bottom face of a substrate (the side where TFTs and the organic light emitting layer are not formed), the above structure is preferred. However, the switching TFT and the current controlling TFT each can assume both conductivity types and therefore 8201 may be a p-channel TFT and 8202 may be an n-channel TFT.

The switching TFT 8201 has an active layer, a gate insulating film 918, gate electrodes 919a and 919b, a first interlayer insulating film 920, a source signal line 921, and a drain wiring 922. The active layer includes a source region 913, a drain region 914, LDD regions 915a to 915d, a divider region 916 and channel formation regions 963 and 964. The gate insulating film 918 or the first interlayer insulating film 920 may be common to all TFTs on the substrate, or different circuits or elements may have different gate insulating films or different first interlayer insulating films.

In the switching TFT 8201 shown in FIG. 38, the gate electrodes 919a and 919b are electrically connected to each other to form a double-gate structure. The switching TFT 8201 may take other multi-gate structure (a structure including an active layer that has two or more channel formation regions connected in series) than the double-gate structure, such as a triple-gate structure.

A multi-gate structure is very effective in reducing OFF current. If OFF current of the switching TFT is lowered enough, the minimum capacitance required for capacitor storage that is connected to a gate electrode of the current controlling TFT 8202 can be reduced that much. In other words, it reduces the area of the capacitor storage. It is therefore effective to employ a multi-gate structure in increasing the effective light emission area of a light emitting element.

The length (width) of each of the LDD regions 915a to 915d is set to 0.5 to 3.5 μm, typically, 2.0 to 2.5 μlm. In a multi-gate structure having two or more gate electrodes, the divider region 916 (a region doped with the same impurity element in the same concentration as the source region or the drain region) provided between the channel formation regions is effective in lowering OFF current.

The current controlling TFT 8202 has an active layer, the gate insulating film 918, a gate electrode 930, the first interlayer insulating film 920, a source line 931, and a drain wiring 932. The active layer includes a source region 926, a drain region 927, and a channel formation region 965. The current controlling TFT 8202 in this embodiment is a p-channel TFT.

The drain region 914 of the switching TFT 8201 is connected to the gate electrode 930 of the current controlling TFT 8202. Specifically, though not shown in the drawing, the gate electrode 930 of the current controlling TFT 8202 is electrically connected through the drain wiring (also called a connection wiring) 922 to the drain region 914 of the switching TFT 8201. The gate electrode 930 has a single gate structure but may have a multi-gate structure. The source signal line 931 of the current controlling TFT 8202 is connected to a current supply line (not shown in the drawing).

The description given above is about the structures of the TFTs provided in the pixel. At the same time the TFTs are formed, a driving circuit is also formed. Shown in FIG. 38 is a CMOS circuit that is the basic unit constituting the driving circuit.

In FIG. 38, a TFT structured to reduce hot carrier injection while avoiding slowing the operation speed as much as possible is used as an n-channel TFT 8204 of the CMOS circuit. The driving circuit here refers to a source signal side driving circuit or a gate signal side driving circuit. Other logic circuits (such as a level shifter, an A/D converter, and a signal divider circuit) may also be formed.

An active layer of the n-channel TFT 8204 of the CMOS circuit includes a source region 935, a drain region 936, an LDD region 937, and a channel formation region 962. The LDD region 937 overlaps a gate electrode 939 with the gate insulating film 918 sandwiched therebetween.

The LDD region 937 is formed only on the drain region 936 side because it prevents slowing of the operation speed. In the n-channel TFT 8204, the OFF current value is not so important and rather the operation speed should be given priority. Accordingly, it is desirable if the LDD region 937 overlaps the gate electrode completely to reduce the resistance component as much as possible. In other words, eliminating offset is preferred.

In a p-channel TFT 8205 of the CMOS circuit, degradation by hot carrier injection is almost ignorable and therefore has no particular need for an LDD region. Accordingly, its active layer includes a source region 940, a drain region 941, and a channel formation region 961. The gate insulating film 918 and a gate electrode 943 are further provided in the p-channel TFT 8205. It is also possible for the p-channel TFT 8205 to have an LDD region as a countermeasure for hot carrier as in the n-channel TFT 8204.

Denoted by 942, 938, 917a, 917b, and 929 are masks for forming the channel formation regions 961 to 965.

The n-channel TFT 8204 and the p-channel TFT 8205 have a source line 944 and a source signal line 945, respectively. The drain regions of the n-channel TFT 8204 and p-channel TFT 8205 are electrically connected to each other by a drain wiring 946.

A laser irradiation method of the present invention can be used in formation of the semiconductor film, crystallization of the active layers, activation, and other steps where laser annealing is used.

FIG. 40 shows production flow for manufacturing the light emitting device of this embodiment. First, a semiconductor device is designed using CAD. Specifically, a mask for an island is designed first and then a mask for a sub-island that includes one or more of such islands is designed.

Then, information concerning the shape of the designed mask for a sub-island (pattern information) is inputted to a computer of laser irradiation apparatus. From the sub-island pattern information inputted, the computer calculates a width Ws of each sub-island in the direction perpendicular to the scanning direction. Based on the width Ws of each sub-island, a slit width $W_{BW}$ in the direction perpendicular to the scanning direction is set. The laser light scanning path is determined from the slit width $W_{BW}$ with the position of a marker as the reference.

During this, a gate electrode is formed in accordance with the marker formed on a substrate. Alternatively, the gate electrode and the marker may be formed at the same time. Then a gate insulating film is formed so as to cover the gate electrode and a semiconductor film is formed so as to come into contact with the gate insulating film. The semiconductor film is patterned using the mask for a sub-island to form a sub-island. The substrate on which the sub-island is formed is set on a stage of the laser irradiation apparatus.

With the marker as the reference, laser light is irradiated along the set scanning path targeting the sub-island to crystallize the sub-island.

Thereafter, the sub-island having its crystallinity enhanced by the laser light irradiation is patterned to form an island. Subsequently, a process of manufacturing a TFT from the island follows. Although specifics of the TFT manufacturing process are varied depending on the TFT form, a typical process starts with forming an impurity region in the island. Then an interlayer insulating film is formed so as to cover the island. A contact hole is formed in the interlayer insulating film to partially expose the impurity region. A wiring is then formed on the interlayer insulating film to reach the impurity region through the contact hole.

The structure of this embodiment can be combined freely with Embodiments 1 through 7.

[Embodiment 9]

This embodiment describes the structure of a pixel in a light emitting device that is manufactured using a laser irradiation method of the present invention. A sectional view of a pixel in a light emitting device of this embodiment is shown in FIG. 41.

Denoted by 1751 is an n-channel TFT and 1752, a p-channel TFT. The n-channel TFT 1751 has a semiconductor film 1752, a first insulating film 1770, first electrodes 1754 and 1755, a second insulating film 1771, and second electrodes 1756 and 1757. The semiconductor film 1752 has a first concentration one conductivity type impurity region 1758, a second concentration one conductivity type impurity region 1759, and channel formation regions 1760 and 1761.

The first electrodes 1754 and 1755 overlap the channel formation regions 1760 and 1761, respectively, with the first insulating film 1770 sandwiched between the first electrodes and the channel formation regions. The second electrodes 1756 and 1757 overlap the channel formation regions 1760 and 1761, respectively, with the second insulating film 1771 sandwiched between the second electrodes and the channel formation regions.

The p-channel TFT 1752 has a semiconductor film 1780, the first insulating film 1770, a first electrode 1781, the second insulating film 1771, and a second electrode 1782. The semiconductor film 1780 has a third concentration one conductivity type impurity region 1783 and a channel formation region 1784.

The first electrode 1781 overlaps the channel formation region 1784 with the first insulating film 1770 sandwiched therebetween. The second electrode 1782 overlaps the channel formation region 1784 with the second insulating film 1771 sandwiched therebetween.

The first electrode 1781 and the second electrode 1782 are electrically connected to each other through a wiring 1790.

A laser irradiation method of the present invention can be used in the semiconductor films 1752 and 1780 for crystallization, activation, and other steps where laser annealing is used.

In this embodiment, a constant voltage is applied to the first electrode of the TFT used as a switching element (here, the n-channel TFT 1751). By applying a constant voltage to the first electrode, fluctuation in threshold can be reduced and OFF current can be lowered compared to the case where the TFT has only one electrode.

In the TFT (the p-channel TFT 1752 in this embodiment) where a larger current flows compared to the TFT used as a switching element, the first electrode and the second electrode are electrically connected to each other. By applying the same voltage to the first electrode and the second electrode, the depletion layer spreads quickly as though the semiconductor film is actually reduced in thickness. Therefore the sub-threshold coefficient can be reduced and ON current can be increased. Accordingly, when used in a driving circuit, the TFT structured as this can lower the drive voltage. An increase in ON current leads to reduction in size (channel width, in particular) of the TFT. As a result, the integration density can be improved.

FIG. 42 shows production flow for manufacturing the light emitting device of this embodiment. First, a semiconductor device is designed using CAD. Specifically, a mask for an island is designed first and then a mask for a sub-island that includes one or more of such islands is designed. Then the designed pattern information of a sub-island is inputted to a computer of laser irradiation apparatus.

From the sub-island pattern information inputted, the computer calculates a width Ws of each sub-island in the direction perpendicular to the scanning direction. Based on the width Ws of each sub-island, a slit width $W_{BW}$ in the direction perpendicular to the scanning direction is set. The laser light scanning path is determined from the slit width $W_{BW}$ with the position of a marker as the reference.

During this, a first gate electrode is formed in accordance with the marker formed on a substrate. Alternatively, the first gate electrode and the marker may be formed at the same time. Then a first insulating film is formed so as to cover the first gate electrode and a semiconductor film is formed so as to come into contact with the first insulating film. The semiconductor film is patterned using the mask for a sub-island to form a sub-island. The substrate on which the sub-island is formed is set on a stage of the laser irradiation apparatus.

With the marker as the reference, laser light runs along the set scanning path targeting the sub-island to crystallize the sub-island.

Thereafter, the sub-island having its crystallinity enhanced by the laser light irradiation is patterned to form an island. Subsequently, a process of manufacturing a TFT from the island follows. Although specifics of the TFT manufacturing process are varied depending on the TFT form, a typical process starts with forming an impurity region in the island. Then laser irradiation follows and a second insulating film and a second electrode are sequentially formed so as to cover the island. An impurity region is formed in the island. An interlayer insulating film is then formed so as to cover the second insulating film and the second electrode. A contact hole is formed in the interlayer insulating film to partially expose the impurity region. A wiring is then formed on the interlayer insulating film to reach the impurity region through the contact hole.

This embodiment can be combined with any one of Embodiments 1 through 8.

[Embodiment 10]

This embodiment describes an example in which a driving circuit (a signal line driving circuit or a scanning line driving circuit) is formed by using a laser irradiation method of the present invention and is mounted to a pixel portion formed from an amorphous semiconductor film using TAB, COG, or the like.

FIG. 31A shows an example of mounting a driving circuit to a TAB tape so that a pixel portion is connected by the TAB tape to a printed substrate on which an external controller and others are formed. A pixel portion 5001 is formed on a glass substrate 5000, and is connected through a TAB tape 5005 to a driving circuit 5002 that is manufactured by a laser irradiation method of the present invention. The driving circuit 5002 is connected through the TAB tape 5005 to a printed substrate 5003. The printed substrate 5003 has a terminal 5004 for connecting the substrate to an external interface.

FIG. 31B shows an example of mounting a driving circuit and a pixel portion by COG. A pixel portion 5101 is formed on a glass substrate 5100, and a driving circuit 5102 manufactured by a laser irradiation method of the present invention is mounted to the glass substrate. The substrate 5100 has a terminal 5104 for connecting the substrate to an external interface.

As described, a TFT manufactured by a laser irradiation method of the present invention is improved in crystallinity of its channel formation region and therefore can operate at high speed. The TFT is therefore suitable for constituting a driving circuit which is required to operate at higher speed than a pixel portion. If the pixel portion and the driving circuit are manufactured separately, the yield is increased.

This embodiment can be combined with any one of Embodiments 1 through 9.

[Embodiment 11]

In this embodiment, a manufacturing method of a light emitting apparatus using the laser irradiation method of the invention will be described.

According to the manufacturing method in the embodiment 5, it is formed up to the second interlayer insulating film 751 (FIG. 39). In this embodiment, the switching TFT 833 is of the double gate structure in which two channel forming regions are formed but may be of a single gate structure in which one channel forming region is formed or may be of a structure in which three and above areas are formed. Also, in the embodiment, the current control TFT 834 is of the single gate structure in which one channel forming region is formed but may be of a structure in which two and above channel forming regions are formed.

The n channel type TFT 831 and the p channel type TFT 832 which the drive circuit formed on the substrate 700 has are formed by use of the manufacturing method in the embodiment 5. In addition, in the embodiment, it is of the single gate structure but may be of the double gate structure or triple gate structure.

When finished up until the process for manufacturing the second interlayer insulating film 751 in the embodiment 5, in this embodiment, so as to cover the second interlayer insulating film 751, a resin film in which black dye, carbon or black pigment etc. was dispersed is formed. In addition, as the resin, typically, polyimide, polyamide, acrylic, BCB (benzo-cyclo-butene) etc. are cited but it is not limited to the above-described materials. Also, besides the organic resin, as a material of the shield film, it is possible to use, for example, a material in which black dye, carbon or black pigment is combined with silicon, silicon oxide, silicon oxide nitride etc.

Then, by etching the resin film, the second interlayer insulating film 751, the first interlayer insulating film 753 and the gate insulating film 752, a contact hole is formed. Then, by forming an conductive film on the resin film and etching the conductive film, wirings 801 to 807 for electrically connecting to impurity regions of respective TFTs, respectively and an antireflection film 808 are formed. In addition, these wirings and the antireflection film are formed by patterning a film stack of a Ti film of 50 nm thickness and an alloyed film (alloyed film of Al and Ti) of 500 nm thickness. Of course, it is not limited to a double structure but may be of a single layer structure and may be of a three and above layer structure. Also, a material of the wiring is not limited to Al and Ti. For example, the wiring and the antireflection film may be formed by forming Al and Cu on a TaN film and further, by patterning a film stack in which a Ti film was formed.

The antireflection film 808 has an effect for preventing light which was entered from outside of the light emitting apparatus from being seen like an mirror by an observer when it is reflected by a cathode of a light emitting element.

Then, by using the wirings 801 to 807 and the antireflection film 808 as masks, the resin film is etched and a shielding film 870 is formed. The shielding film 870 has an effect for preventing light which was entered from outside of the light emitting apparatus from being seen like an mirror by an observer when it is reflected by a cathode of a light emitting element.

Then, by covering the second interlayer insulating film 751, the wirings 801 to 807, the antireflection film 808 and the shielding film 870, a third interlayer insulating film 850 is formed. The third interlayer insulating film 850 may be an organic resin film and may be a inorganic insulating film.

Then, after the third interlayer insulating film 850 was formed, a part of the third interlayer insulating film 850 is etched to form the contact hole, and the conductive film is formed. Then, by patterning the conductive film, wirings 860 and 861 which were connected to the wirings 806 and 807 respectively are formed on the third interlayer insulating film 850.

In addition, the wiring 860 is used as a power line for supplying electric currents to the light emitting element, and the wiring 804 is used as a source signal line. Then, in the embodiment, by disposing the wirings 860 and 804 so as to sandwich the third interlayer insulating film 850 between them and to be overlapped, an open area ration can be heightened.

Then, so as to cover the wirings 860 and 861, a fourth interlayer insulating film 861 is formed on the third interlayer insulating film 850. It is desirable that an organic resin film is used as the fourth interlayer insulating film 861 so as to flatten pixel electrodes which will be formed later. Then, after the fourth interlayer insulating film 861 was formed, so as to contact to the fourth interlayer insulating film 861, a fifth interlayer insulating film 862 was formed. The fifth interlayer insulating film 862 is advantageous for preventing moisture included in the fourth interlayer insulating film 861 from entering in an organic light emitting layer through the pixel electrode which will be formed later. Since the organic resin includes much moisture, it is particularly useful to provide the fifth interlayer insulating film 862 which is made of an inorganic insulating film. In the embodiment, a silicon nitride film was used as the fifth interlayer insulating film 862.

Then, by etching the fifth interlayer insulating film 862 and the fourth interlayer insulating film 861, the contact hole is formed, and a pixel electrode 811 to be connected to the wiring 861 is formed on the fifth interlayer insulating film 862.

In addition, the pixel electrode 811 is a pixel electrode (anode of the light emitting element) which is made of a transparent conductive film. As the transparent conductive film, it is possible to use compound of indium oxide and tin oxide, compound of indium oxide and zinc oxide, zinc oxide, tin oxide or indium oxide. In the embodiment, it is very important to flatten a step due to TFT by use of the fifth interlayer insulating film 862 which is made of resin. Since a light emitting layer which will be formed later is very thin, there is a case that light-emission fault occur because of existence of the step. Accordingly, it is desirable that the step is flattened before the pixel electrode is formed so that the light emitting layer can be formed on a flat surface to the extent possible.

Then, after the pixel electrode 811 was formed, a bank 812 which is made of an inorganic insulating film is formed. The bank 812 is formed by patterning the inorganic insulating film of 1 to 2 μm thickness so as to expose a part of the pixel electrode 811.

On the pixel electrode 811, the light emitting layer 813 is formed. In addition, although only one pixel is shown in FIG. 39, in the embodiment, light emitting layers corresponding to each color of R(Red), G(Green), and B(Blue) are made. Also, in the embodiment, a low molecular series organic light emission material is formed by a deposition method. To be more precise, it is such a laminated structure that, as a hole injection layer, a copper phthalocyanine (CuPc) film was disposed, and thereon, as the light emitting layer, a tris-8-quinolilate aluminum complex ($Alq_3$) film of 70 nm thickness was disposed. By adding light emission coloring matter such as quinacridone, beryllene or DCMI to $Alq_3$, it is possible to control a light emission color.

However, the above-described example is one example of the organic light emission material which can be used as the light emitting layer and there is no necessity to limit this. The light emitting layer (layer for carrying out light emission and movement of carriers for that purpose) may be formed by freely combining the light emitting layer, a charge transfer layer or a charge injection layer. For example, in the embodiment, described was the example in which the low molecular series organic light emission material is used as the light emitting layer but a middle molecular series organic light emission material and a giant molecular series organic light emission material may be used. Also, as an example using the giant molecular series organic light emission material, it may be such a laminated structure that polythiophene (PEDOT) film of 20 nm thickness was disposed as the hole injection layer by a spin application method, and thereon, as the light emitting layer, para-phenylene-vinylene (PPV) film of approximately 100 nm was disposed. In addition, when π conjugation series giant molecule of PPV is used, it is possible to select light emission frequency from a red color to a blue color. Also, it is possible to use an inorganic material such as silicon carbide as the charge transfer layer and the charge injection layer. It is possible to use well-known materials as these organic light emission material and the inorganic material.

Then, on the light emitting layer 813, a cathode 814 which is made of a conductive film is disposed. In case of this embodiment, as the conductive film, compound film of aluminum and lithium is used. Of course, well-known MgAg film (compound film of magnesium and silver) may be used. As a cathode material, a conductive film which is made of an element which belongs to an 1 family or a 2 family of a periodic table or a conductive film to which these elements are added may be used.

At the point up until this cathode 814 was formed, the light emitting element 815 is completed. In addition, the light emitting element 815 herein means a diode which was formed by the pixel electrode (anode) 811, the light emitting layer 813 and the cathode 814.

A protective film 854 may be disposed so as to completely cover the light emitting element 815. As the protective film 854, it is made of an insulating film which includes a carbon film, a silicon nitride film or a silicon nitride oxide film, and the insulating film is used as an single layer or a combined laminated layer.

On this occasion, it is desirable to use a film of good coverage as the protective film 854, and it is useful to use the carbon film, particularly, a DLC (diamond like carbon) film. Since it is possible to form the DLC film within a scope of temperature from room temperature to 100° C. and less, it is possible to easily form it above the light emitting layer 813 which has low heat resistance. Also, the DLC film has high blocking effect to oxygen, and it is possible to suppress oxidation of the light emitting layer 813. Therefor, it is possible to prevent such a problem that the light emitting layer 813 is oxidized during a period for carrying out a succeeding sealing process.

In this embodiment, since the light emitting layer 813 is covered by the inorganic insulating film such as a carbon film, silicon nitride, silicon nitride oxide, aluminum nitride or aluminum nitride oxide etc. which are all high in a barrier characteristic, it is possible to effectively prevent the light emitting layer from being deteriorated when moisture and oxygen etc. are entered into the light emitting layer.

In particular, by using a silicon nitride film which is manufactured by a spattering method which uses silicon as a target for the bank 812, the fifth interlayer insulating film 862 and the protective film 854, it is possible to more prevent intrusion of impurities to the light emitting layer. Although film forming conditions may be selected at pleasure, in particular preferably, as a spattering gas, nitrogen ($N_2$) or a mixed gas of nitrogen and argon is used and the spattering is carried out by applying high-frequency electric power. Temperature of the substrate is in a status of room temperature and heating means may be omitted. After the organic insulating film and organic compound layer have been already formed, it is desirable to form a film without heating the substrate. However, for sufficiently removing moisture which is absorbed or occluded, it is desirable to heat for several minutes to several hours in vacuum at approximately 50 to 100° C. and carry out dehydration processing.

As for the silicon nitride film which was formed by the spattering method which used only nitrogen gas by using silicon as a target in room temperature and applying the high-frequency electric power of 13.56 MHz, absorption peaks of N—H bond and Si—H bond are not observed in its infrared absorption spectrum, and also, it is characteristic that even absorption peak of Si—O is not observed, and it is known that oxygen density and hydrogen density in the film is 1 atomic % and less. Also from this point, it turns out that intrusion of impurities such as oxygen and moisture etc. can be effectively prevented.

Further, a sealing member 817 is disposed to cover the light emitting element 815, and a covering member 818 is bonded thereto. As the sealing member 817, a ultraviolet curing resin may be used, and it is useful to dispose a material which has a moisture absorption effect or a material which has an anti-oxidation effect inside it. Also, in this embodiment, as the covering member 818, a member made by forming a carbon film (preferably, diamond like carbon film) on both sides of a glass substrate or a silica substrate or a plastic substrate (including a plastic film) is used.

As such, the light emitting apparatus of the structure shown in FIG. 39 is completed. In addition, it is useful to carry out the processes after the bank 812 was formed up until the protective film 854 was formed successively without opening to air. Also, by further developing it, it is possible to carry out the processes up until the covering member 818 is bonded successively without opening to air.

In addition, it is possible to implement this embodiment in combination with any one of the embodiment 1 to the embodiment 10.

[Embodiment 12]

In this embodiment, a structure of a light emitting apparatus which was formed by use of this invention will be described.

FIG. 43 shows a cross sectional view of the light emitting apparatus of the embodiment. FIG. 43 shows a cross sectional view of light emitting elements 450r, 450g, and 450b which correspond to R (Red), G (Green), and B (Blue), respectively, and have pixel electrodes 451r, 451g, and 451b, organic light emitting layer 452r, 452g, and 452b, a cathode 453 and a protective film 457, respectively. It is desirable that the organic light emitting layer is formed in the order of R, G, and B.

Then, in this embodiment, a color filter is disposed on a covering member 454. On a portion which corresponds to the R light emitting element 450r, a red color filter 455r is disposed, and on a portion which corresponds to the G light emitting element 450g, a green color filter 455g is disposed, and on a portion which corresponds to the B light emitting element 450b, a blue color filter 455b is disposed.

Also, between respective color filters, a light blocking effect film (black matrix) 456 is disposed so that lights of neighboring light emitting elements are not mixed.

By the above-described structure, it is possible to heighten color purity of the light emitting apparatus.

The structure of this embodiment can be implemented in combination with the embodiments 1 to 11.

[Embodiment 13]

In this embodiment, variation of shapes of the sub-island and the beam spot will be described.

FIG. 15A shows one example of a shape of a sub-island of this embodiment. Reference numeral 460 designates the sub-island, and the sub-island 460 contacts to four contact points 461 to 464 with time difference, in the process that a beam spot 465 moved in a direction of an arrow. In addition, the number of the contact point is not limited to this.

FIG. 15B shows one example of a shape of a sub-island of this embodiment. 470 designates the sub-island, and the sub-island 470 contacts to four contact points 471 to 474 with time difference, in the process that four beam spots 475 to 478 moved in a direction of an arrow. Tracks formed by scanning of the beam spots 475 to 478 are partially overlapped one another, and further, it is arranged that its overlapped portion and a channel forming region of the island are not overlapped.

In addition, the number of the contact point is not limited to this. Also, the number of the beam spot and the contact point may not be corresponded one by one, and two and more contact points may exist for one beam spot.

The structure of this embodiment can be implemented in combination with the embodiments 1 to 12.

[Embodiment 14]

In this embodiment, a structure of a slit shaped TFT will be described.

Figure 14A:
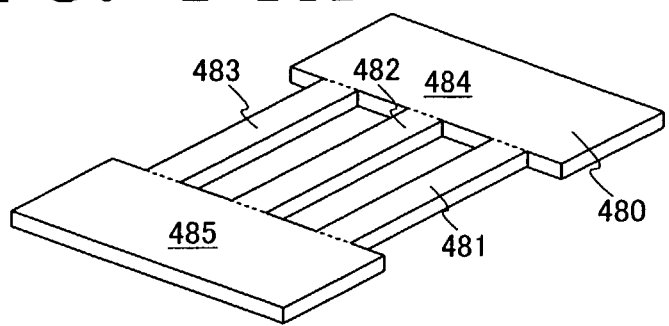

FIG. 14A shows a shape of a slit shaped island 480 which was formed by use of this invention. The island 480 has a plurality of portions 481 to 483 which becomes channel forming regions separated from one another and impurity regions 484 and 485 which become a source region and a drain region. In addition, a LDD region and an offset region may be disposed.

Figure 14B:
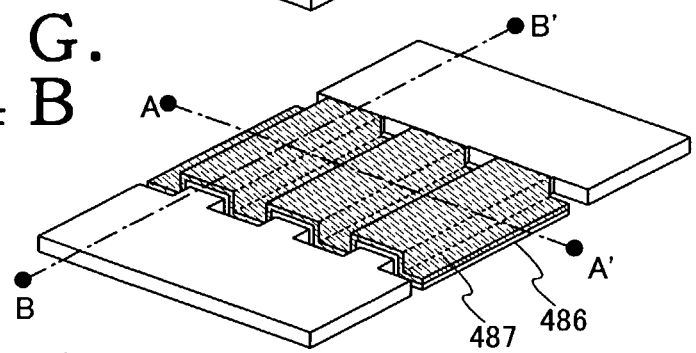
Figure 14C:
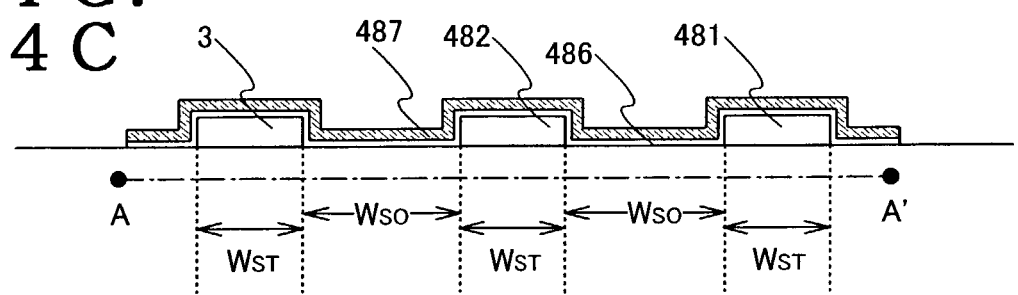
Figure 14D:
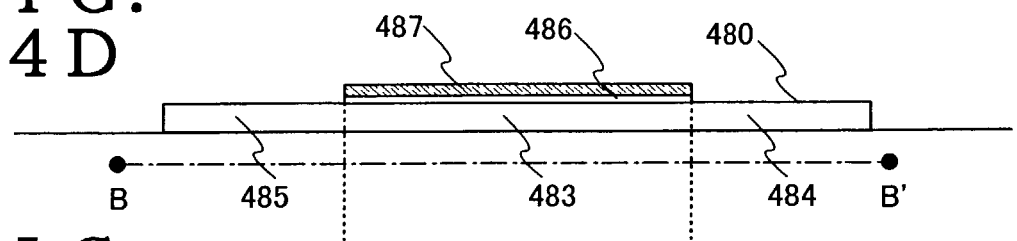

FIG. 14B shows a shape of TFT in which the island 480 shown in FIG. 14A was used as an active layer. Also, FIG. 14C shows a cross sectional view in a broken line A–A' of TFT shown in FIG. 14B, and FIG. 14D shows a cross sectional view in a broken line B–B' thereof. It has a gate insulating film 486 which contacts to the channel forming regions 481 to 483 of the island 480 and a gate electrode 487 which contacts to the gate insulating film 486. In addition, FIG. 14B has such a structure that the gate insulating film 486 is etched and the impurity regions 484 and 485 are exposed, but this invention is not limited to this, and the gate insulating film 486 may cover the impurity regions 484 and 485.

Channel width $W_{ST}$ and distance $W_{SO}$ between respective channel forming regions are determined by distance between the contact points of the sub-island and it is possible for an engineer to set them at pleasure.

Figure 14E:
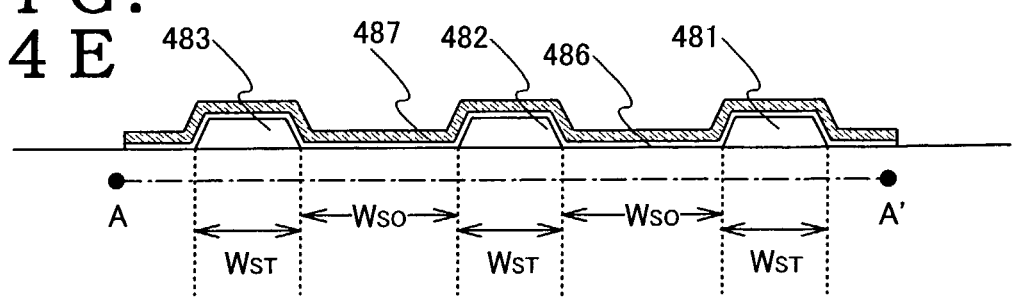

In addition, FIG. 14E shows a structure of the TFT shown in FIG. 14B, which is different from FIG. 14C as the cross sectional view in the broken line A—A. In FIG. 14E, the channel forming region is formed in a tapered shape, and as compared to the case of FIG. 14C, it is possible to prevent a step cut which occurs on the occasion of forming the gate insulating film 486 and the gate electrode 487.

This embodiment can be implemented freely in combination with the embodiments 1 to 13.

[Embodiment 15]

In this embodiment, a shape of a sub-island of the invention will be described.

FIG. 25A shows a shape of the sub-island of this embodiment. The sub-island 251 contacts to a beam spot 255 at one contact point. Then, by engrailing a periphery of the sub-island 251, it is possible to elongate length of an edge of the sub-island which exists between a long axis direction and a scanning direction of a beam spot. However, when the edge of the sub-island and the beam spot are overlapped, it is important to determine the scanning direction of the beam spot so that an area of the sub-island overlapping with the beam spot increases, based on movement of the beam spot.

In this embodiment, in a perpendicular direction to the scanning direction of the sub-island 251, width W of a narrowest portion was set to be approximately 5 to 10 μm, and in the perpendicular direction to the scanning direction, distance t from a contact point 256 to the narrowest portion in the scanning direction was set to be 24 μm, but these values can be set by an engineer at pleasure.

By the above-described structure, by a crystal grown from the contact point and a crystal grown from the edge portion, it is possible to heighten crystallinity of a center portion of the sub-island which is located on an extension of the scanning direction from the contact point.

FIG. 25B shows a sub-island 252 having such a shape that a plurality of the sub-islands shown in FIG. 25A are interconnected. 253 shows a shape of the island, and by using the sub-island shown in FIG. 25B, it is possible to form a TFT having a slit shaped active layer.

This embodiment can be implemented freely in combination with the embodiments 1 to 14.

[Embodiment 16]

The structure of a pixel in a light emitting device of the present invention will be described with reference to FIG. 46.

In FIG. 46, a base film 6001 is formed on a substrate 6000 and a transistor 6002 is formed on the base film 6001. The transistor 6002 has an active layer 6003, a gate electrode 6005, and a gate insulating film 6004, which is sandwiched between the active layer 6003 and the gate electrode 6005.

The active layer 6003 is preferably a polycrystalline semiconductor film, and the polycrystalline semiconductor film can be formed by crystallizing an amorphous silicon film by well-known techniques. Thermal crystallization method, laser annealing crystallization method by using laser light, lamp annealing crystallization method by using infrared light can be examples of the well-known techniques. A continuous oscillation argon laser or a continuous oscillation excimer laser may be used for the crystallization, for example. Alternatively, in accordance with the technique disclosed in JP 07-130652, using a crystallization method in which catalytic element is used to form a polycrystalline semiconductor film may also be adapted.

Further, using sputter method, plasma CVD method, thermal CVD method and the like to form a polycrystalline semiconductor film may be used.

The active layer may be formed of silicon germanium other than silicon. When silicon germanium is employed, the germanium concentration is preferably about 0.01 to 4.5 atomic %. Silicon doped with carbon nitride may also be used.

The gate insulating film 6004 can be formed from silicon oxide, silicon nitride, or silicon oxynitride. A silicon oxide film, a silicon nitride film, and a silicon oxynitride film may be layered to form the gate insulating film. For example, a SiN film laid on a $SiO_2$ film can be used. A silicon oxide film is formed by plasma CVD in which TEOS (tetraethyl orthosilicate) and $O_2$ are mixed, the reaction pressure is set to 40 Pa, the substrate temperature is set to 300 to 400° C., and the high frequency (13.56 MHz) power density is set to 0.5 to 0.8 $W/cm^2$ for electric discharge. The thus formed silicon oxide film can provide excellent characteristics as a gate insulating film if it subsequently receives thermal annealing at 400 to 500° C. The gate insulating film may also be formed of aluminum nitride. Aluminum nitride has relatively high heat conductivity and is capable of diffusing heat generated in the TFT effectively. A laminate obtained by laying an aluminum nitride film on a silicon oxide film, a silicon oxynitride film, or the like which does not contain aluminum may also be used as the gate insulating film. It is also possible to employ a $SiO_2$ film formed by RF sputtering with Si as the target for the gate insulating film.

The gate electrode 6005 is formed of an element selected from the group consisting of Ta, W, Ti, Mo, Al, and Cu, or an alloy or compound mainly containing the above elements. Alternatively, the gate electrode may be a semiconductor film, typically polycrystalline silicon film, doped with phosphorus or other impurity elements. Instead of a single-layer conductive film, a laminate of plural conductive films may be used as the gate electrode.

The following are examples of a preferred combination of conductive films: a combination of a tantalum nitride (TaN) film as the first conductive film and a W film as the second conductive film, a combination of a tantalum nitride (TaN) film as the first conductive film and a Ti film as the second conductive film, a combination of a tantalum nitride (TaN) film as the first conductive film and an Al film as the second conductive film, and a combination of a tantalum nitride (TaN) film as the first conductive film and a Cu film as the second conductive film. Alternatively, the first conductive film and the second conductive film may be semiconductor films, typically polycrystalline silicon films, doped with phosphorus or other impurities, or may be Ag—Pd—Cu alloy films.

The gate electrode is not limited to the two-layer structure. For example, a three-layer structure consisting of a tungsten film, aluminum-silicon alloy (Al—Si) film, and titanium nitride film layered in this order may be employed. When the three-layer structure is employed, the tungsten film may be replaced by a tungsten nitride film, the aluminum-silicon alloy (Al—Si) film may be replaced by an aluminum-titanium alloy (Al—Ti) film, and the titanium nitride film may be replaced by a titanium film.

It is important to select the optimum etching method and etchant for the conductive film material employed.

The transistor 6004 is covered with a first interlayer insulating film 6006. A second interlayer insulating film 6007 and a third interlayer insulating film 6008 are layered on the first interlayer insulating film 6006.

The first interlayer insulating film 6006 is a single layer or laminate of a silicon oxide film, silicon nitride film, and silicon oxynitride film formed by plasma CVD or sputtering. A laminate obtained by laying a silicon oxynitride film in which oxygen is higher in mole fraction than nitrogen on top of a silicon oxynitride film in which nitrogen is higher in mole fraction than oxygen may also be used as the first interlayer insulating film 6006.

If thermal processing (heat treatment at 300 to 550° C. for 1 to 12 hours) is conducted after the first interlayer insulating film 6006 is formed, dangling bonds of semiconductors in the active layer 6003 can be terminated (hydrogenated) by hydrogen contained in the first interlayer insulating film 6006.

The second interlayer insulating film 6007 can be formed of non-photosensitive acrylic.

Used as the third interlayer insulating film 6008 should be a film that does not easily transmit moisture, oxygen, and other substances that accelerate degradation of a light emitting element compared to the other insulating films. Typically, a DLC film, a carbon nitride film, a silicon nitride film formed by RF sputtering, or the like is desirably used as the third interlayer insulating film.

In FIG. 46, denoted by 6010 is an anode, 6011, an electric field light emitting layer, and 6012, a cathode. An area where the anode 6010, the electric field light emitting layer 6011, and the cathode 6012 overlap corresponds to a light emitting element 6013. The transistor 6002 is a driving transistor for controlling a current supplied to the light emitting element 6013, and is connected to the light emitting element 6013 directly or in series through another circuit element.

The electric field light emitting layer 6011 may be a light emitting layer alone or a laminate of plural layers including a light emitting layer.

The anode 6010 is formed on the third interlayer insulating film 6008. Also formed on the third interlayer insulating film 6008 is an organic resin film 6014, which is used as a partition wall. The organic resin film 6014 has an opening portion 6015 where the anode 6010, the electric field light emitting layer 6011, and the cathode 6012 overlap to form the light emitting element 6013.

A protective film 6016 is formed on the organic resin film 6014 and the cathode 6012. Used as the protective film 6016 is, similar to the third interlayer insulating film 6008, a film that does not easily transmit moisture, oxygen, and other substances that accelerate degradation of a light emitting element compared to the other insulating films. Typically, a DLC film, a carbon nitride film, a silicon nitride film formed by RF sputtering, or the like is used as the protective film. It is also possible to use as the protective film a laminate of the above-described film that does not easily transmit moisture, oxygen, and other substances and a film that transmits moisture, oxygen, and other substances easily compared to the former film.

Before the electric field light emitting layer 6011 is formed, the organic resin film 6014 is heated in a vacuum atmosphere to remove adsorbed moisture, oxygen, and the like. Specifically, heat treatment is conducted in a vacuum atmosphere at 100 to 200° C. for about 0.5 to 1 hour. The pressure is set to desirably $3 \times 10^{-7}$ Torr or lower, if possible, $3 \times 10^{-8}$ Torr or lower is the best. When the electric field light emitting layer is formed, after the heat treatment of the organic resin film in a vacuum atmosphere, the vacuum atmosphere is maintained until the last moment before the electric field light emitting layer is formed. This enhances the reliability even more.

The end of the organic resin film 6014 in the opening portion 6015 is desirably rounded in order to prevent the end from poking a hole in the electric field light emitting layer 6011 that is formed on the organic resin film 6014 and partially overlaps the organic resin film. To be specific, the radius of curvature of the curved organic resin film in section in the opening is desirably about 0.2 to 2 μm.

The above structure gives the electric field light emitting layer and cathode formed later an excellent coverage and can avoid a situation where a hole is formed in the electric field light emitting layer 6011 and causes short circuit of the anode 6011 and the cathode 6012. A defect called shrink which refers to reduction of the light emitting region can be reduced by relieving the stress of the electric field light emitting layer 6011, and the reliability is thus enhanced.

In the example shown in FIG. 46, a positive photosensitive acrylic resin is used for the organic resin film 6014. Photosensitive organic resins are classified into a positive type and a negative type. A part of a resin that is exposed to an energy beam such as light, electron, and ion is removed if the resin is the positive type and is left if the resin is the negative type. A negative type organic resin film too can be used in the present invention. Also, the organic resin film 6014 may be formed from photosensitive polyimide.

When a negative acrylic resin is used to form the organic resin film 6014, the end of the organic resin film in the opening 6015 is shaped like the letter S in section. The radius of curvature thereof at the upper edge and lower edge of the opening is desirably 0.2 to 2 μm.

The anode 6010 may be formed from a transparent conductive film. An ITO film as well as a transparent conductive film obtained by mixing 2 to 20% of zinc oxide (ZnO) with indium oxide can be employed. In FIG. 46, ITO is used for the anode 6010. The anode 6010 may be polished by CMP or a porous polyvinyl alcohol-based substance (Bellclean washing) in order to level its surface. The surface of the anode 6010 which has received polishing by CMP may be subjected to ultraviolet irradiation or oxygen plasma treatment.

The cathode 6012 can be formed from other known material as long as it is a conductive film having a small work function. For instance, Ca, Al, CaF, MgAg, AlLi, and the like are desirable.

In the structure shown in FIG. 46, light from the light emitting element is emitted toward the substrate 6000 side. However, the light emitting element may be structured such that emitted light travels in the direction opposite to the substrate.

In FIG. 46, the transistor 6002 is connected to the anode 6010 of the light emitting element. However, the present invention is not limited thereto and the transistor 6002 may be connected to the cathode 6001 of the light emitting element. In this case, the cathode is formed on the third interlayer insulating film 6008 from TiN or the like.

In practice, it is preferable to package (seal) the device that has reached the stage of FIG. 46 with a protective film which is highly airtight and which allows little gas to leak (a laminate film, a UV-curable resin film, or the like) or a light-transmissive cover member in order to avoid exposure to the outside air. In packaging the device, the interior of the cover member may be set to inert atmosphere or a hygroscopic material (such as barium oxide) may be put inside in order to improve the reliability of the device.

The present invention is not limited to the manufacturing method described above, and the device can be manufactured using a known method. This embodiment can be combined freely with Embodiments 1 through 15.

The present invention runs laser light so as to obtain at least the minimum degree of crystallization of a portion that has to be crystallized, instead of irradiating the entire semiconductor film with laser light. With the above structure, time for laser irradiation of portions that are removed by patterning after crystallization of the semiconductor film can be saved to greatly shorten the processing time per substrate.

Furthermore, the crystallinity of a semiconductor film can be enhanced more efficiently by overlapping plural laser beams to compensate one another's low energy density portions compared to the case where laser beams are not overlapped and a single laser beam is used.

When the island having high orientation rate of the (100) surface is used as an active layer of a TFT, mobility of the TFT can be heightened. Also when the orientation rate of the (100) surface of the active layer is high, it is possible to lessen variation of a film quality of a gate insulating film which is formed thereon, and therefore, it is possible to lessen variation of a threshold voltage of the TFT.

What is claimed is:

1. An irradiation method of a laser beam, comprising:
condensing the laser beam to a beam spot so as to form a linear laser beam to be irradiated on a substrate;
scanning the beam spot so as to irradiate the condensed laser beam on a sub-island formed over the substrate,
wherein the beam spot contacts the sub-island at a plurality of points when the beam spot has reached to the sub-island; and
wherein a crystal having an orientation of a (100) surface is initiated to grow from each of the plurality of points.

2. An irradiation method of a laser beam according to claim 1, wherein the beam spot and the sub-island are contacted at the plurality of points with time difference.

3. An irradiation method of a laser beam according to claim 1, wherein each of the plurality of points on the sub-island is at an apex of an angular portion having an angle of between 60° and 120° inclusively.

4. An irradiation method of a laser beam according to claim 1, wherein the scanning of the laser beam is carried out under a reduced-pressure atmosphere or under an inert gas atmosphere.

5. An irradiation method of a laser beam according to claim 1, wherein the laser beam is outputted by use of one kind or plural kinds selected from a YAG laser, a $YVO_4$ laser, a YLF laser, a $YAlO_3$ laser, a glass laser, a ruby laser, an alexandrite laser, a Ti: sapphire laser or a $Y_2O_3$ laser.

6. An irradiation method of a laser beam according to claim 1, wherein the laser beam is outputted by use of a slab laser.

7. An irradiation method of a laser beam according to claim 1, wherein the laser beam is of continuous oscillation.

8. An irradiation method of a laser beam according to claim 1, wherein the laser beam is of a second harmonic wave.

9. An irradiation method of a laser beam, comprising:
storing a pattern information of a sub-island formed over a substrate;
condensing the laser beam to a beam spot so as to form a linear laser beam;
determining a scanning path of the beam spot by using the stored pattern information, the beam spot overlapping the sub-island; and
irradiating the condensed laser beam on the sub-island by moving the beam spot along the scanning path;
wherein the beam spot contacts the sub-island at a plurality of point when the beam spot has reached to the sub-island; and
wherein a crystal grow having an orientation of a (100) surface is initiated from each of the plurality of points.

10. An irradiation method of a laser beam according to claim 9, wherein the beam spot and the sub-island are contacted at the plurality of points with time difference.

11. An irradiation method of a laser beam according to claim 9, wherein each of the plurality of points on the sub-island is at an apex of an angular portion having an angle of between 60° and 120° inclusively.

12. An irradiation method of a laser beam according to claim 9, wherein the scanning of the laser beam is carried out under a reduced-pressure atmosphere or under an inert gas atmosphere.

13. An irradiation method of a laser beam according to claim 9, wherein the laser beam is outputted by use of one kind or plural kinds selected from a YAG laser, a $YVO_4$ laser, a YLF laser, a $YAlO_3$ laser, a glass laser, a ruby laser, an alexandrite laser, a Ti: sapphire laser or a $Y_2O_3$ laser.

14. An irradiation method of a laser beam according to claim 9, wherein the laser beam is outputted by use of a slab laser.

15. An irradiation method of a laser beam according to claim 9, wherein the laser beam is of continuous oscillation.

16. An irradiation method of a laser beam according to claim 9, wherein the laser beam is of a second harmonic wave.

17. An irradiation method of a laser beam, comprising:
storing a pattern information of a sub-island formed over a substrate;
condensing the laser beam to a beam spot to so as to form a linear laser beam;
determining a scanning path of the beam spot and width in a direction perpendicular to a scanning direction by using the stored pattern information, the beam spot overlapping the sub-island; and
irradiating the condensed laser beam on the sub-island by moving the beam spot along the scanning path;
wherein the beam spot contacts the sub-island at a plurality of points when the beam spot has reached to the sub-island; and
wherein a crystal grow having an orientation of a (100) surface is initiated from each of the plurality of points.

18. An irradiation method of a laser beam according to claim 17, wherein the beam spot and the sub-island are contacted at the plurality of points with time difference.

19. An irradiation method of a laser beam according to claim 17, wherein each of the plurality of points on the sub-island is at an apex of an angular portion having an angle of between 60° and 120° inclusively.

20. An irradiation method of a laser beam according to claim 17, wherein the scanning of the laser beam is carried out under a reduced-pressure atmosphere or under an inert gas atmosphere.

21. An irradiation method of a laser beam according to claim 17, wherein the laser beam is outputted by use of one kind or plural kinds selected from a YAG laser, a $YVO_4$ laser, a YLF laser, a $YAlO_3$ laser, a glass laser, a ruby laser, an alexandrite laser, a Ti: sapphire laser or a $Y_2O_3$ laser.

22. An irradiation method of a laser beam according to claim 17, wherein the laser beam is outpufted by use of a slab laser.

23. An irradiation method of a laser beam according to claim 17, wherein the laser beam is of continuous oscillation.

24. An irradiation method of a laser beam according to claim 17, wherein the laser beam is of a second harmonic wave.

25. An irradiation method of a laser beam, comprising:
storing a pattern information of a sub-island formed over a substrate;
condensing the laser beam to a beam spot so as to form a linear laser beam;
determining a scanning path of the beam spot and width in a direction perpendicular to a scanning direction by using the stored pattern information, the beam spot overlapping the sub-island;
moving the beam spot along the scanning path to irradiate the laser beam on the sub-island on the basis of a marker formed by a semiconductor film to the sub-island, the marker and a semiconductor film comprising the same material,
wherein the beam spot contacts the sub-island at a plurality of points when the beam spot has reached to the sub-island; and wherein a crystal grow having an orientation of a (100) surface is initiated from each of the plurality of points.

26. An irradiation method of a laser beam according to claim 25, wherein the beam spot and the sub-island are contacted at the plurality of points with time difference.

27. An irradiation method of a laser beam according to claim 25, wherein each of the plurality of points on the sub-island is at an apex of an angular portion having an angle of between 60° and 120° inclusively.

28. An irradiation method of a laser beam according to claim 25, wherein the scanning of the laser beam is carried out under a reduced-pressure atmosphere or under an inert gas atmosphere.

29. An irradiation method of a laser beam according to claim 25, wherein the laser beam is outputted by use of one kind or plural kinds selected from a YAG laser, a $YVO_4$ laser, a YLF laser, a $YAlO_3$ laser, a glass laser, a ruby laser, an alexandrite laser, a Ti: sapphire laser or a $Y_2O_3$ laser.

30. An irradiation method of a laser beam according to claim 25, wherein the laser beam is outputted by use of a slab laser.

31. An irradiation method of a laser beam according to claim 25, wherein the laser beam is of continuous oscillation.

32. An irradiation method of a laser beam according to claim 25, wherein the laser beam is of a second harmonic wave.

* * * * *